US011637216B2

(12) United States Patent
Lo et al.

(10) Patent No.: US 11,637,216 B2
(45) Date of Patent: Apr. 25, 2023

(54) HIGHLY EFFICIENT OPTICAL TO ELECTRICAL CONVERSION DEVICES AND MELHODS

(71) Applicant: The Regents of the University of California, Oakland, CA (US)

(72) Inventors: Yu-Hwa Lo, San Diego, CA (US); Yuchun Zhou, San Diego, CA (US); Yu-Hsin Liu, La Jolla, CA (US)

(73) Assignee: The Regents of the University of California, Oakland, CA (US)

( * ) Notice: Subject to any disclaimer, the term of this patent is extended or adjusted under 35 U.S.C. 154(b) by 493 days.

(21) Appl. No.: 14/853,795

(22) Filed: Sep. 14, 2015

(65) Prior Publication Data

US 2016/0005887 A1 Jan. 7, 2016

Related U.S. Application Data

(63) Continuation-in-part of application No. PCT/US2014/024866, filed on Mar. 12, 2014.
(Continued)

(51) Int. Cl.
*H01L 31/068* (2012.01)
*H01L 31/18* (2006.01)
(Continued)

(52) U.S. Cl.
CPC ...... *H01L 31/1804* (2013.01); *H01L 31/0288* (2013.01); *H01L 31/03529* (2013.01);
(Continued)

(58) Field of Classification Search
CPC .................................. H01L 31/02363
See application file for complete search history.

(56) References Cited

U.S. PATENT DOCUMENTS

2009/0050204 A1* 2/2009 Habib ............... H01L 31/03529
136/261
2010/0221866 A1* 9/2010 Graham .......... H01L 31/035227
438/73
(Continued)

FOREIGN PATENT DOCUMENTS

JP 2011-513962 A 4/2011
JP 2012-529756 A 11/2012
(Continued)

OTHER PUBLICATIONS

Pearsall ("Zap! Introducing the Zero-Bias Avalanche Photodiode", Electronics Letters vol. 18, No. 12; Jun. 1982, pp. 512-514) (Year: 1982).*
(Continued)

*Primary Examiner* — Dustin Q Dam
(74) *Attorney, Agent, or Firm* — Perkins Coie LLP

(57) ABSTRACT

Methods, systems, and devices are disclosed for implementing high conversion efficiency solar cells. In one aspect, an optical-to-electrical energy conversion device includes a substrate formed of a doped semiconductor material and having a first region and a second region, an array of multilayered nanoscale structures protruding from the first region of the substrate, in which the nanoscale structures are formed of a first co-doped semiconductor material covered by a layer of a second co-doped semiconductor material forming a core-shell structure, the layer covering at least a portion of the doped semiconductor material of the substrate in the second region, and an electrode formed on the layer-covered portion of the substrate in the second region, in which the multilayered nanoscale structures provide an optical active region capable of absorbing photons from light at one or more wavelengths to generate an electrical signal presented at the electrode.

28 Claims, 30 Drawing Sheets

Related U.S. Application Data

(60) Provisional application No. 62/103,499, filed on Jan. 14, 2015, provisional application No. 61/893,894, filed on Oct. 22, 2013, provisional application No. 61/777,771, filed on Mar. 12, 2013.

(51) Int. Cl.
  *H01L 31/0352* (2006.01)
  *H01L 31/0288* (2006.01)

(52) U.S. Cl.
  CPC .... *H01L 31/035227* (2013.01); *H01L 31/068* (2013.01); *Y02E 10/547* (2013.01); *Y02P 70/50* (2015.11)

(56) References Cited

U.S. PATENT DOCUMENTS

| | | | |
|---|---|---|---|
| 2010/0288344 A1* | 11/2010 | Spitzer | H01L 31/055 136/255 |
| 2011/0309306 A1 | 12/2011 | Zhou et al. | |
| 2012/0192942 A1* | 8/2012 | Shim | H01L 31/03529 257/E31.127 |
| 2012/0196401 A1 | 8/2012 | Graham et al. | |
| 2012/0322164 A1 | 12/2012 | Lal et al. | |
| 2013/0174896 A1* | 7/2013 | Ardo | H01L 31/0725 136/255 |

FOREIGN PATENT DOCUMENTS

| | | |
|---|---|---|
| WO | 2008140627 A1 | 11/2008 |
| WO | 2009071916 A1 | 6/2009 |
| WO | 2012059604 A1 | 5/2012 |
| WO | 2012061266 A2 | 5/2012 |
| WO | 2013003828 A2 | 1/2013 |
| WO | 2013027975 | 2/2013 |

OTHER PUBLICATIONS

Pearsall ("Zap! Introduction the Zero-Bias Avalanche Photodiode", Electronics Letters vol. 18, No. 12; Jun. 1982, pp. 512-514 (Year: 1982).*

Williams, F., "Donor-acceptor pairs in semiconductors", Phys. Stat.Sol. 25, 1969, pp. 493-512.

Yablonovitch, E. et al., "Auger recombination in silicon at low carrier densities," Appl. Phys. Lett., vol. 49, 1986, pp. 587-589.

Yagyu, E., et al., "Recent advances in AlInsAs avalanche photodiodes", in OFC/NFOEC 2007—2007 Conference on Optical Fiber Communication and the National Fiber Optic Engineers Conference (2007).

Yang, C., Barrelet, "Single p-type/intrinsic/n-type silicon nanowires as nanoscale avalanche photodetectors", Nano Lett., vol. 6, 2006, pp. 2929-2934.

Zhang, A., et al., "Silicon nanowire detectors showing phototransistive gain", Appl. Phys. Lett. 93, 2008, p. 121110.

Zhang, A. et al., "Ultrahigh responsivity visible and infrared detection using silicon nanowire phototransistors", Nano Lett. 10, 2010, pp. 2117-2120.

Zhao, K. et al., "Self-quenching and self-recovering InGaAs/InAlAs single photon avalanche detector," Appl. Phys. Lett., vol. 93, No. 15, 2008, pp. 153504-1-3.

Zhou, et al., "Discovery of a photoresponse amplification mechanism in compensated PN junctions," Applied Physics Letters, (2015) 106, 031103-1 to 031103-5.

Zhou, Y. et al., "Bias dependence of sub-Bandgap light detection for core-shell silicon nanowires", Nano Lett. 12, 2012, pp. 5929-5935.

Ziemelis, U.O. et al., "Sharp line donor-acceptor pair luminescence in silicon," Canadian. J. Phys. 59, 1981, pp. 784-801.

Extended European Search Report for European Patent Application No. 14780028.8, dated Nov. 4, 2016; 7 pages.

Office Action for Chinese Patent Application No. 201480026995.7, dated Jul. 15, 2016.

Office Action for Chinese Patent Application No. 201480026995.7, dated Mar. 7, 2017.

International Search Report and Written Opinion of International Application No. PCT/US2014/024866, dated Jul. 28, 2014; 19 pages.

Soci, C. et al., "Nanowire photodetectors," J. Nanoscience and Nanotechnology, vol. 10, No. 3, 2010, pp. 1430-1449.

Sukhovatkin, V., "Colloidal Quantum-Dot Photodetectors Exploiting Multiexciton Generation", Science, vol. 324, 2009, p. 1542-1544.

Office Action for Chinese Patent Application No. 201480026995.7, dated Sep. 27, 2017, 6 pages.

Office Action for Japanese Patent Application No. 2016-501664, dated Feb. 1, 2018, 5 pages.

Anderson, C.L. et al., "Threshold energies for Electron-hole pair production by impact ionization in semiconductors," Physical Review B, vol. 5, No. 6, 1972, pp. 2267-2272.

Aspnes, D. E. et al., "Dielectric functions and optical parameters of Si, Ge, GaP, GaAs, GaSb, InP, InAs, and InSb from 1.5 to 6.0 eV", Phys. Rev. B 27, 1983, pp. 985-1009.

Beard, M. C. et al. "Multiple exciton generation in colloidal silicon nanocrystals", Nano Lett. 7, 2007, pp. 2506-2512.

Beard, M. C., "Multiple exciton generation in semiconductor quantum dots", J. Phys. Chem. Lett. 2, 2011, pp. 1282-1288.

Blasé, X. et al., "Superconducting group-IV semiconductors", Nature Mater., vol. 8, 2009, pp. 375-382.

Bulgarini, G. et al., "Avalanche amplification of a single exciton in a semiconductor nanowire", Nature Photon. 6, 2012, pp. 455-458.

Butov, L.V. et al., "Macroscopically ordered state in an exciton system," Nature 418, 2002, pp. 751-754.

Cunningham, P. D. et al., "Enhanced multiple exciton generation in quasi-one-dimensional semiconductors", Nano Lett., 11, 2011, pp. 3476-3481.

Delerue, C. et al., "Carrier multiplication in bulk and nanocrystalline semiconductors: mechanism, efficiency, and interest for solar cells", Phys. Rev. B 81, 2010, p. 125306.

Dziewior, J. et al., "Auger coefficients for highly doped and highly excited silicon," Appl. Phys. Lett. 31, 1977, pp. 346-348.

Enck, R. C. et al., "Radiative spectra from shallow donor-acceptor electron transfer in silicon", Phys. Rev. 177, 1969, pp. 1182-1193.

Foubert, K., et al., "Development of HgCdTe single-element APDs based detectors for low flux short wave infrared applications". Proc. SPIE 8621, 2013, p. 86210F.

Ghosh, S., et al., "Dual-carrier multiplication high-gain MWIR strained layer superlattice impact ionization engineered avalanche photodiodes", SPIE Proc. vol. 7660, 2010, 76601W1-6.

Gross, E. et al., "Free exciton motion in crystals and exciton-phonon interaction," Journal of Physics and Chemistry of Solids, vol. 27, Issue 10, 1966, pp. 1647-1651.

Grosso, G., et al., "Excitonic switches operating at around 100 K," Nature Photonics 3, 2009, pp. 577-580.

Groves, C. et al., "Temperature dependence of impact ionization in GaAs," IEEE Transactions on Electric Devices, vol. 50, No. 10, 2003, pp. 2027-2031.

Hadfield, H., "Single-photon detectors for optical quantum information applications", Nature Photon., vol. 3, 2009, pp. 696-705.

Hanke, W. et al., "Many-Particle effects in the Optical Excitations of a Semiconductor", Phys. Rev. Lett., vol. 43, 1979, pp. 387-390.

Hayden, O. et al., "Nanoscale avalanche photodiodes for highly sensitive and spatially resolved photon detection", Nature Mater. 5, 2006, pp. 352-356.

Itzler, M.A. et al., "Advances in InGaAsP-based avalanche diode single photon detectors," Journal of Modern Optics, vol. 58, Issue 3-4, 2011, pp. 174-200.

Itzler, M.A. et al., "Single-photon Detectors Based on InP Avalanche Diodes: Status and Prospects", SPIE Proc. 7681, 2010, p. 76810V.

Kang, Y. et al., "Fused InGaAs-Si avalanche photodiodes with low-noise performances," IEEE Photonics Technology Letters, vol. 14, No. 11, 2002, pp. 1593-1595.

(56) References Cited

OTHER PUBLICATIONS

Klimov, V,. et al., "Optical Gain and Stimulated Emmission in Nanocrystal Quantum Dots", Science. 290, 2000, p. 314-317.
Kohn, W. et al. "Self-consistent equations including exchange and correlation effects", Phys. Rev. vol. 140, No. 4A, 1965, pp. A1133-A1138.
Lee, D.S., et al., "Energy-Band Distortion in Highly Doped Silicon", IEEE Trans. Electron Devices, vol. 30, 1983, pp. 626-634.
Levine, B.F. et al., "A New Plana InGaAs-InAlAs Avalanche Photodiode", IEEE Photon. Technol. Lett., vol. 18, 2006, pp. 1898-1900.
Liu, Y.H. et al., "High efficiency silicon 1310nm detector without defect states or heteroepitaxy", Appl. Phys. Lett. 103, 2013, 041119.
Mandai, S. et al., "A wide spectral range single-photon avalanche diode fabricated in an advanced 180 nm CMOS technology", Opt. Exp., vol. 20, Issue 6, 2012, pp. 5849-5857.
Massey, D.J., "Temperature dependence of impact ionization in submicrometer silicon devices," IEEE Transactions on Electron Devices, vol. 53, No. 9, 2006, pp. 2328-2334.
McGuire, J. A. et al., "New aspects of carrier multiplication in semiconductor nanocrystals", Acc. Chem. Res., vol. 41, 2008, pp. 1810-1819.
McIntyre, R. J., "Multiplication noise in uniform avalanche diodes" IEEE Trans. Electron Dev., vol. ED-13, 1996, pp. 164-168.
Midgett, A. G. et al., "Flowing versus static conditions for measuring multiple exciton generation in PbSe quantum dots", J. Phys. Chem. C 114, 2010, pp. 17486-17500.
Nair, G. et al., "Perspective on the prospects of a carrier multiplication nanocrystal solar cell", Nano Lett. 11, 2011, pp. 2145-2151.
Niclass, C. et al., "Design and characterization of a CMOS 3-D image sensor based on single photon avalanche diodes," IEEE Journal of Solid-State Circuits, vol. 40, No. 9, 2005, pp. 1847-1854.
Nozik, A.J., "Quantum dot solar cells", Physica E 14, 2002, pp. 115-120.
Schaller, R. D. et al., "High-efficiency carrier multiplication through direct photogeneration of multi-excitons via virtual single-exciton states", Nature Phys 1, 2005, pp. 189-194.
Schaller, D. et al., "Tunable Near-Infrared Optical Gain and Amplified Spontaneous Emission Using PbSe Nanocrystals", J. Phys. Chem. B 107, 2003, pp. 13765-13768.
Scholl, E., "Bistability and nonequilibrium phase transitions in a semiconductor recombination," Zeitschrift for Phys. B, Condensed Matter 46, 1982, pp. 23-30.
Seo, K. et al., "Multicolored vertical silicon nanowires", Nano Lett. 11, 2011, pp. 1851-1856.
Sham. L.J. et al. "Many-Particle Derivation of the Effective Mass Equation for the Wannier Exciton", Phys. Rev., vol. 144, 1966, pp. 708-714.
Sham, L.J., "Recombination and Shake-up in Doped Quantum Wells", Journal de Physique Colloques, 1987, 48, pp. 381-384.
Sham, L.J. "Theory of the Shallow Impurity States in Semiconductors", Phys. Rev., vol. 150, 1966, pp. 720-727.
Soci, C. et al., "ZnO nanowire UV photodetectors with high internal gain," Nano Letters, vol. 7, No. 4, 2007, pp. 1003-1009.
Sooryakumar, R., Tuning of the Valence-Band Structure of GaAs Quantum Wells by Uniaxial Stree; Phys. Rev. Lett., vol. 58, 1987, pp. 1150-1153.
Su, Y.K. et al., "Temperature dependent characteristics of a PIN avalanche photodiode (APD) in Ge, Si and GaAs", Opt Quant Electron., vol. 11, 1979, pp. 109-117.
Tajima, M. et al., "Fine Structure Due to Donor-Acceptor Pair Luminescence in Compensated Si," Applied Physics Express 3, 2010, p. 071301-3.
Tassone, F. et al., "Exciton-exciton scattering dynamics in a semiconductor microcavity and stimulated scattering into polaritons," Phys. Rev. B 59, 1999, pp. 10830-10842.
Thomas, D.G. et al., "Kinetics of Radiative Recombination at Randomly Distributed Donors and Acceptors", Phys. Rev., vol. 140, 1965, pp. A202-A220.
Trinh, M. T. et al. "Direct generation of multiple excitons in adjacent silicon nanocrystals revealed by induced absorption", Nature Photon. 6, 2012, pp. 316-321.
Verwey, J.F. et al., "Mean free path of hot electrons at the surface of boron-doped silicon", J. Appl. Phys., vol. 46, 1975, pp. 2612-2619.
EPO, Examination Report for European Patent Application No. 14780028.8, dated May 6, 2020. 5 pages.
EPO, Decision to Grant for European Patent Application No. 14780028.8, dated Nov. 20, 2020. 5 pages.
KIPO, Notice of Allowance for Korean Patent Application No. 10-2015-7028575, dated Apr. 20, 2021. 13 pages with English translation.

* cited by examiner

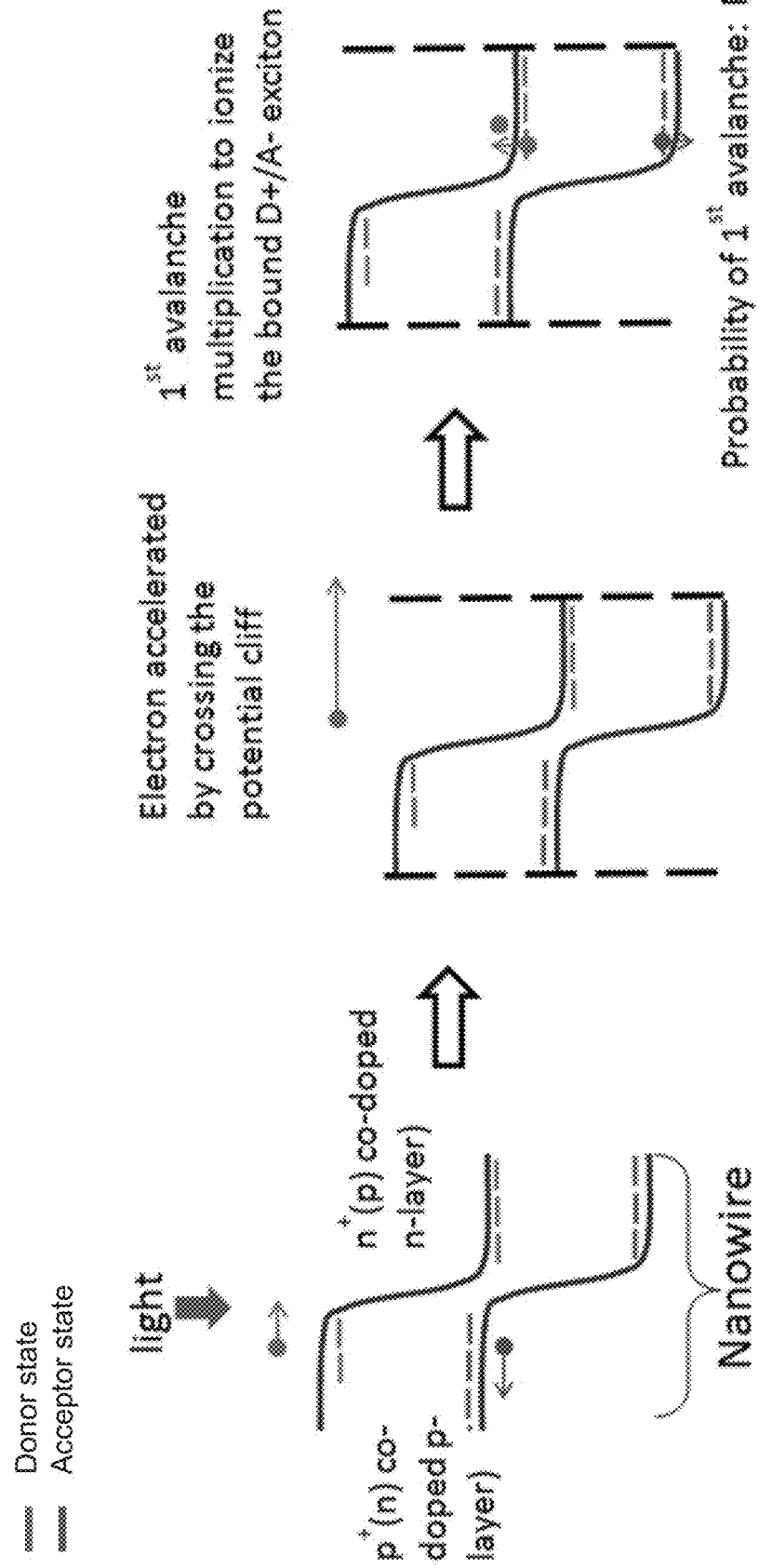

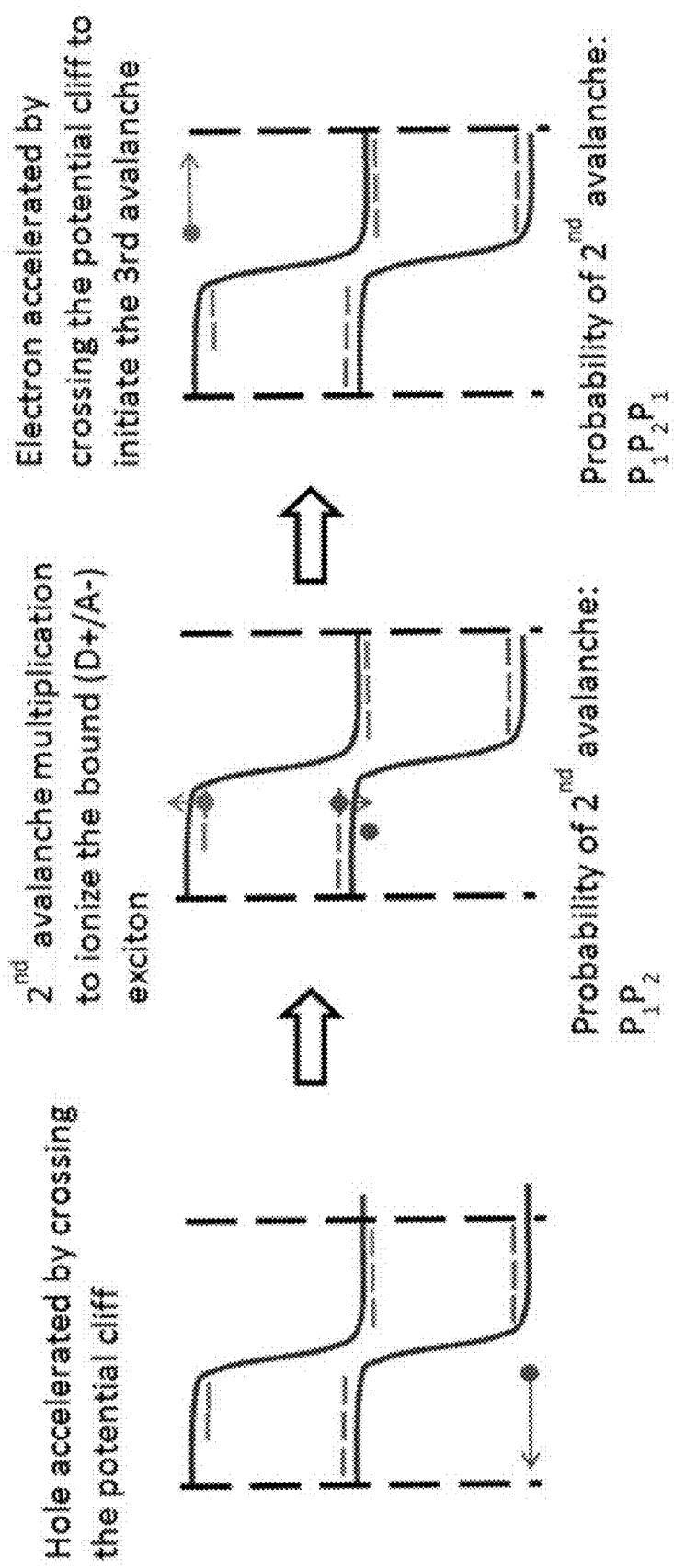

450 nm     532 nm     635nm ic to electrical conversion devices and methods

HIGHLY EFFICIENT OPTICAL TO ELECTRICAL CONVERSION DEVICES AND MELHODS

CROSS-REFERENCE TO RELATED APPLICATIONS

Under 35 U.S.C. § 120, this application is a continuation-in-part of International Patent Application No. PCT/US2014/024866 entitled "HIGHLY EFFICIENT OPTICAL TO ELECTRICAL CONVERSION DEVICES AND METHODS," filed on Mar. 12, 2014, and, under 35 U.S.C. § 119(e), claims the benefit of priority of U.S. Provisional Patent Application No. 61/777,771, entitled "HIGH CONVERSION EFFICIENCY SOLAR CELL DEVICES," filed on Mar. 12, 2013, and U.S. Provisional Patent Application 61/893,894, entitled "EFFICIENT OPTICAL TO ELECTRICAL CONVERSION BASED ON MULTILAYERED NANOWIRE STRUCTURES," filed on Oct. 22, 2013. This application also claims the benefit of priority of U.S. Provisional Patent Application No. 62/103,499, entitled "PHOTORESPONSE AMPLIFICATION METHODS AND DEVICES," and filed on Jan. 14, 2015. The entire content of the above-mentioned patent applications is incorporated by reference as part of the disclosure of this application.

TECHNICAL FIELD

This patent document relates to signal amplification techniques using nanoscale semiconductor materials.

BACKGROUND

Nanotechnology provides techniques or processes for fabricating structures, devices, and systems with features at a molecular or atomic scale, e.g., structures in a range of one to hundreds of nanometers in some applications. For example, nanoscale devices can be configured to sizes similar to some large molecules, e.g., biomolecules such as enzymes. Nanometer-sized materials used to create a nanostructure, nanodevice, or a nanosystem can exhibit various unique properties, e.g., including optical properties, that are not present in the same materials at larger dimensions and such unique properties can be exploited for a wide range of applications.

SUMMARY

Techniques, systems, and devices are described for highly-efficient optical to electrical energy conversion, e.g., which exceed the highest efficiencies achievable for single-junction Si according to Shockley-Queisser theory.

In one aspect, an optical-to-electrical energy conversion device is presented. The optical-to-electrical energy conversion device includes a substrate formed of a doped semiconductor material, in which the substrate includes a first region and a second region. The optical-to-electrical energy conversion device includes an array of multilayered nanostructures protruding from the first region of the substrate, in which the multilayered nanostructures are formed of a first co-doped semiconductor material covered by a layer of a second co-doped semiconductor material forming a core-shell structure, and in which the layer covers at least a portion of the doped semiconductor material of the substrate in the second region. The first and second co-doped semiconductor materials include electron acceptor dopants and electron donor dopants, in which the first co-doped semiconductor material includes a greater concentration of one type of the acceptor or donor dopants than the other type dopants, and the second co-doped semiconductor material includes a greater concentration of the other type dopants than the one type dopants. The optical-to-electrical energy conversion device includes an electrode formed on the layer-covered portion of the substrate in the second region. The multilayered nanostructures of the optical-to-electrical energy conversion device are structured to provide an optical active region capable of absorbing photons from light at one or more wavelengths to generate an electrical signal presented at the electrode.

In another aspect, devices and methods are described for optical to electrical signal conversion and signal amplification with high efficiency based on a cascaded exciton ionization (CEI) carrier multiplication mechanism. Exemplary CEI devices and methods can be implemented in a variety of applications including photovoltaics, communications, and imaging, among others. In some implementations, an exemplary CEI device includes a substrate formed of a doped silicon material, in which the substrate includes a first region and a second region. The exemplary CEI device includes an array of multilayered nanowire structures protruding from the first region of the substrate, in which the nanowire structures are formed of a first co-doped silicon material covered by a layer of a second co-doped silicon material forming a core-shell structure, and in which the layer covers at least a portion of the substrate in the second region. The first and second co-doped silicon materials include electron acceptor dopants and electron donor dopants, in which the first co-doped silicon material includes a greater concentration of one type of the acceptor or donor dopants than the other type dopants, and the second co-doped silicon material includes a greater concentration of the other type dopants than the one type dopants. The exemplary CEI device includes an electrode formed on the layer-covered portion of the substrate in the second region. The multilayered nanowire structures of the exemplary CEI device are structured to provide an optical active region capable of absorbing photons from light at one or more wavelengths to generate an electrical signal presented at the electrode via a cascaded exciton ionization (CEI) mechanism.

In another aspect, a method to convert optical energy to electrical energy includes receiving light on a surface structured to include a doped semiconductor substrate at least partially covered by an array of multilayered nanostructures formed of a first co-doped semiconductor material covered by a layer of a second co-doped semiconductor material, converting the received light to an electrical signal by a cascaded exciton ionization (CEI) mechanism at the array of multilayered nano structures, wherein the electrical signal is presented at an electrode on the doped semiconductor substrate of the surface, and conducting the electrical signal to an electrical circuit.

The subject matter described in this patent document can be implemented in specific ways that provide one or more of the following features. For example, the disclosed technology includes an engineered physical mechanism, cascaded exciton ionization (CEI), to amplify the photoresponse of core-shell semiconductor nanoscale structures (e.g., silicon nanowires) without the constraint of the MEG or avalanche mechanism. In some implementations, for example, the disclosed CEI process can be implemented using a nanoscale device having a heavily-doped, partially compensated p-n junction in which the p-region contains a substantial amount of donors and the n-region contains a substantial amount of acceptors. An exemplary salient feature of the disclosed CEI technology is that, unlike avalanche multiplication, the CEI process can take place at low or even zero bias. As a result, the CEI process can be used for detection of optical signals and energy conversion such as photovoltaics, or even optical cooling (e.g., to remove heat from the area under illumination).

In another aspect, a method for signal amplification includes applying a low bias voltage across a p-n junction of a semiconductor material that is heavily doped and partially compensated, in which the semiconductor material includes a first co-doped semiconductor material and a second co-doped semiconductor material; receiving light on a surface of the semiconductor material; converting the received light to an electrical signal by cascaded exciton ionization (CEI); and conducting the electrical signal to an electrical circuit.

In another aspect, a device for photoresponse amplification includes a substrate; an array of multilayered nanostructures protruding from a first region of the substrate, in which the nanostructures include a first co-doped semiconductor material covered by a layer of a second co-doped semiconductor material forming a core-shell structure having a heavily-doped and partially-compensated p-n junction, in which the first and the second co-doped semiconductor materials include electron acceptor dopants and electron donor dopants at a concentration level substantially on the order of $1\times10^{19}$ cm$^{-3}$ or greater, where the first co-doped semiconductor material includes a greater concentration of one type of the electron acceptor or the electron donor dopants than the other type dopants, and the second co-doped semiconductor material includes a greater concentration of the other type dopants than the one type dopants, and in which the layer of the second co-doped semiconductor material covers at least a portion of the substrate in a second region; and an electrode formed on the layer-covered portion of the substrate in the second region. The multilayered nanostructures provide an optical active region capable of absorbing photons from light at one or more wavelengths to generate an electrical signal presented at the electrode via a cascaded exciton ionization (CEI) mechanism.

BRIEF DESCRIPTION OF THE DRAWINGS

FIGS. 4A-4F show exemplary schematics illustrating the operation principle of cascaded exciton ionization in an exemplary solar cell device of the disclosed technology.

DETAILED DESCRIPTION

Figure 1:
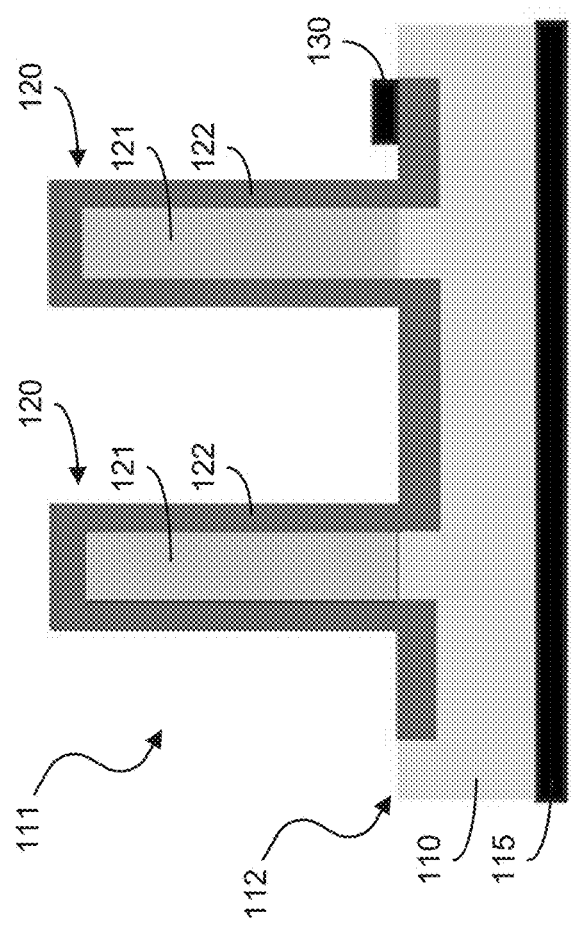
FIG. 1 shows a schematic of an exemplary optical-to-electrical energy conversion device including a co-doped, heavily compensated p/n junction structure.

Almost 95% of deployed solar cells in the world are crystalline Si single junction solar cells. The Shockley-Queisser limit suggests that the single junction Si (e.g., 1.1 eV bandgap) solar cell has a maximum theoretical efficiency of 29% (e.g., under 1.5 Sun). The efficiency limit is largely due to the energy loss to heat by photons having higher energy than the bandgap energy of silicon. To date, 25%-26% efficiency solar cells have been demonstrated. To push solar energy as an economically viable energy source, solar cell systems, devices, and processes need to drive significantly beyond low efficiencies, such as the 29% theoretical efficiency of single junction Si solar cells while achieving a low cost approach.

Single junction solar cells refer to devices having their p/n junctions made of only one type of material (e.g. Si). In contrast, multi junction solar cells are structured to contain a series of p/n junctions made of semiconductors of different bandgap energies. For example, a double-junction solar cell may include a GaAs p/n junction as the first p/n junction in series with a Ge p/n junction as the second p/n junction. Sunlight impinges upon the first GaAs p/n junction first and photons of greater energy than the GaAs bandgap energy are mostly absorbed. Photons of lower energy than the bandgap of GaAs are then absorbed by the second Ge p/n junction underneath the GaAs p/n junction. As such, multi junction solar cells can obtain higher energy conversion efficiency at a higher cost than single junction silicon solar cells. A few applications such as space applications and designs involving solar concentrators as additional components may be able to take the technical advantage of the multi junction solar cell designs for improved efficiencies. In most applications where the cost is a significant consideration, the vast majority of terrestrial solar cells are single junction, single crystal silicon solar cells with a bandgap energy of 1.12 eV.

The upper energy conversion efficiency of single junction silicon solar cells has been limited to 29% under 1.5 suns, as predicted by the Shockley-Queisser theory published in their 1961 paper. The theory has proven valid over the past 5 decades. The state-of-the-art single junction silicon solar cells demonstrated in the research laboratories have shown 25-26% efficiency and the devices deployed in the field has reached 20% efficiency. Decades of research has not produced effective and reproducible designs for single junction Si solar cells with efficiency above the Shockley-Queisser limit. For example, one important factor that limits the Si solar cell efficiency is the energy loss to phonons. When the photon energy is greater than the bandgap energy of Si, the extra energy turns into heat due to phonon scattering, causing more than 50% loss of solar energy. Also, for example, techniques such as multi-exciton generation (MEG) and secondary excitation have not proven to be effective or practical, and most nanostructure solar cells have shown even lower efficiency than optimized conventional devices.

Techniques, systems, and devices are described for highly-efficient optical to electrical energy conversion, e.g., which exceed the highest energy conversion efficiencies achievable for single junction Si according to Shockley-Queisser theory.

The disclosed optical-to-electrical energy conversion technology provides practical, low cost methods to fundamentally overcome the Shockley-Queisser limit by a large margin. Exemplary methods of the disclosed technology can be applied to many types of semiconductors, including or besides silicon. In some aspects, for example, Si single junction solar cells devices are disclosed that achieve energy conversion efficiencies greater than 48%.

In one aspect, an optical-to-electrical energy conversion device of the disclosed technology is structured to include silicon core/shell nanostructures (e.g., nanowires) with heavily compensated p/n junctions to provide an optical region for optical-to-electrical energy conversion. The optical-to-electrical energy conversion device includes a substrate formed of a doped semiconductor material, in which the substrate includes a first region and a second region. The optical-to-electrical energy conversion device includes an array of multilayered nanostructures (e.g., such as nanowires) protruding from the first region of the substrate, in which the nanostructures (e.g., nanowires) are formed of a first co-doped semiconductor material covered by a layer of a second co-doped semiconductor material forming a core-shell structure, and in which the layer covers at least a portion of the doped semiconductor material of the substrate in the second region. The first and second co-doped semiconductor materials include electron acceptor dopants and electron donor dopants, in which the first co-doped semiconductor material is structured to include a greater concentration of one type of the acceptor or donor dopants than the other type dopants throughout the first co-doped semiconductor material, and the second co-doped semiconductor material is structured to include a greater concentration of the other type dopants than the one type dopants throughout the second co-doped semiconductor material. The optical-to-electrical energy conversion device includes an electrode formed on the layer-covered portion of the substrate in the second region. The multilayered nanostructures are structured to provide an optical active region capable of absorbing photons from light at one or more wavelengths (e.g., including visible light) to generate an electrical signal presented at the electrode.

The exemplary solar cell device is shown in schematics and micrograph images of FIGS. 1 and 2A-2C, depicting etched nanowires and nano ridges standing vertically on the substrate of the device and having co-doped, heavily compensated $p^+/n^+$ junction with a narrow dimension in the direction of the $p^+/n^+$ junction.

FIG. 1 shows a schematic of a co-doped, heavily compensated p/n junction structure of an exemplary optical-to-electrical energy conversion device 100. In some implementations, for example, the device 100 can be used in a solar cell device. The device 100 includes a substrate 110 that is formed of a doped semiconductor material. For example, the substrate 110 can be configured as a p-type semiconductor, as in the exemplary embodiment shown in FIG. 1. In some implementations, for example, the device 100 can include a substrate base 115 formed of an electrical insulator material coupled to the substrate 110. The substrate 110 is structured to include two operative regions, a first region 111 and a second region 112. The first region 111 includes an array of multilayered nanowire structures 120 protruding from the substrate 110. The multilayered nanowire structures 120 are formed of a first co-doped semiconductor material 121 covered by a layer of a second co-doped semiconductor material 122, e.g., forming a core-shell structure. For example, in some implementations of the device 100, the first co-doped semiconductor material 121 can be engineered as a p+/n type semiconductor material, in which the p+/n type semiconductor material includes both electron acceptor and electron donor dopants throughout the first material, and the acceptor concentration is greater than the donor concentration (e.g., where the acceptor concentration can be on the order of $10^{19}$ cm$^{-3}$ carrier concentration and the donor concentration can be on the order of $10^{18}$ cm$^{-3}$ carrier concentration). The first co-doped semiconductor material 121 is controllably doped to a desired doping threshold to produce a co-doped, heavily compensated p+/n junction structure, e.g., in which the p+/n doping threshold can be at least $10^{18}$ cm$^{-3}$. Also in such implementations, for example, the second co-doped semiconductor material 122 can be engineered as a n+/p type semiconductor material, in which the n+/p type semiconductor material includes both electron acceptor and electron donor dopants throughout the second material, and the donor concentration is greater than the acceptor concentration (e.g., where the donor concentration can be on the order of $10^{19}$ cm$^{-3}$ carrier concentration and the acceptor concentration can be on the order of $10^{18}$ cm$^{-3}$ carrier concentration). The second co-doped semiconductor material 122 is controllably doped to a desired doping threshold to produce a co-doped, heavily compensated n+/p junction structure, e.g., in which the n+/p doping threshold can be at least $10^{18}$ cm$^{-3}$. In some implementations, for example, the layer of the second co-doped semiconductor material 122 can also cover at least a portion of the doped semiconductor material of the substrate 110 in the second region 112. The device 100 includes an electrode 130 formed on the layer-covered substrate in the second region. For example, the electrode 130 can be configured to include an n type semiconductor material. The multilayered nanowire structures 120 of the device 100 provide an optical active region capable of absorbing photons from visible light at particular wavelengths to generate an electrical signal presented at the electrode 130.

The optical-to-electrical energy conversion device 100 can be produced by the following fabrication method. The fabrication method can include a process to form an array of nanostructures (e.g., such as nanowires) in a first region (e.g., region 111) of a substrate formed of a doped semiconductor material (e.g., substrate 110). For example, the doping concentration of the substrate can be at least $10^{18}$ cm$^{-3}$ of a first dopant, e.g., in which the first dopant includes one type of electron acceptor dopants or electron donor dopants. The fabrication method can include a process to deposit a dopant material on the first region to form a layer over the array of nanostructures. For example, the dopant material contains a second dopant of the other type of the electron acceptor dopants or the electron donor dopants from the first dopant. For example, if the one type of dopants of the first dopant is electron acceptor dopants, then the other type of dopants of the second dopant is electron donor dopants. The fabrication method can include a process to (i) convert the doped semiconductor material of the array of nanostructures into a first co-doped semiconductor material having both the electron acceptor dopants and the electron donor dopants, in which there is a greater concentration of the one type of dopants than the other type of dopants. Concurrently, the fabrication method can include a process to (ii) convert the deposited material of the layer over the array of nanostructures into a second co-doped semiconductor material having both the electron acceptor dopants and the electron donor dopants, in which there is a greater concentration of the other type of dopants than the one type of dopants. For example, the converting process can include applying heat (e.g., at temperatures greater than 900° C.) for a duration of time (e.g., less than a minute) to control a diffusion process of the opposite dopants to diffuse throughout the primary doped materials (e.g., the doped semiconductor material of the nanostructures and the dopant material of the formed layer over the nanostructures) to form the first and the second co-doped semiconductor materials. Implementation of these processes of the fabrication method thereby produces a core/shell structure of the first co-doped semiconductor material and the second co-doped semiconductor material, respectively, capable of absorbing photons from light at one or more wavelengths to generate an electrical signal.

In some implementations of the fabrication method, the process to form the array of nanostructures can include etching the nanostructures from the substrate into a pattern based on a mask. For example, the etching can include an inductively coupled plasma-reactive-ion etching process with $C_4F_8$ and $SF_6$ gases using electron-beam lithographically-patterned nickel disks as the mask. In some implementations of the fabrication method, the process to deposit the dopant material can include coating a dopant solution onto a second substrate, baking the coated dopant solution on the second substrate, and transferring the second dopant from the second substrate on the first region of the substrate by applying heat to evaporate the second dopant to form the layer over the over the array of nanostructures. In some implementations of the fabrication method, the process to deposit the dopant material can include forming the layer to cover at least a portion of the doped semiconductor material of the substrate outside the first region. In some implementations, for example, the fabrication method can further include producing a contact pad of an electrically conductive material on the first region of the substrate.

Figure 2C:
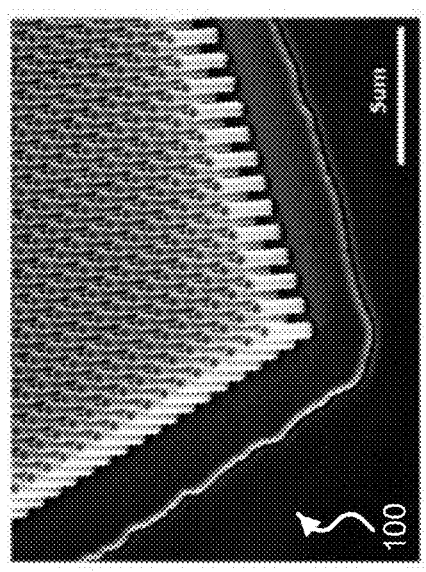
FIGS. 2A-2C show exemplary optical and scanning electron micrographs of exemplary Si nanowire based optical-to-electrical energy conversion devices with the co-doped, heavily compensated p/n junction structure.
Figure 2B:
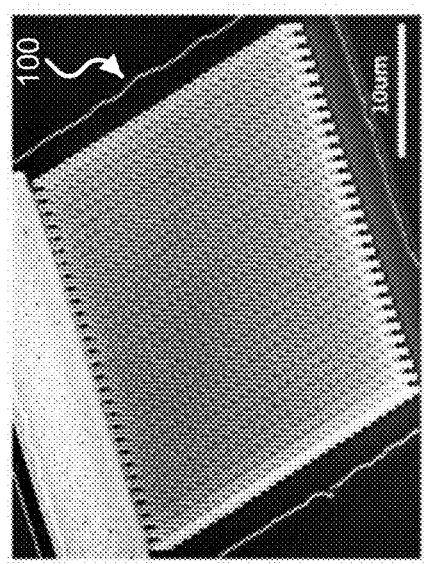
Figure 2A:
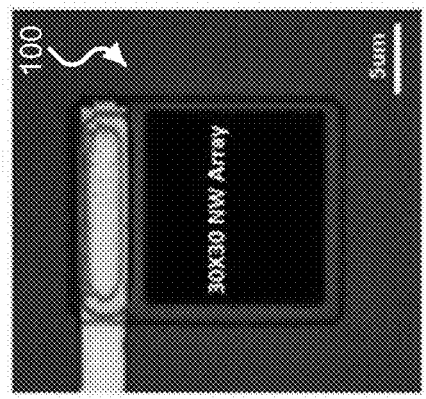

FIGS. 2A-2C show exemplary optical and scanning electron micrographs of exemplary Si nanowire based optical-to-electrical energy conversion devices with the co-doped, heavily compensated p/n junction structure. The exemplary device 100 is shown in FIGS. 2A-2C structured to include an array of 30×30 p-core/n-shell silicon nanowire structures, e.g., having a nanowire diameter in a range of 280 nm to 340 nm. FIG. 2A shows exemplary optical of the device 100 with the exemplary co-doped, heavily compensated p/n junction structure. The exemplary scale bar in the optical image of FIG. 2A is 5 µm. FIGS. 2B and 2C show scanning electron microscopy (SEM) micrographs of the device 100 having the exemplary co-doped, heavily compensated p/n junction structure. The exemplary scale bar in the SEM micrograph of FIG. 2B is 10 µm, and the exemplary scale bar of the zoomed-in SEM micrograph of FIG. 2C is 5 µm.

Figure 2D:
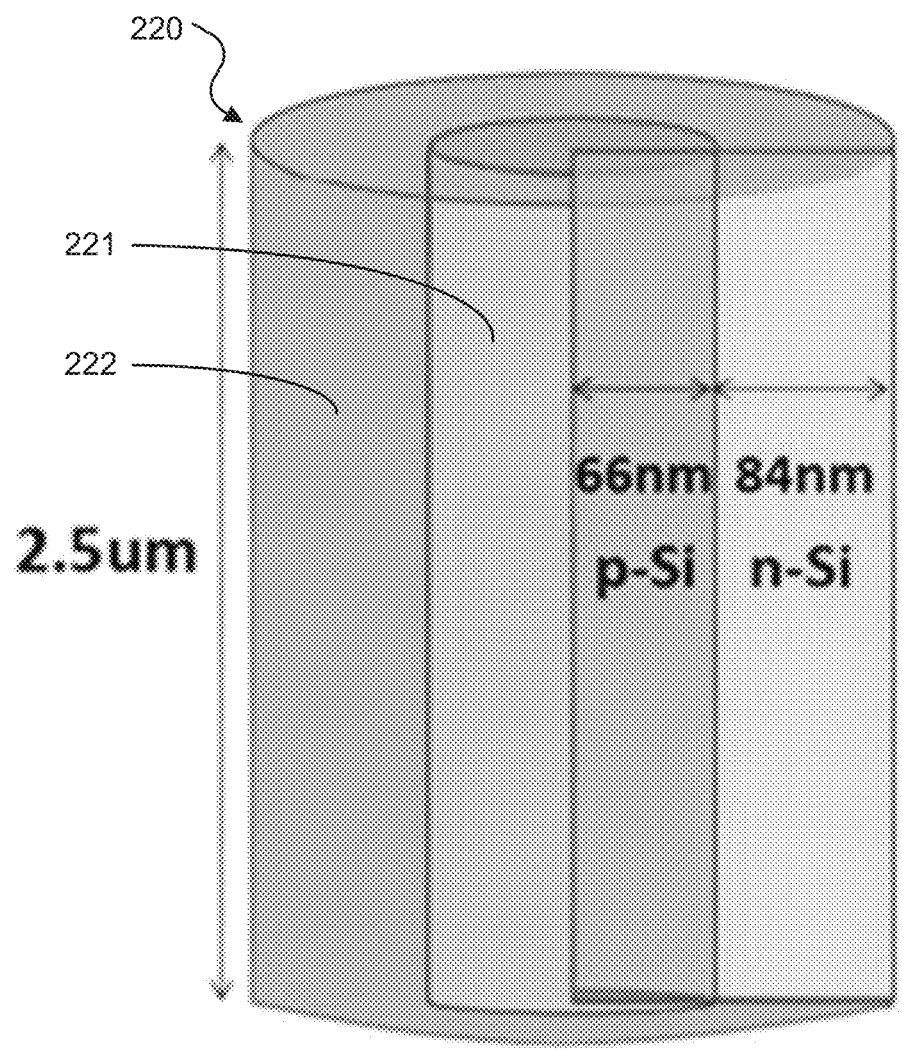
FIG. 2D shows a schematic of an exemplary co-doped p+/n+ junction structure of the disclosed optical-to-electrical energy conversion devices.

FIG. 2D shows a schematic of an exemplary co-doped p+/n+ junction nanowire structure 220 of an exemplary optical-to-electrical energy conversion device of the disclosed technology. In this example, a p-doped silicon (p-Si) material 221 is coated by an n-doped silicon (n-Si) material 222 to form a core-shell structure having a p+/n+ junction with a narrow dimension in the direction of the $p^+/n^+$ junction. For example, the p-Si material 221 can be configured in a cylindrical, wire-like structure, e.g., having a radius of ~66 nm, in which the n-Si material 222 can be formed in an outer cylindrical geometry encasing the p-Si material 221 and a thickness of ~84 nm, e.g., thereby producing the co-doped p+/n-type core n+/p-type silicon nanowire structure 220 to have a diameter of ~300 nm. In the example depicted in FIG. 2D, the interior core region of the co-doped junction nanowire structure 220 is formed of the p+/n type silicon material including both electron acceptor and electron donor dopants, in which the acceptor concentration is greater than the donor concentration. For example, the acceptor dopants can be on the order of $10^{19}$ cm$^{-3}$ (e.g., $2\times10^{19}$ cm$^{-3}$). The exterior shell region of the co-doped junction nanowire structure 220 is formed of the n+/p type silicon material including both electron acceptor and electron donor dopants, in which the donor concentration is greater than the acceptor concentration.

For example, the device 100 can be configured such that a high dosage of donors is introduced to the p-region and a high dosage of acceptors to the n-region, e.g., forming heavily compensated p/n junction. Through a process of "cascaded exciton ionization" (CEI), which occurs in such a heavily compensated device, under short-circuit conditions, the absorption of a single photon can produce multiple electron-hole pairs. For example, in the short-circuit condition, absorption of one photon can produce a large number (e.g. 4-10) of e-h pairs. This then increases the short-circuit current by 400% to 1000%, e.g., as relative to state-of-the art devices. Consequently, a conversion efficiency higher than 29% can be achieved. For example, a conversion efficiency greater than 48% can be achieved in single junction Si solar cells, thus nearly doubling the Shockley-Queisser limit.

For example, the optical active region is configured to absorb photons of visible light at wavelengths with energies above the 1.12 eV bandgap energy of Si. In some implementations of the device 100, for example, the optical active region is configured to absorb photons from visible light at 630 nm, in which the absorption of red photons at 630 nm wavelengths produce at least 4 electron-hole pairs for generation of the electrical signal.

Exemplary implementations of the disclosed optical-to-electrical energy conversion devices were performed. In some implementations, for example, photoresponse measurements were conducted under visible 630 nm light which showed that one 630 nm photon produces 4 to 10 electron-hole pairs under short-circuit conditions; and this exemplary result was reproducible. Within the exemplary CEI process of the disclosed technology, a hot carrier (e.g., ~1 eV kinetic energy) can ionize a bound exciton (A-D+) due to the high concentration of co-doped acceptors and donors. Loss of energy through phonon scattering is limited to ~50 meV given the nanoscale of the core/shell structure. There is no violation of energy conservation within the model, e.g., electron-hole generation occurs under short circuit conditions, and since the terminal voltage is zero, the device does not produce more output power than the input optical power.

In some embodiments, the disclosed devices can be configured to include a large amount (~$10^{19}$ cm$^{-3}$) of acceptors and donors that are introduced into the semiconductor. In areas where the acceptor concentration is greater than the donor concentration, the material becomes p-type semiconductor. In areas where the donor concentration overcompensate for the acceptor concentration, the material shows the characteristics of n-type semiconductor. For example, because of the P$^+$/n$^+$ junction, the build-in potential is very close to the bandgap energy, e.g., around 1 eV for Si with its room temperature bandgap of around 1.12 eV. For example, because of co-existence of donors and acceptors in both p- and n-side of semiconductor, each side forms an impurity band and most important of all, a coupled 3D matrix of D+/A- bound excitons. The electrons move from the donors to occupy the states in the nearby acceptors, as shown in FIG. 3.

Figure 3:
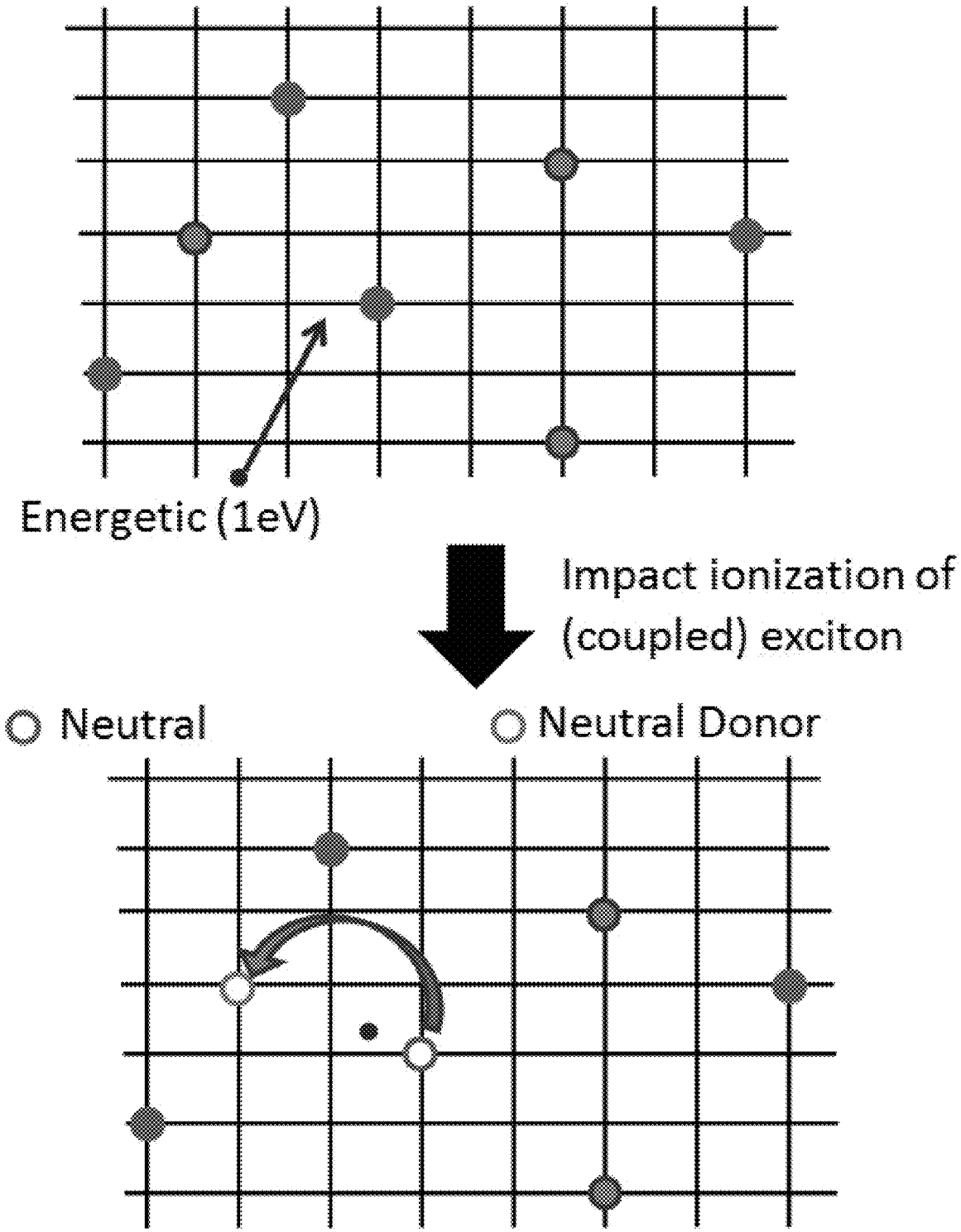
FIG. 3 shows exemplary diagrams showing ionization of coupled bound exciton by energy carriers.

FIG. 3 shows exemplary diagrams showing ionization of coupled bound exciton by energy carriers. When both the donors and acceptors are doped to a level of the order of 1×$10^{19}$ cm$^{-3}$, for example, the average distance between a donor and an acceptor is less than 2.5 nm (e.g., around 2 nm). Depending on the carrier concentration, the Debye length is comparable to the donor-acceptor spacing. The exciton spacing is also less than the exciton radius (e.g., around 3 nm), causing coupled excitons. Thus, for example, it takes less than 1 eV to ionize the bound exciton to produce the neutral)(A° D° state. The neutral donor/acceptor is thermally ionized to become e/h pairs contributing to the current. For example, because of the core/shell nanostructure, a carrier can see the potential cliff at the p/n junction within an average distance of 40-60 nm. At a thermal velocity of $10^7$ cm/s, it may take about 0.5 ps to cross the potential cliff. Considering the energy relaxation time by phonon scattering, the carrier may lose less than 50 meV due to the inelastic phonon scattering. Considering the impurity band tails due to the heavy donor and acceptor concentrations, the energy required to "ionize an exciton" can be estimated to be approximately represented as Eg-$\varepsilon_d$-$\varepsilon_a$+ |$\varepsilon_b$|, where $E_g$ is the bandgap of the bulk crystal, $\varepsilon_d$ and $\varepsilon_a$ are the ionization energy of donor and acceptor, and |$\varepsilon_b$| is the magnitude of excitonic binding energy. In practice, for example, the exciton ionization energy in such heavily co-doped and compensated semiconductor can be over 100 meV below the bandgap of bulk semiconductor. As to be discussed next, the lowering of the exciton ionization energy and the large number of coupled excitons present in such specific p/n junction structure is important to the high energy conversion efficiency of the solar cells.

FIGS. 4A-4F show exemplary schematics illustrating the operation principle of the cascaded exciton ionization (CEI) in the exemplary optical-to-electrical energy conversion device 100 of the disclosed technology. For example, the disclosed optical-to-electrical energy conversion technology can produce multiple electron-hole pairs that contribute to the short-circuit current of solar cells. For example, assume a photon is absorbed in the p-side of the p/n junction to produce the primary electron-hole pair, as depicted in the plot of FIG. 4A, and the device 100 is connected in a short-circuit configuration. The photogenerated hole leaves the device rapidly, but the photo-generated electron crosses over a steep potential cliff and is accelerated to obtain a high kinetic energy of around 1 eV, as shown in FIG. 4B. In a normal p/n junction solar cell, the kinetic energy of the electron is quickly lost through phonon scattering and thermalized. However, due to the very high population of bound (D$^+$/A$^-$) excitons and the reduced exciton ionization energy explained previously, there exists a significant probability that the energetic electron ionizes an exciton to (D°/A°) state by collision, in a process similar to impact ionization. Before the ionized exciton has a chance to return to its original bound (D$^+$/A$^-$) state, it can be ionized by thermal energy or by interaction with other hot electrons to form a secondary electron-hole pair in the conduction and valence band, as depicted in FIG. 4C. The secondary hole will cross the p/n junction and gain the kinetic energy, shown in FIG. 4D. This energetic hole also has a finite probability to ionize a bound (D$^+$/A$^-$) to the (D°/A°) state on the p-side of the p/n junction, shown in FIG. 4E. The (D°/A°) state can be thermalized to produce the third generation of e-h pairs, as shown in FIG. 4F, and the process can go on.

In an exemplary model, the probability for electron initiated exciton ionization is $P_1$, and the probability for hole initiated exciton ionization is $P_2$. The average number of e-h pairs produced by absorption of a single photon can be represented as:

$$N = \frac{1 + \frac{1}{2}(P_1 + P_2)}{1 - P_1 P_2} \quad (1)$$

N can be treated as the 'effective" quantum efficiency under the short-circuit condition. For example, if both $P_1$, $P_2$=0.5, N=2 according to Eq. 1, indicating that absorption of one photon can produce 2 electron-hole pairs and the short circuit current is twice of the incoming photon flux. The short-circuit current of the solar cell of the disclosed technology can be written as:

$$I_{sc} = I_{scc} \left[ \frac{1 + \frac{1}{2}(P_1 + P_2)}{1 - P_1 P_2} \right] \quad (2)$$

where $I_{sc}$ and $I_{scc}$ are the short-circuit current of the device of the disclosed technology and the conventional solar cell, respectively.

Figure 5:
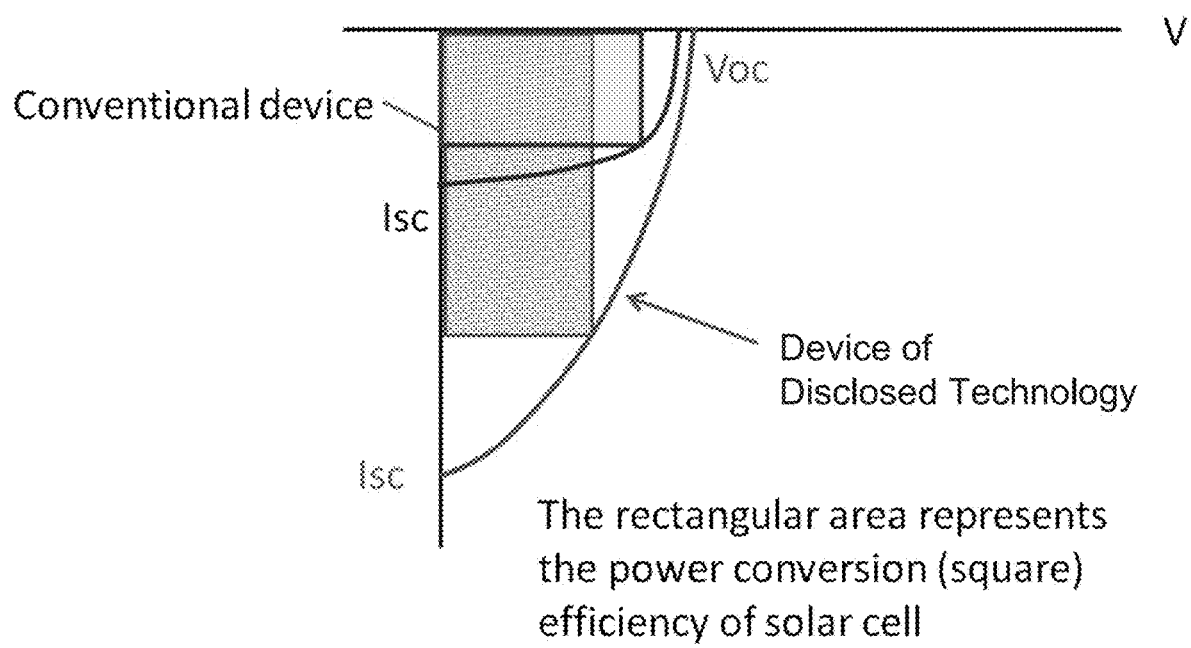
FIG. 5 shows an exemplary I-V characteristic plot showing the qualitative comparison of solar cell efficiency between a conventional Si single junction solar cell device and an exemplary solar cell device of the disclosed technology.

FIG. 5 shows an exemplary I-V characteristic plot showing the qualitative comparison of solar cell efficiency between a conventional Si single junction solar cell device and an exemplary solar cell device of the disclosed technology. The exemplary I-V characteristic plot of FIG. 5 shows qualitatively how an exemplary device of the disclosed technology, e.g., such as device 100, can enhance the overall solar cell efficiency. The device of the disclosed technology produces a significant increase in the short-circuit current, but only a modest effect on the open-circuit voltage. In the open circuit configuration, the accumulated electrons and holes on either side of the p/n junction reduces the magnitude of the potential cliff across the p/n junction by the amount of $V_{oc}$. As a result, the electrons and holes do not gain enough kinetic energy to produce excitons. When the probabilities of exciton ionization $P_1$, and $P_2$ approach zero, the device of the disclosed technology produces the same open-circuit voltage as conventional solar cells.

The net energy conversion efficiency of a solar cell is determined by the square efficiency, determined graphically by the largest rectangle within the area defined by the I-V characteristics under a given solar energy. It becomes apparent that when the short-circuit current increases, the square efficiency also increases. Or equivalently, the same amount of electrical power can be produced under weaker sun light.

Figure 6:
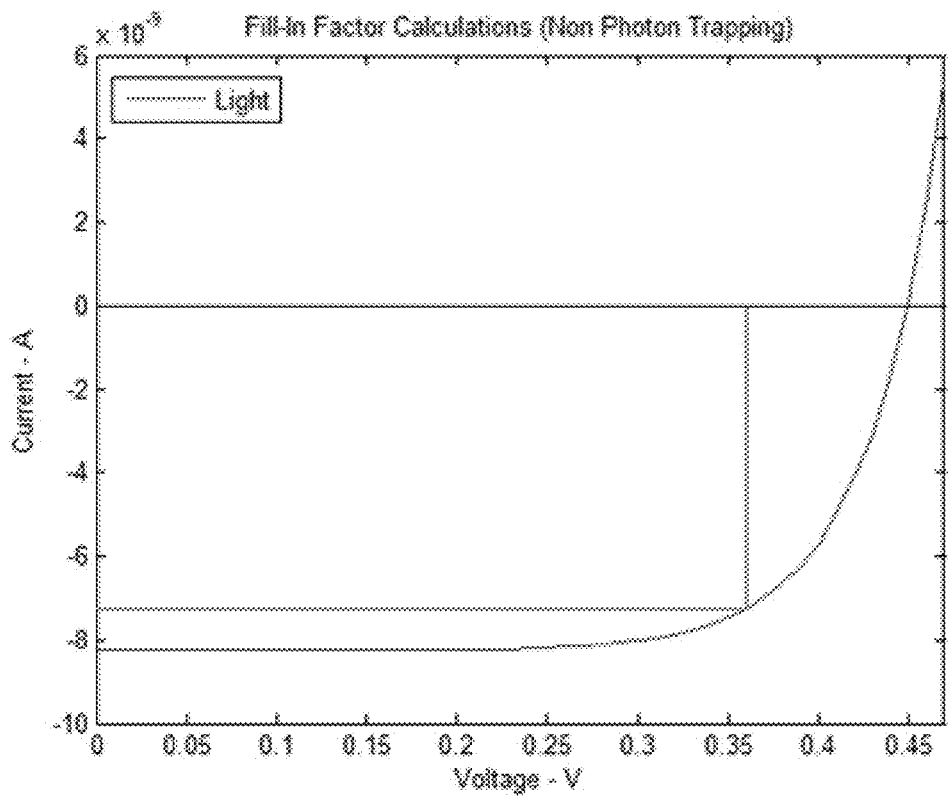
FIG. 6 shows an exemplary plot showing an exemplary result of the disclosed solar cell under red light illumination.

FIG. 6 shows an exemplary plot showing an exemplary result of the disclosed solar cell under red light (e.g., 635 nm wavelength) illumination. The measured energy conversion efficiency was shown to be around 65% at the exemplary 635 nm wavelength. The exemplary result demonstrates the effect of cascaded exciton ionization (CEI). Otherwise, even in the most ideal scenario with 100% light capturing efficiency, zero Ohmic loss, and 100% quantum efficiency (i.e., every photon that is absorbed produces one e-h pair), the maximum achievable efficiency can only be 51% for 635 nm wavelength light.

Figure 7A:
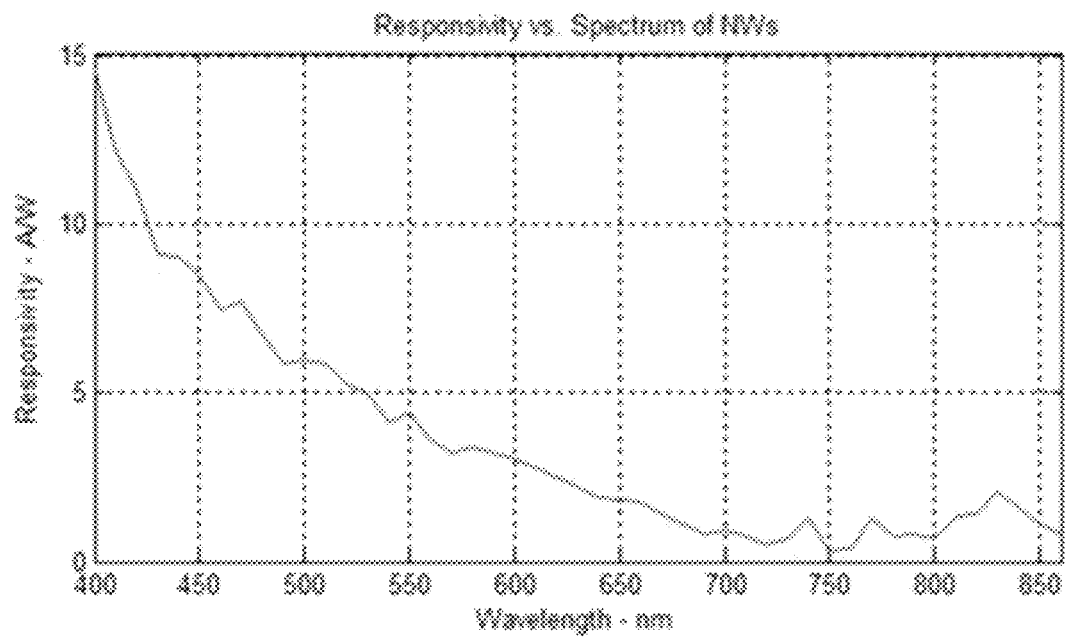
FIGS. 7A and 7B show exemplary data plots of the measured wavelength dependence of responsivity and quantum efficiency of an exemplary solar cell device in a short-circuit configuration.
Figure 7B:
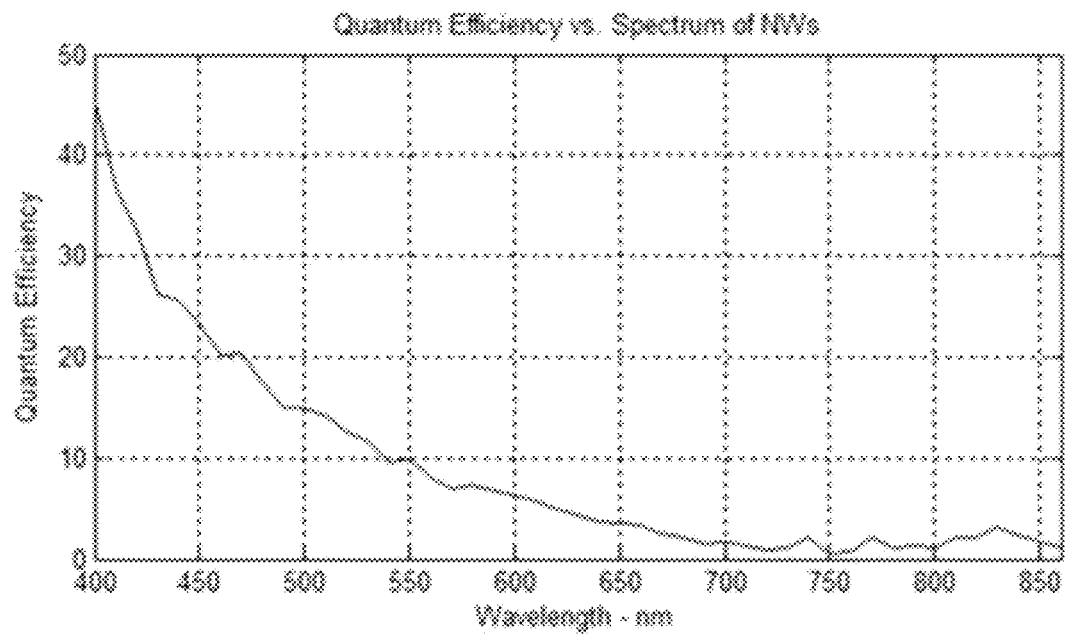

FIGS. 7A and 7B show exemplary data plots depicting the measured wavelength dependence of responsivity and quantum efficiency of an exemplary solar cell device in a short-circuit configuration, respectively, e.g., over the spectral range between 400 nm and 850 nm. As shown in FIG. 7B, at short wavelength (e.g., 400 nm), one single photon can produce over 40 electron-hole pairs contributing to the short-circuit current. It is noted that, for example, this does not violate the law of conservation of energy since the exemplary device is at zero bias, thus delivering no power in the short-circuit configuration. The contribution of power conversion efficiency from the significant increase in the short-circuit quantum efficiency is qualitatively illustrated in FIG. 5.

Figure 8A:
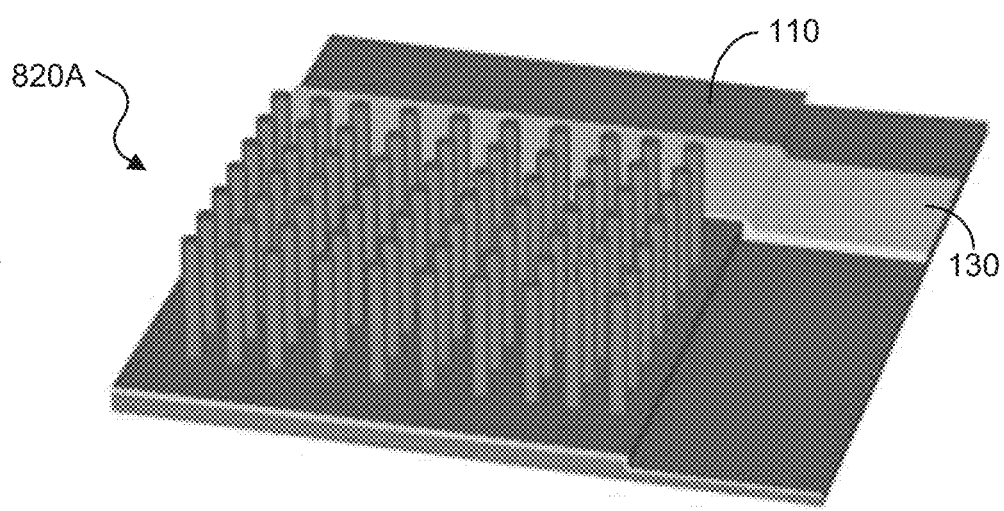
FIGS. 8A-8C show schematics of exemplary configurations of the device structure.
Figure 8B:
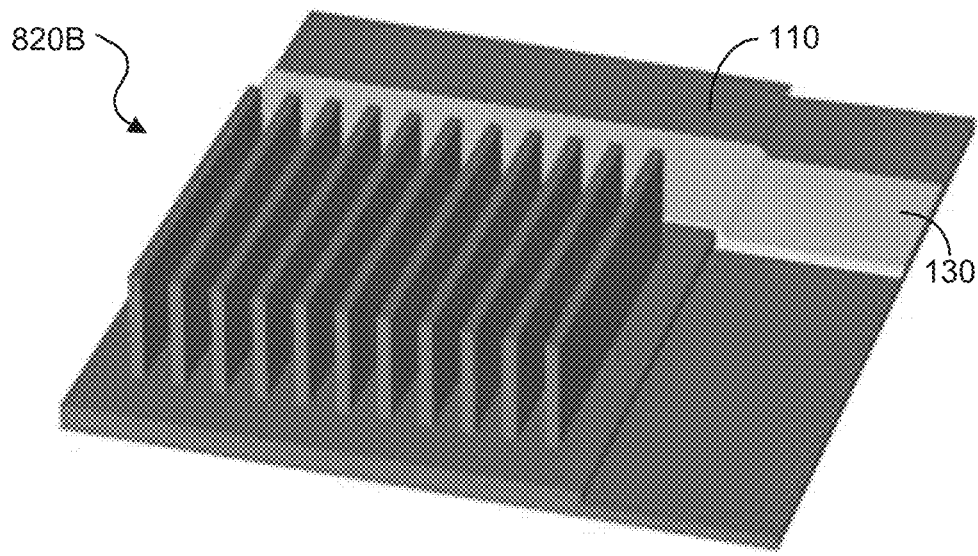
Figure 8C:
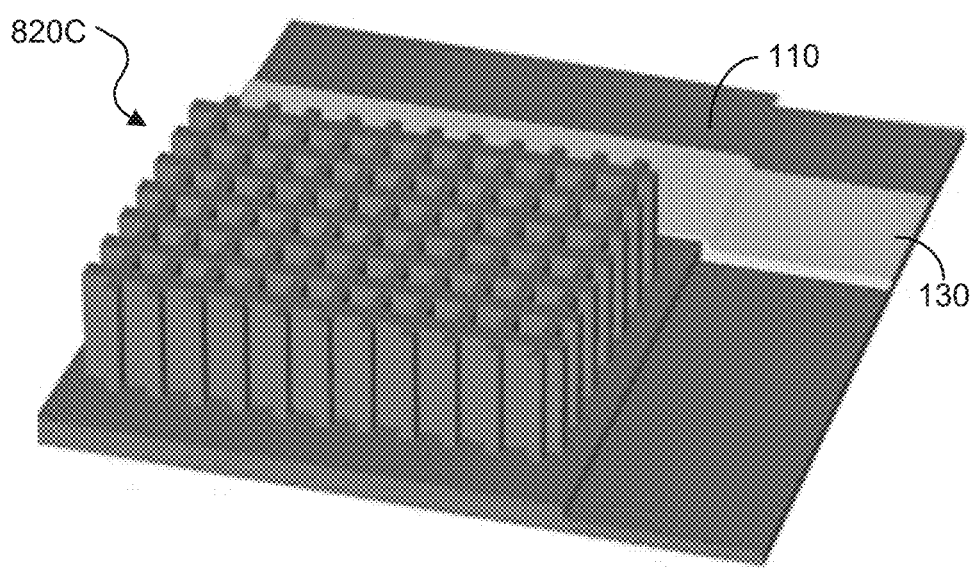

FIGS. 8A-8C show schematics of exemplary configurations of the disclosed device structure. In some exemplary embodiments, the optical-to-electrical energy conversion devices can be structured to include, but are not limited to, an array of nanoscale wires 820A shaped in a substantially cylindrical or conical geometry (e.g., 'nanowires'), as shown in FIG. 8A. In some exemplary embodiments, the optical-to-electrical energy conversion devices can be structured to include a linear array of nanoscale lines, ridges, or walls 820B having a substantially linear rectangular geometry (e.g., 'nanowalls'), as shown in FIG. 8B. In some exemplary embodiments, the optical-to-electrical energy conversion devices can be structured to include a crisscross of the nanowalls 820C, e.g., substantially perpendicular crisscrosses, similar to a waffle- or chessboard-like pattern (e.g., 'nanowaffles'), as shown in FIG. 8C. In all these exemplary structures, the cross section of the device has a co-doped, heavily compensated p/n junction similar to FIG. 1. Also, the nanoscale dimensions of the exemplary geometries include the diameters or widths of the multilayered nanostructures, while the height of such nanostructures protruding from the substrate can be configured in nanoscale dimensions, microscale dimensions, or greater.

In another aspect, devices, systems, and methods are described for optical to electrical signal conversion with high efficiency and low noise based on a cascaded exciton ionization (CEI) carrier multiplication mechanism. Exemplary CEI devices and methods can be implemented in a variety of applications including photovoltaics, communications, and imaging, among others.

Mechanisms of carrier multiplication can be used to increase the efficiency of optical to electrical signal and energy conversion, e.g., which can be implemented in applications including photovoltaics, communications, and imaging, among others. In some examples, multiple exciton generation (MEG) techniques have been used to create multiple carriers in low-dimensional semiconductors for photovoltaics. In some instances MEG can involve issues such as Auger recombination, material degradation, photocharing, and carrier trapping that limits its efficiency. For example, for optical detection, avalanche multiplication has been the primary mechanism for signal amplification for decades, but avalanche gain has its associated problems of excess noise, high operating voltage, and material dependence.

The disclosed techniques, systems, and devices include an engineered carrier multiplication mechanism, which is referred to as cascaded exciton ionization (CEI), e.g., using heavily compensated p+/n+ core-shell silicon nanowires. The disclosed CEI technology can be used to achieve high efficiency optoelectronic applications. For example, in some exemplary implementations described herein, due to the continuous excitation and ionization of donor-acceptor pair excitons initiated by photon absorption, the quantum efficiency is found to be substantially greater than 100% even under zero bias voltage.

The efficient conversion of light into electrical energy constitutes a key process in various optoelectronic applications such as communications, imaging, photovoltaics, and sensing. Using photovoltaics as an example, a prevailing idea of using excitonic effects to enhance efficiency is through multiple exciton generation (MEG). However, the strong competition of phonon scattering and Auger recombination has severely limited the multi-exciton generation efficiency, causing difficulties in realization of the concept in solar cells. Above all, for example, the MEG process may only occur to photons with energies at least twice the bandgap of the semiconductor material being used. For Si with a bandgap energy of 1.1 eV, photons with energy less than 2 eV cannot utilize the MEG effect to produce more than one e-h pair from absorption of a single photon. For optical detection, on the other hand, an internal gain mechanism, avalanche multiplication, can be been used in nanostructures to amplify the optical and exciton signals; however, the avalanche process requires high reverse bias and is unsuitable for photovoltaics and many low power applications.

Described herein are systems, devices, and techniques that apply an engineered physical mechanism, cascaded exciton ionization (CEI), to amplify the photoresponse of core-shell semiconductor nanoscale structures (e.g., silicon nanowires) without the constraint of the MEG or avalanche mechanism. An exemplary salient feature of the disclosed CEI technology is that, unlike avalanche multiplication, the CEI process can take place at low or even zero bias. As a result, the CEI process can be used for detection of optical signals and energy conversion such as photovoltaics, or even optical cooling (e.g., to remove heat from the area under illumination). In some implementations, for example, the disclosed CEI process can be implemented using a nanoscale device having a heavily-doped, partially compensated p-n junction in which the p-region contains a substantial amount of donors and the n-region contains a substantial amount of acceptors. Exemplary implementations of the disclosed CEI technology are described herein for applications in a core-shell Si nanowire structure. For example, partially-compensated p+/n+ core-shell junctions in the radial direction of the nanowires are created using a solid state diffusion process. For example, characterized are the nanowire internal gain resulted from the CEI by photocurrent measurements in the visible spectrum under zero bias. The exemplary results show that the quantum efficiency, in the short-circuit configuration, can be significantly greater than unity for photons of energy lower than 2 $E_g$ (e.g., 635 nm wavelength) at room temperature.

Figure 9A:
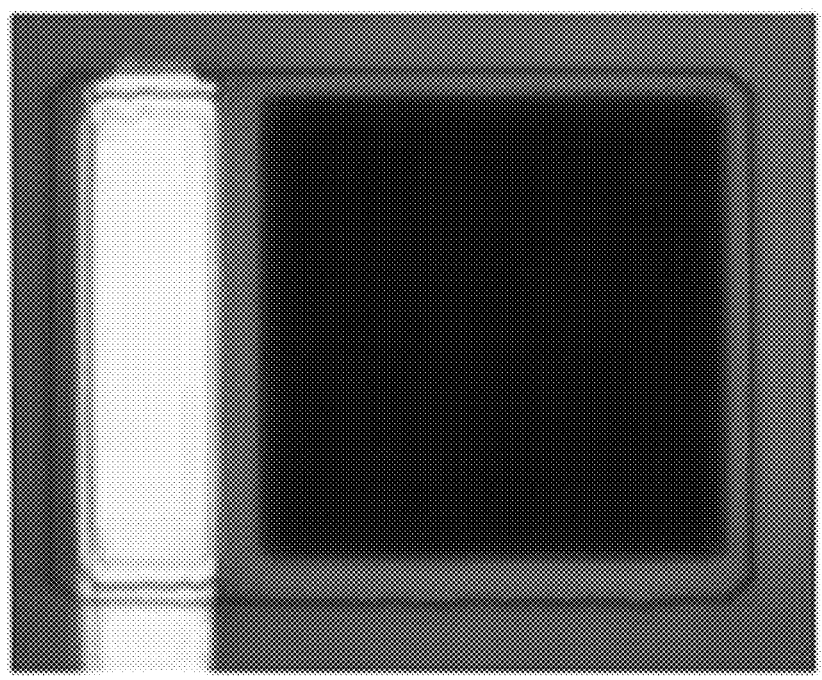
FIGS. 9A and 9B show images illustrating an exemplary nanowire based optical-to-electrical energy conversion device of the disclosed technology.
Figure 9B:
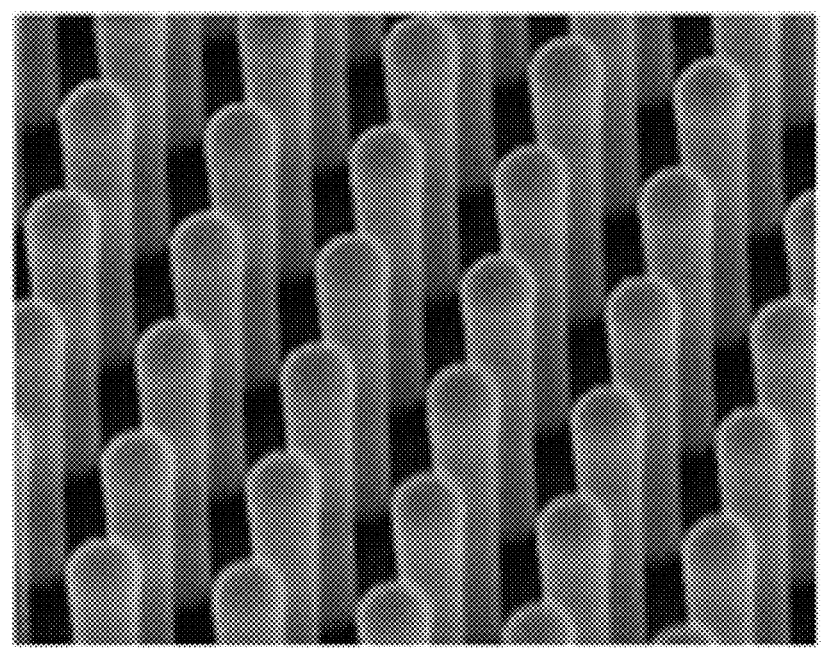
Figure 13A:
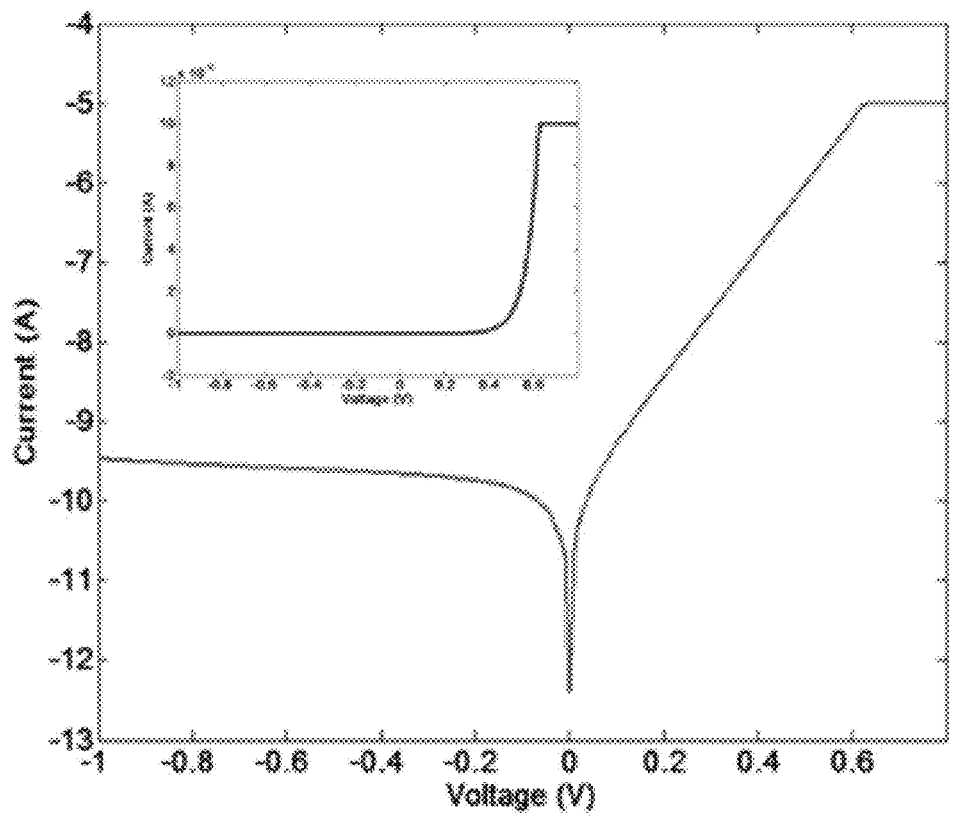
FIGS. 13A-13C shows exemplary data plots of electrical characteristics of the exemplary nanowire device.

FIG. 9A shows an exemplary bright-field optical microscope image of an exemplary device of the disclosed technology containing an array of 30×30 vertical silicon nanowires with 1 μm pitch, fabricated on a 35 μm×46 μm mesa. In this exemplary implementation, the nanowires are configured to have a radius of 340 nm and are 2.5 μm long. The nanowire array appears to be dark under microscope light as a result of the well-known photon trapping effect, which can also be confirmed by the reflection spectra measurements. A zoomed-in view of the SEM of the exemplary nanowire array device is also shown in FIG. 9B. The devices show typical p-n junction current-voltage characteristics with reverse bias current less than 0.5 nA at 1 V (as shown in FIG. 13A).

For example, the exemplary device shown in FIGS. 9A and 9B under illumination can be connected in a short-circuit configuration (at zero bias). Due to the co-existence of high concentrations of donors and acceptors in both sides of the radial $p^+/n^+$ junction of the silicon nanowires, a large number of donor-acceptor pairs ($D^+A^-P$) are present, providing the source for donor-acceptor pair exciton (DAP) formation. To elucidate the operating principle, it can be assumed that a photon with energy greater than the silicon bandgap is absorbed in the p-core and creates a primary electron-hole pair.

Figure 10A:
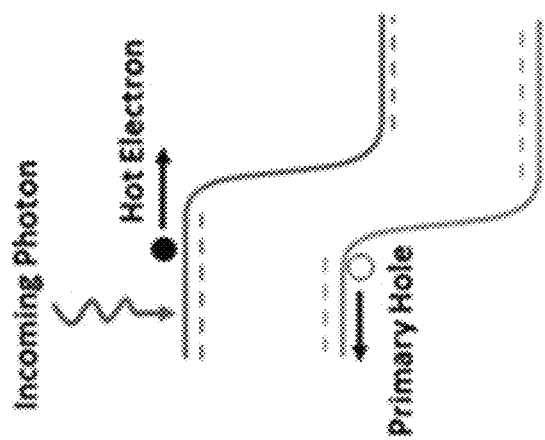
FIGS. 10A-10F show diagrams illustrating the operating principle of the exemplary optical-to-electrical energy conversion device of FIGS. 9A and 9B.
Figure 10B:
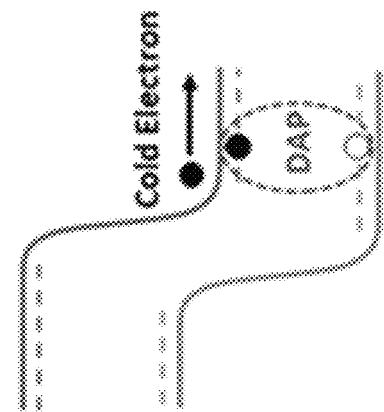
Figure 10C:
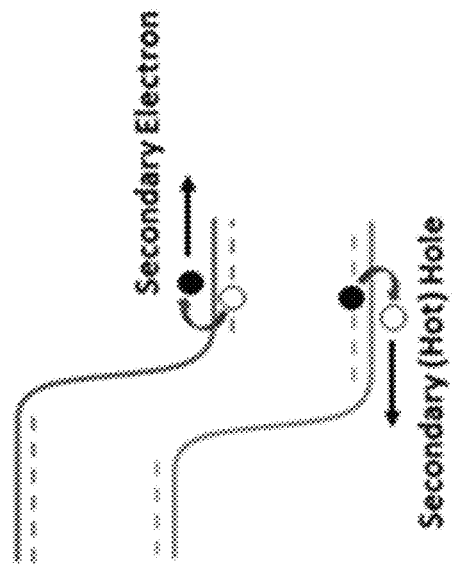
Figure 10F:
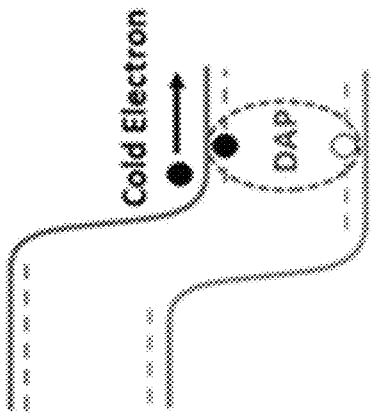
Figure 10E:
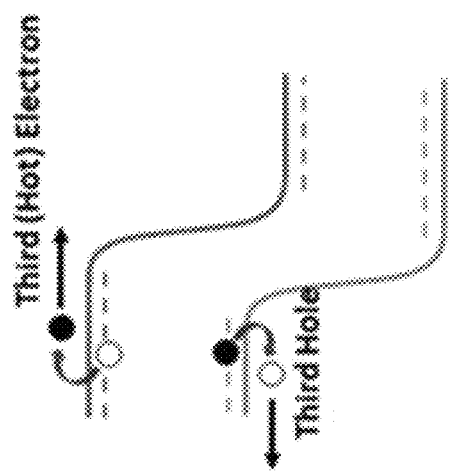
Figure 10D:
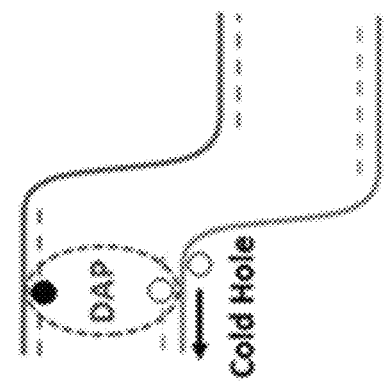

FIGS. 10A-10F show diagrams illustrating the exemplary operating principle of the exemplary nanowire device of the disclosed technology. FIG. 10A shows an exemplary diagram depicting primary electron-hole pair generation by photon absorption. The primary electron gains a high kinetic energy after crossing the potential cliff. FIG. 10B shows an exemplary diagram depicting the donor-acceptor pair exciton (DAP) formation by the hot electron which loses its energy after exciton excitation. FIG. 1 OC shows an exemplary diagram depicting the ionization of the donor-acceptor pair exciton (DAP) to create the secondary electron-hole pair. FIG. 10D shows an exemplary diagram depicting the DAP formation in the p-core by the secondary hot hole. FIG. 10E shows an exemplary diagram depicting the creation of the third generation of electron-hole pair by exciton ionization. FIG. 1 OF shows an exemplary diagram depicting the third-generation electron gains high kinetic energy to excite another DAP in the n-shell.

The primary hole leaves the device via the p-contact and the primary electron moves toward the n-shell (FIG. 10A). For a heavily doped p/n junction, the built-in potential is close to the bandgap energy and the depletion region is very thin (e.g., L<20 nm for a $10^{19}$ cm$^{-3}$/$10^{19}$ cm$^{-3}$ p/n junction). As a result, for example, the photogenerated primary electron is accelerated within a short distance by the built-in potential to become a hot electron entering the n-shell. In a conventional p/n junction, the hot electron loses its energy and momentum via phonon emission or electron-electron scattering. However, in a heavily compensated p/n junction, the hot electron has a high probability to excite a donor-acceptor pair ($D^+A^-P$) into a donor-acceptor pair exciton (DAP), as illustrated schematically in FIG. 10B, and in FIGS. 11A and 11B for greater details. The energy required to excite a DAP exciton is given by $E=E_g-(E_a+E_d)+|E_b|$, where, for example, $E_a$ (0.044 eV) and $E_d$ (0.046 eV) are the impurity ionization energies for acceptors (boron) and donors (phosphorous), and $E_b$ is the binding energy of the exciton determined by the Coulomb interaction between the donor and acceptor ions. A simple model gives $E_b \sim e^2/4\pi\varepsilon R$, where e is the free electron charge, ε is the dielectric constant of the material, and R is the exciton radius. For heavily compensated Si, for example, $E_b$ is on the order of 0.01 eV, thus yielding the required DAP excitation energy of around 1 eV from the above relation. Therefore, the hot electron possesses enough kinetic energy to excite a DAP exciton in the n-shell of the nanowire and this process can be expressed as:

$$D^+A^-P_{donor-acceptor\ pair}+e_{Hot} \rightarrow DAP_{exciton}+e_{Cold} \qquad (N1)$$

Following the exemplary process (N1), there exists two possible paths that the DAP exciton may take: (a) exciton annihilation by returning to the $D^+A^-P$ state via radiative or non-radiative process:

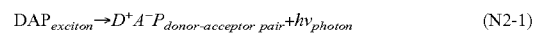
$$DAP_{exciton} \rightarrow D^+A^-P_{donor-acceptor\ pair}+h\nu_{photon} \qquad (N2-1)$$

$$DAP_{exciton}+e_{Cold} \rightarrow D^+A^-P_{donor-acceptor\ pair}+e_{Hot} \qquad (N2-2)$$

or (b) thermal ionization to produce a free electron-hole pair:

$$DAP_{exciton}+E_{Phonon} \rightarrow e+h \qquad (N3)$$

Exemplary implementations of the disclosed technology show that the DAP exciton annihilation via photon emission, process (N2-1), occurs at very low temperatures; and process (N2-2) is relatively unlikely to happen unless for very low bandgap semiconductors having large Auger recombination coefficients. Thus, for silicon nanowires at room temperature, for example, the thermal ionization of DAP exciton, process (N3), is the predominant process, which is illustrated in FIGS. 11A-11C.

Figure 11A:
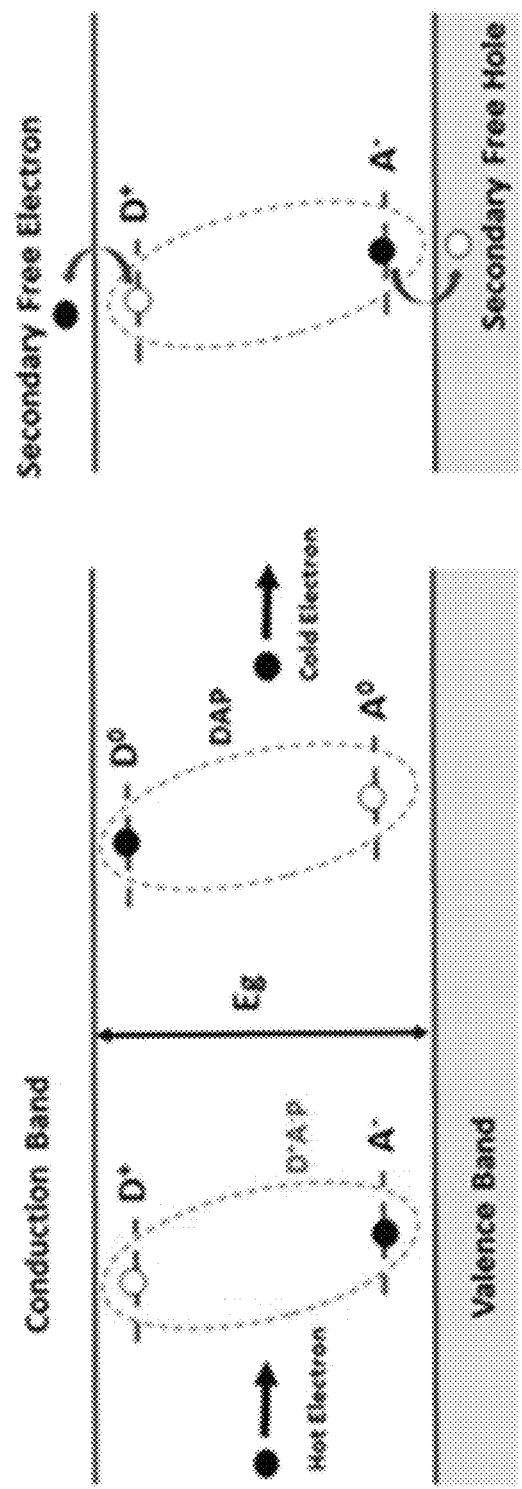
FIGS. 11A-11C show diagrams showing exciton formation and secondary e-h pair generation using the disclosed technology.

FIG. 11A shows an exemplary diagram showing exciton formation and thermal ionization initiated by a hot electron.

Figure 11B:
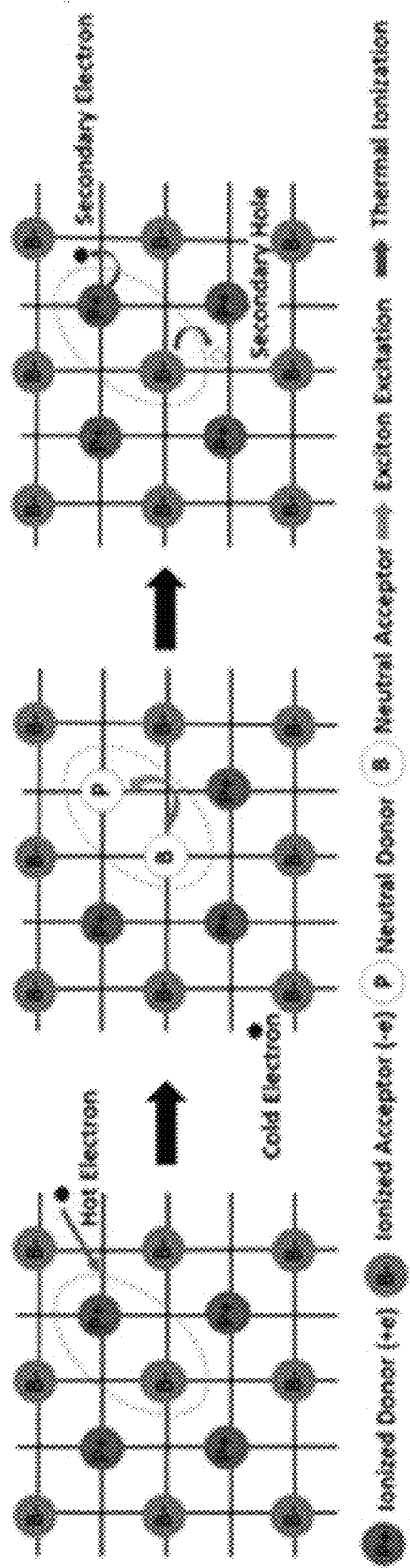
Figure 11C:
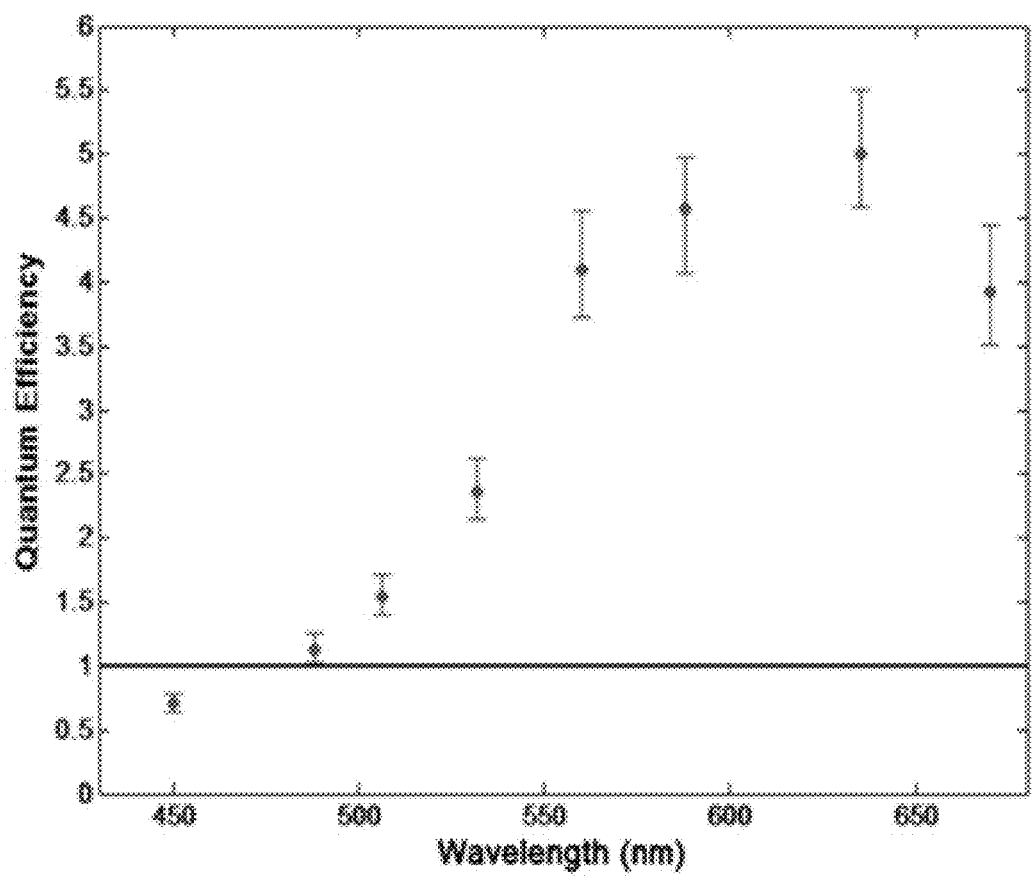

FIG. 11B shows an exemplary diagram showing donor-acceptor pair exciton formation and thermal ionization illustrated in a crystal lattice. FIG. 11C shows an exemplary diagram showing quantum efficiency of nanowires obtained from direct measurements over wavelengths from 450 nm to 670 nm. The exemplary error bars show uncertainties of measured optical power impinging upon the nanowires.

The thermal ionization of DAP exciton creates the secondary free electron-hole pair by acquiring thermal energy from the crystal lattice (FIG. 10C) via phonons. The secondary electron in the conduction band leaves the device quickly via the n-contact. On the other hand, the secondary hole in the valence band acts in a similar manner to the primary electron: e.g., gaining high kinetic energy to generate a new DAP exciton by excitation of another $D^+A^-P$ (FIG. 10D) in the p-core. The disclosed exciton can again be thermally ionized to produce the third generation of free electron-hole pair and such process can take place in cascade between the p-core and the n-shell as illustrated in FIGS. 10A-10F. Similarly, carrier multiplication can also be initiated by a photon absorbed in the n-shell of the nanowire so that the primary hole becomes the particle that initiates the cascaded exciton generation and ionization process.

As illustrated in FIGS. 10A-10F, the exemplary device operating principle suggests that one can achieve quantum efficiency that is significantly greater than unity in the short-circuit configuration. The quantum efficiency (e.g., the total number of electron-hole pairs generated from a single photon) can be expressed analytically as:

$$\langle \eta \rangle = [F_c(1 + x_0) + F_s(1 + y_0)] + \left[ \frac{F_c x_o y(1 + x) + F_s y_o x(1 + y)}{1 - xy} \right] \quad (N4)$$

where $F_c$ and $F_s$ are the probability for the photon to be absorbed in the p-core and n-shell, and $x_0$ ($y_0$) is the probability for the primary electron (hole) to excite the secondary e-h pair. On the other hand, $x$ ($y$) represents the probability for the secondary and all future generations of electrons (holes) to excite e-h pairs ($0 \leq x, y \leq 1$). For example, a distinction can be made for the probability of the primary electron (hole) and the probability of future generations of electrons (holes) because the primary electrons (holes) are produced by direct photon absorption, e.g., thus attaining different characteristics than all other electrons (holes) in terms of their energies and positions. The most apparent difference is that the values of $x_0$ and $y_0$ are expected to be wavelength dependent whereas the values of $x$ and $y$ are supposed to be wavelength independent. The wavelength dependence of $x_0$ and $y_0$ could also be due to the location where the photon is absorbed, in the core or in the shell. For the e-h pair generated in the shell, the value of probability may also depend on its distance from the surface of the exemplary nanostructure (e.g., such as the nanowire), being affected by the surface recombination via surface states.

Figure 13B:
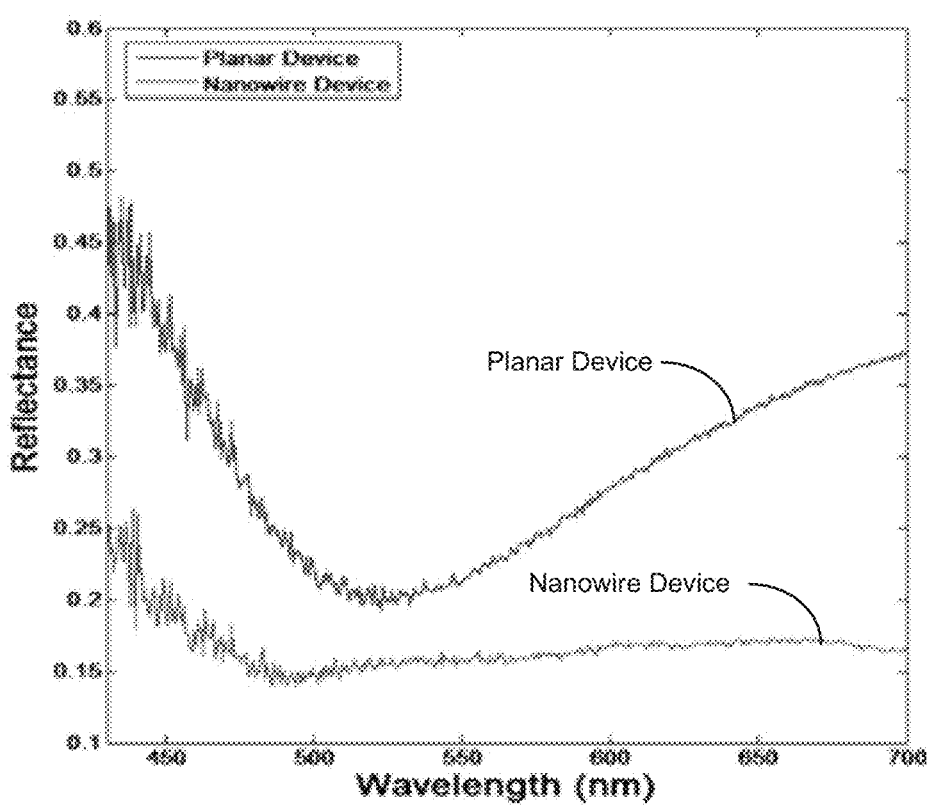
Figure 13C:
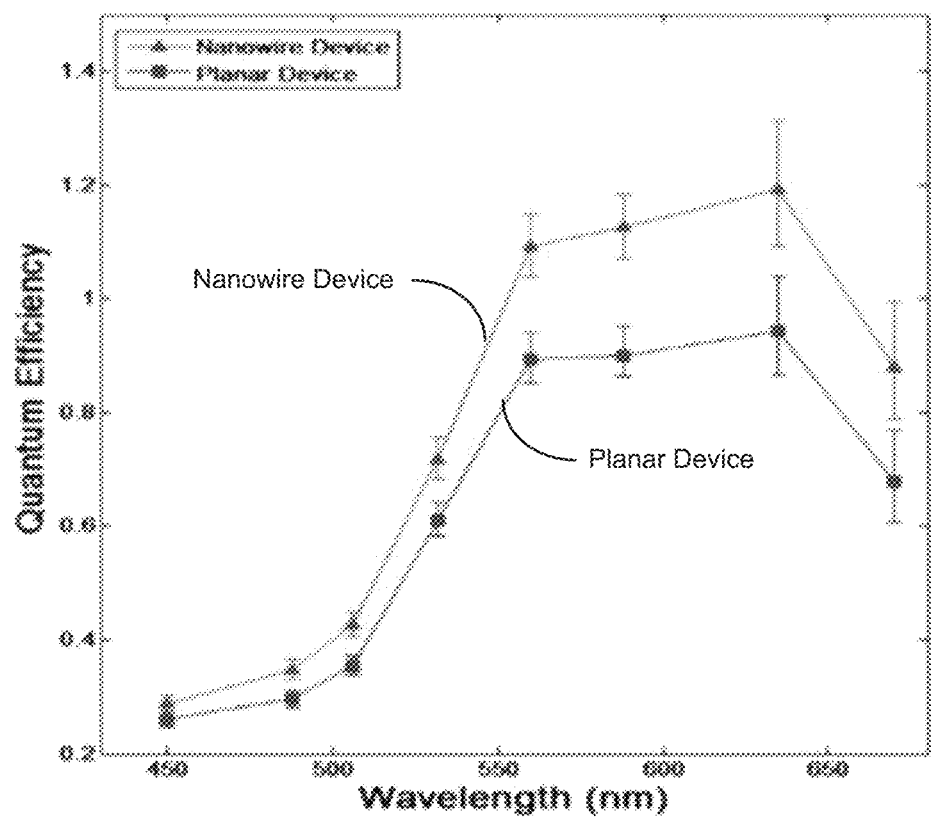

In the exemplary implementations of the disclosed CEI technology, for example, an optical monochromator setup was used to measure the effect of cascaded exciton ionization in the heavily compensated $p^+/n^+$ core-shell nanowire. Optical excitations above the bandgap of silicon (e.g., 450 nm-670 nm) were used to measure the photoresponse of an exemplary device in a short-circuit configuration. The exemplary device was measured at zero bias to eliminate the possibility for other carrier amplification mechanisms and to remove measurement errors due to any leakage current. The amount of light at each wavelength impinging upon the nanowires was corrected from reflection of the non-polarized, normal incident light (FIG. 13B). Both an exemplary arrayed nanowire device of the disclosed technology and a planar device (without nanowires) were characterized in the same manner (FIG. 13C). Following the exemplary steps described later this patent document, the quantum efficiency of nanowires was obtained, as plotted in FIG. 11C based on the geometry differences between the nanowire and the planar device. For example, the quantum efficiency (QE) was found to be greater than unity for wavelengths longer than 488 nm. However, optical diffraction and evanescent coupling effects can trap photons within the nanowire array. Therefore, for example, the QE values presented in FIG. 11C include contributions from both the photon trapping effect and the CEI effect.

Figure 12A:
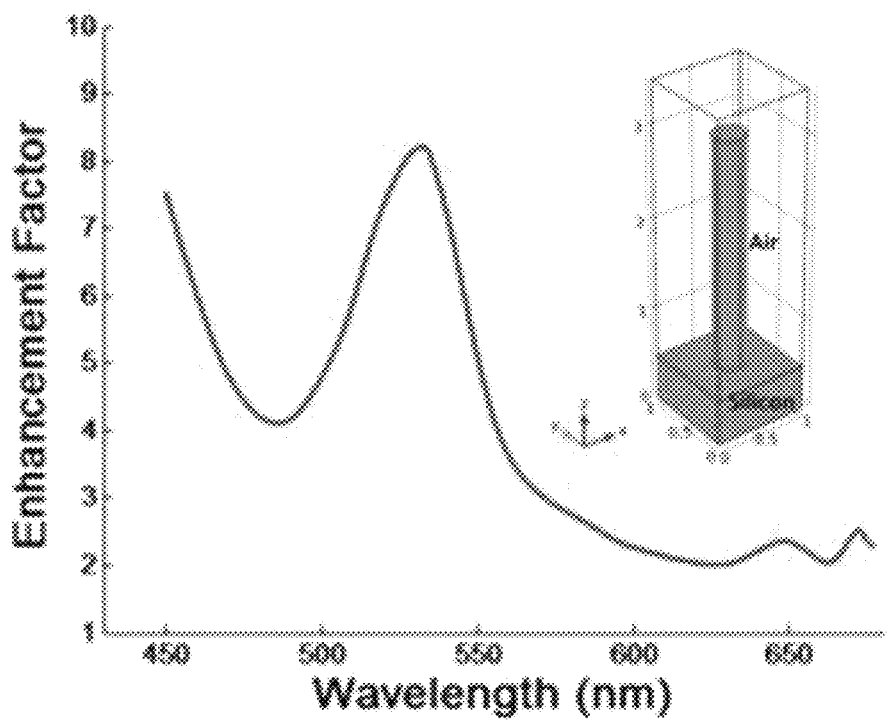
FIGS. 12A-12D show exemplary plots and diagrams of the characteristics of the exemplary nanowires of the disclosed technology.
Figure 12B:
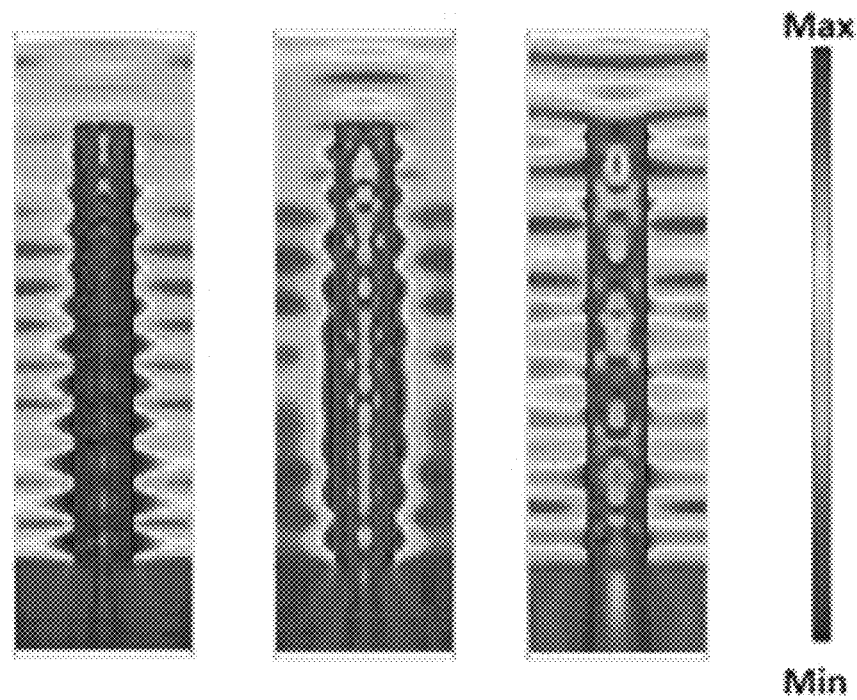
Figure 12C:
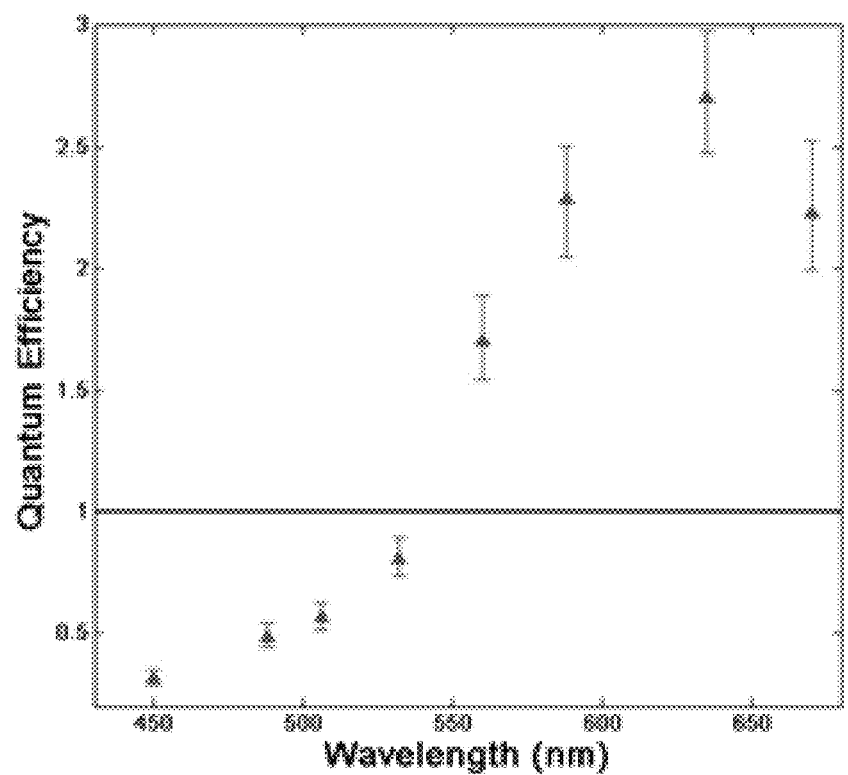
Figure 12D:
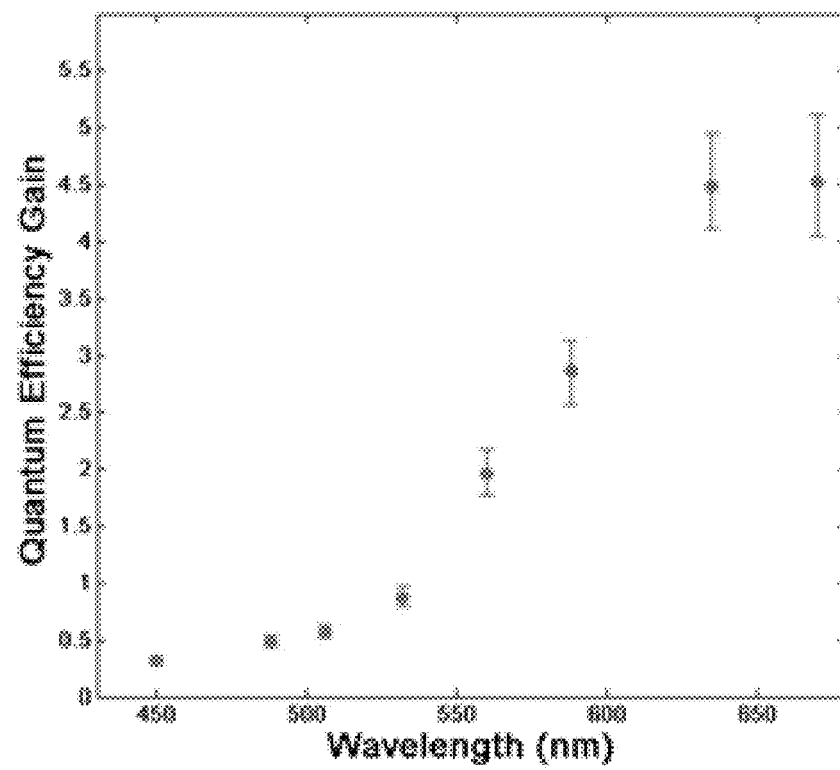

To obtain the contribution from the photon trapping effect, for example, exemplary implementations were performed using three-dimensional finite element method (FEM) simulations to study the corresponding electromagnetic field distribution within the nanowire array, as shown in FIGS. 12A-12B. FIG. 12A shows a data plot of the absorption enhancement factor over the physical fill factor due to the photon trapping effect in the main panel and, in the inset, an exemplary diagram of a vertical nanowire structure used for finite element method (FEM) simulations. FIG. 12B shows an exemplary diagram of the major transverse electric field ($|E_y|$) distribution in the y-z plane for the nanowire array at three representative wavelengths—450 nm, 532 nm, and 635 nm. FIG. 12C shows an exemplary data plot of the quantum efficiency of nanowires originated from the cascaded exciton ionization effect alone after removing the contribution of the photon trapping effect. FIG. 12D shows an exemplary data plot of the cascaded exciton ionization (CEI) gain in core-shell silicon nanowires.

For example, in the exemplary implementations using the three-dimensional FEM simulations, an infinite array of 340 nm diameter, 2.5 μm long silicon NWs was used in the simulations with a periodic boundary of 1 μm×1 μm square. For example, since the exemplary device was radially symmetric, linearly polarized light (polarized in the y-direction, $E_y$) was used and incident normal to the top surface of the exemplary device. Complex wavelength dependent refractive indices for Si were used for the nanowires and n=1 for air was used for the space between the nanowires, as illustrated in the inset of FIG. 12A. According to the exemplary simulations, both the power absorbed by the Si nanowires ($P_{NW}$) and the power absorbed by the bottom Si planar area between the nanowires ($P_{planar}$) was calculated. The enhancement factor E.F. due to the photon trapping effect is defined as E.F.=$P_{NW}/(P_{Total} \times$F.F.), where F.F. is the geometric fill factor being equal to $\pi \times (0.17)^2/1^2 = 0.0908$ for nanowires with a diameter of 340 nm in the square array with 1 μm pitch, and $P_{Total}$ (=$P_{NW}+P_{Planar}$) is the total absorbed optical power. Within the measured spectrum, two highest photon trapping enhancement factors were found at 450 nm and 532 nm, respectively (as shown in FIG. 12A).

The diagram of FIG. 12B presents the distribution of the major transverse electric field ($|E_y|$) in the y-z plane where most of the electric field resides at three representative wavelengths, e.g., 450 nm, 532 nm, and 635 nm. For example, the significance of the field distribution is elucidated later in this patent document when wavelength dependent quantum efficiency originated from the CEI effect is discussed. For example, the true contribution from the cascaded exciton ionization (CEI) effect to the quantum efficiency can be calculated according to the equation:

$$\eta_{NW} = (\eta_{NWM} - \eta_{PlanarM}) \times \frac{1}{F.F. \times E.F.} + \eta_{PlanarM} \qquad (N5)$$

where $\eta_{NW}$ is the true quantum efficiency of nanowires, $\eta_{PlanarM}$ is the measured quantum efficiency of the planar device, and $\eta_{NWM}$ is the measured quantum efficiency of the exemplary arrayed nanowire device (FIG. 13C). As defined previously, F.F. and E. F. are the geometric fill factor and the enhancement factor due to photon trapping effect. The product F.F.×E.F. can thus be considered as the "effective fill factor" of the nanowires. The calibrated values of $\eta_{NW}$ for different wavelengths are shown in FIG. 12C. Note that the quantum efficiency is over 100% for wavelengths longer than 560 nm with the highest QE to be around 270% at 635 nm. This is an exemplary demonstration of carrier multiplication due to the effect of the disclosed cascaded exciton ionization (CEI) technology for optoelectronic amplification that can occur at zero bias condition.

Further obtained, for example, was the cascaded exciton ionization gain, e.g., by taking the ratio of $\eta_{NW}$ of nanowires and the light absorption of silicon $\eta_{Int}$ ($\eta_{Int}=1-e^{-\alpha L}$, where $\alpha$ is the wavelength dependent absorption coefficient of silicon, and L is the thickness of silicon and equals to 2.5 um). The cascaded exciton ionization (CEI) gain is shown in FIG. 12D. The exemplary device shows the highest gain of around 4.5 and saturates at 635 nm.

For example, the reduced CEI gain at shorter wavelength may be attributed to the surface recombination effect. For example, at 450 nm, as shown in FIG. 12B, the electromagnetic field is concentrated at the air/nanowire interface so most photogenerated carriers are produced near the surface of nanowires, experiencing a high surface recombination rate via the surface states. This yields a low value of $y_0$ in Eq. (N4) and lowers the quantum efficiency. In contrast, for example, at 635 nm wavelength the photon energy is distributed more evenly with a significant fraction of light being in the core of nanowire. As a result, many carriers produced by 635 nm light are located in the core of the nanowire, being distant from the surface states and experiencing much less surface recombination effect than those carriers produced by 450 nm light. This can explain the different values of CEI gain at different wavelengths. For example, by understanding the role of surface recombination in CEI gain, one can conceive different device geometries and apply surface passivation techniques to raise the CEI gain at shorter wavelengths for optimal device performance.

As described in the exemplary embodiments and demonstrated in the exemplary implementations, the disclosed CEI techniques, systems, and devices including heavily compensated $p^+/n^+$ core-shell silicon nanostructures can be utilized to achieve >100% quantum efficiency. The donor-acceptor pairs in the compensated regions provide the sources for exciton formation. These excitons can be subsequently ionized by phonon scattering, producing free electron-hole pairs contributing to photocurrent. The disclosed CEI technology provides avenues to creating multiple electron-hole pairs from a single photon to enhance the efficiency of optical to electrical energy conversion. For example, the CEI effect can be applied to many other materials such as compound semiconductors and polymers besides silicon.

The exemplary implementations described herein included the following exemplary methods.

Exemplary Device Fabrication Methods

The exemplary devices shown in FIGS. 9A and 9B were fabricated on a boron-doped p+ silicon substrate (doping concentration $\sim 2 \times 10^{19}$ cm$^{-3}$). The nanowires were etched by inductively coupled plasma-reactive-ion etching (ICP-RIE) process with $C_4F_8$ and $SF_6$ gases having electron-beam lithographically patterned nickel disks as mask. After nanowire formation, the nickel mask was removed using Ni etchant. To prepare a source for n-dopant, phosphorous-containing spin-on-dopant (SOD) solution (Filmtronics, Inc.) was spun on a separate silicon wafer. After baking at 200° C. for 15 min, the SOD-coated wafer was placed about 1 mm above the wafer with nanowires in a rapid thermal annealing (RTA) furnace. The phosphorous diffusion process was performed inside the RTA furnace at 950° C. for about 40 seconds when phosphorous evaporated from the SOD layer and are diffused into the nanowires, converting $p^+$-Si near the nanowire surfaces into n-shells. At the same time, the phosphorous diffusion tail penetrated the $p^+$-core, thus forming a heavily compensated $p^+/n^+$ core/shell nanowires required for the cascaded exciton ionization process. To reduce the contact resistance of nanowires, another run of RTA annealing process was performed without the SOD-coated wafer. Mesas (~350 nm high) were etched to isolate nanowire arrays, followed by the deposition of a $SiO_2$ layer (~265 nm). Finally, a Ti/Au (50/200 nm) contact pad was deposited to form the top n-contact, and the p-contact shared by all the devices was formed on the back of the silicon substrate.

Exemplary Optical Measurements (e.g., at Room Temperature)

The exemplary silicon nanowire devices of the disclosed technology and planar devices were optically excited using a home-built optical monochromator with a 600 g/mm grating. A fiber bundled halogen lamp was used as the light source. The full width at half maximum (FWHM) of each specific wavelength was 10 nm, verified by the measurement using a spectrum analyzer (Ocean Optics HR-2000). After transmitting through a series of optical elements, the light (with a spot size larger than the size of the device) was perpendicularly directed to the top of the device. The power of the incoming light was measured with a calibrated power meter (Newport 1830-C). The light intensity profile and the total optical power impinging upon the sample were measured using a calibrated detector and an X-Y translational stage. The exemplary device was connected in a short-circuit configuration with no bias applied between the two contacts, and the photocurrent was measured using a semiconductor parameter analyzer (Agilent 4155-B). Finally, the quantum efficiency of each device was calculated taking into account reflections at the nanowire-air interface.

Exemplary Device Characterization and Reflection Spectroscopy Measurements

FIG. 13A shows, in the main panel, a data plot of the exemplary electrical characteristics (e.g., semilogarithmic plot) of the nanowire device in the absence of light illumination; and in the inset, a linear plot of the current-voltage characteristics. FIG. 13B shows an exemplary data plot of the reflection spectroscopy of both the nanowire and the planar devices. For example, as a function of incident light wavelength, the reflection of the nanowire device is always significantly smaller than that of the planar device, an indicative of the photon trapping effect. FIG. 13C shows a plot of the exemplary quantum efficiencies of the exemplary arrayed nanowire device and the exemplary planar device.

FIG. 13A shows the dark I-V characteristics of the nanowire device used in this exemplary characterization implementation. The exemplary device shows the rectifying behavior of typical p-n junctions.

Reflection spectroscopy has been utilized to determine the amount of light actually entering the device instead of being reflected or scattered. The exemplary nanowire device contains a square nanowire array (30×30) with a pitch of 1 µm. The exemplary nanowire array was situated on a 35 µm×46 µm silicon mesa. The incident light used for reflection spectrum measurement was focused onto the center of the nanowire array with a beam spot of around 10 µm in diameter. Also measured was the reflection spectrum of the planar device using the same experimental setup. The reflection spectra at different wavelengths are shown in FIG. 13B. The lower reflection from the nanowire device suggests the photon trapping effect occurs to the nanowire array. A spectra dip at around 525 nm is consistent with the calculated resonance in FIG. 12A.

Based on the data from the reflection measurements, the photoresponsivities of both the nanowire device and the planar device can be obtained since the accurate amount of light power that is absorbed can be found. FIG. 13C shows the wavelength dependent QE values for both the nanowire device and the planar device.

Since the exemplary nanowire device also contains planar area over the mesa, the net photoresponse includes the response from the nanowires and from the planar area. Further used is the following procedure to obtain the true nanowire photoresponse from the data in FIG. 13C. Defined is P as the total absorbed optical power, $R_{NW}$ as the responsivity of nanowires to find, $R_{PlanarM}$ as the measured responsivity of the planar device, and $R_{NWM}$ as the measured responsivity of the NW device that contains nanowires and planar areas. Other useful parameters include: F.F.: fill factor of nanowires and E.F.—enhancement factor at specific wavelengths due to the photon trapping effect. The following relations can thus be applied to extract the photoresponse of nanowires:

$$R_{NWM}P=R_{NW}P(\text{F.F.}\times\text{E.F})+R_{PlanarM}P[1-(\text{F.F.}\times\text{E.F})] \quad \text{(NS-1)}$$

The responsivity of nanowires can be expressed as:

$$R_{NW} = (R_{NWM} - R_{PlanarM}) \times \frac{1}{\text{F.F.} \times \text{E.F}} + R_{PlanarM} \quad \text{(NS-2)}$$

Using the relation $\eta_{NW}=hv/qR_{NW}$, the quantum efficiency of nanowires can be extracted and is shown in FIG. 12C.

Derivation of Quantum Efficiency from the Cascaded Exciton Ionization (Eq. (N4))

In the following, the analytical expression of the quantum efficiency due to the cascaded exciton ionization effect is derived.

Figure 14:
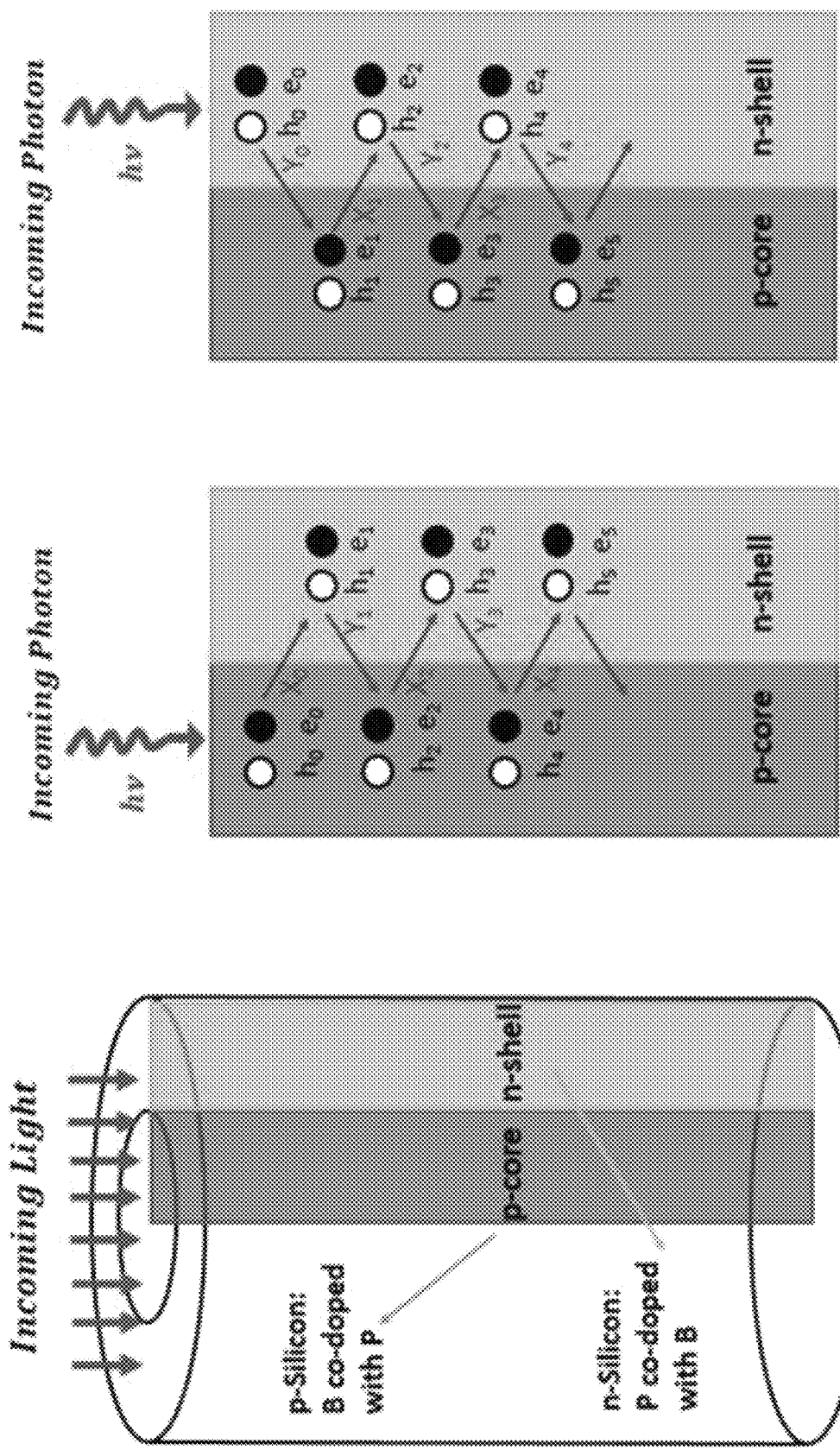
FIG. 14 shows an illustrative schematic of an exemplary carrier multiplication by cascaded exciton ionization process initiated from a single photon incident.

FIG. 14 shows an illustrative schematic of an exemplary carrier multiplication by cascaded exciton ionization process initiated from a single photon incident either on the p-core or on the n-shell. The schematic of FIG. 14 shows how the photogenerated primary electron-hole pair initiates the cascaded ionization process. In FIG. 14, each electron and hole is labelled according to their history of generation. For example, "0" is used to denote the primary electron and hole generated by photon absorption. The probability that the $i_{th}$ hot electron/hole can create another free electron-hole pair is defined as $X_i/Y_i$.

The value of $X_i/Y_i$ is between 0 and 1 and obey the following relations:

$$X_i=x(i=1,2,3,\ldots) \quad \text{(NS-3)}$$

$$Y_i=y(i=1,2,3,\ldots) \quad \text{(NS-4)}$$

On the other hand, $X_0/Y_0$ represents the probability that the primary free electron/hole excites the secondary free e-h pair. Since the primary free electron/hole is generated from photon absorption, different from the future generations of free electrons/holes, their values may depend on the incoming photon energy, the position of light absorption, etc. Thus, the total number of electron-hole pairs produced from the absorption of a photon in the p-core can be expressed as:

$$\eta_{core}=F_c[1+X_o+X_oY_1+X_oY_1X_2+X_oY_1X_2Y_3+X_oY_1X_2Y_3X_4+\ldots] \quad \text{(NS-5)}$$

where $F_c$ is the probability of the incoming photon absorbed in the p-core. Using the relations in (NS-3) and (NS-4), one can simplify (NS-5) into:

$$\eta_{core} = F_c\left[(1 + x_0) + \frac{x_o y(1 + x)}{1 - xy}\right] \quad \text{(NS-6)}$$

Similarly, the total number of e-h pairs due to the absorption of a single photon in the n-shell can be expressed as:

$$\eta_{shell}=F_s[1+Y_o+Y_oX_1+Y_oX_1Y_2+Y_oX_1Y_2X_3+Y_oX_1Y_2X_3Y_4+\ldots] \quad \text{(NS-7)}$$

where $F_s$ is the probability of the photon absorbed in the n-shell. Again, using the relations in (NS-3) and (NS-4), obtained is:

$$\eta_{shell} = F_s\left[(1 + y_0) + \frac{y_o x(1 + y)}{1 - xy}\right] \quad \text{(NS-8)}$$

Finally, the total quantum efficiency can be written as:

$$\eta = \eta_{core} + \eta_{shell}$$
$$= [F_c(1 + x_0) + F_s(1 + y_0)] + \left[\frac{F_c x_o y(1 + x) + F_s y_o x(1 + y)}{1 - xy}\right] \quad \text{(NS-9)}$$

Figure 15A:
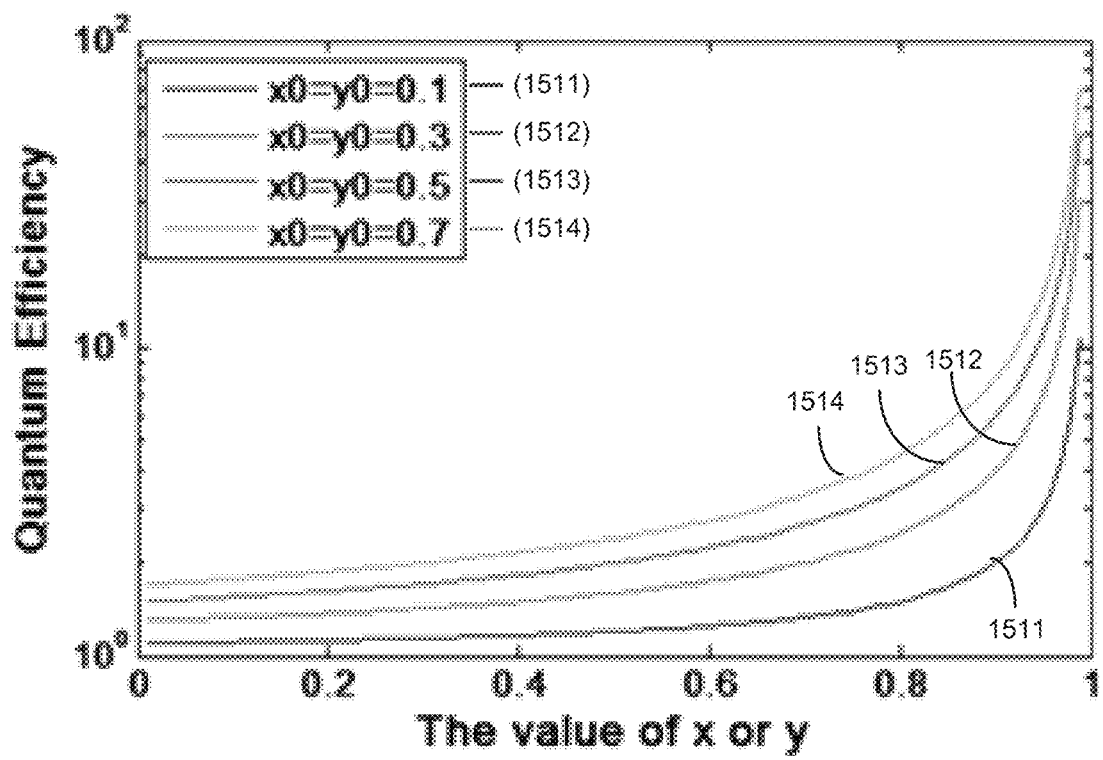
FIGS. 15A and 15B show data plots of the exemplary quantum efficiency as a function of the probability of the DAP excitation and ionization by hot electron or hole.
Figure 15B:
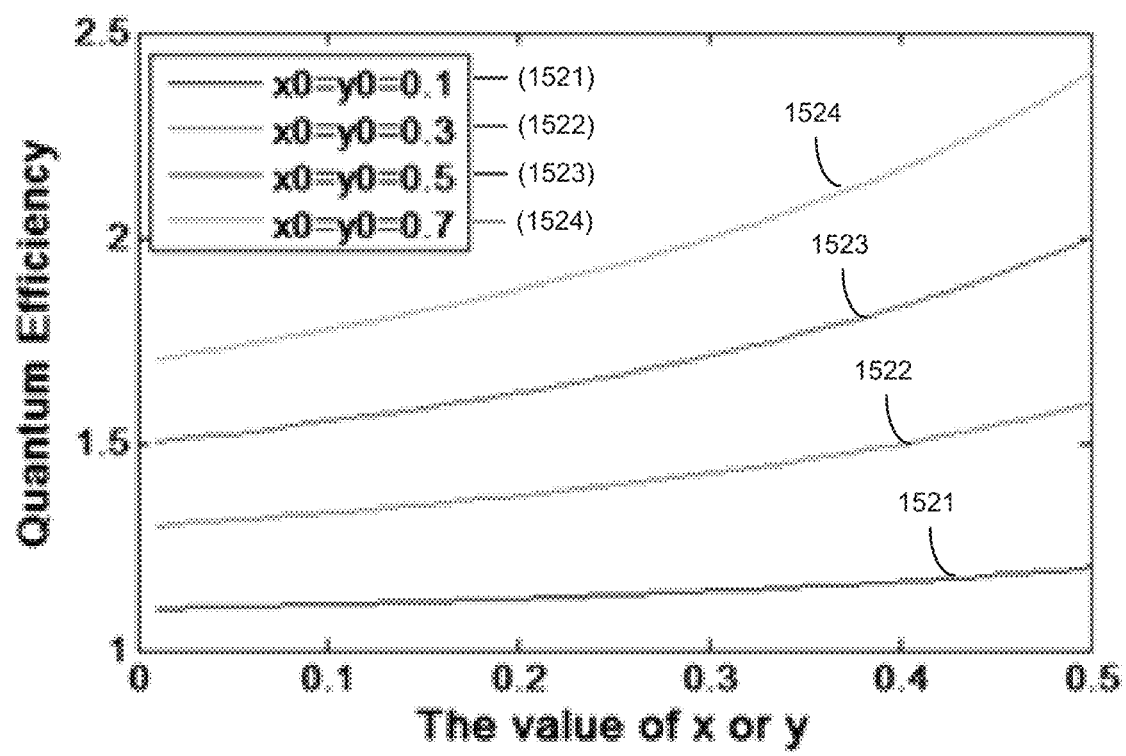

Assuming $F_c=F_s=0.5$ (equal probability for light to be absorbed in the core and shell area), plotted is the CEI quantum efficiency in FIGS. 15A and 15B as a function of x and y using $x_o$ and $y_o$ as parameters. For simplicity, further assumed is x=y and $x_o=y_o$ in the calculations.

FIGS. 15A and 15B show data plots of the exemplary quantum efficiency as a function of the probability of the DAP excitation and ionization by hot electron or hole. The data plot of FIG. 15A shows a semi-log scale plot with the value of x/y varying from 0 to 1, when $x_0=y_0=0.1$ (waveform 1511), $x_0=y_0=0.3$ (waveform 1512), $x_0=y_0=0.5$ (waveform 1513), and $x_0=y_0=0.7$ (waveform 1514). The data plot of FIG. 15B shows a linear scale plot with the value of x/y varying from 0 to 0.5, when $x_0=y_0=0.1$ (waveform 1521), $x_0=y_0=0.3$ (waveform 1522), $x_0=y_0=0.5$ (waveform 1523), and $x_0=y_0=0.7$ (waveform 1524).

The disclosed devices, systems, and techniques can be implemented for signal amplification using the new CEI physical mechanism. The CEI effect of the disclosed technology occurs at much lower applied voltage than avalanche process. Also, quite importantly, it produces extremely low excess noise. Excess noise is the limiting factor for the achievable sensitivity for any signal detection systems, and is the noise associated with the gain. An exemplary analytical model is elucidated herein to calculate the excess noise resulted from an exemplary CEI effect, and the exemplary result is also verified by the Monte Carlo simulations.

Figure 16A:
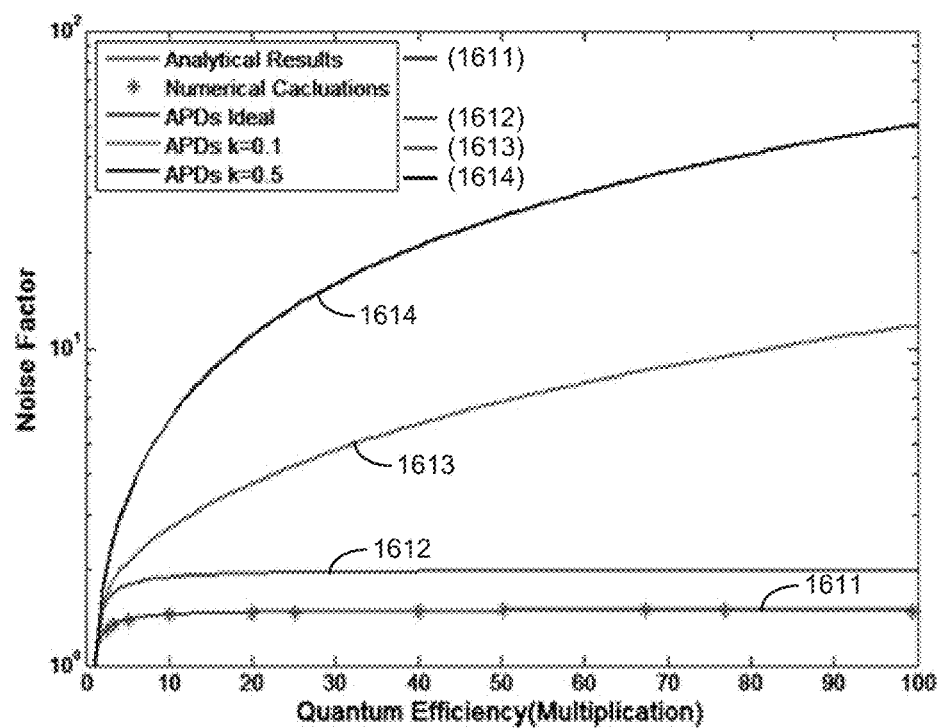
FIGS. 16A and 16B show exemplary noise analysis plots of an exemplary nanowire cascaded exciton ionization device.
Figure 16B:
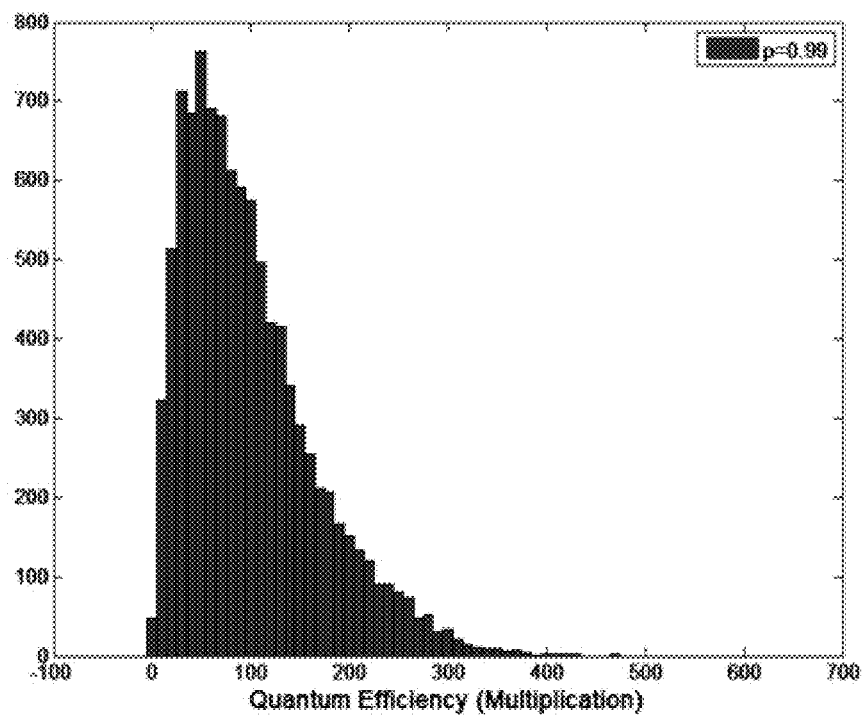

FIGS. 16A and 16B show exemplary noise analysis plots of an exemplary nanowire cascaded exciton ionization device. The plot of FIG. 16A shows the excess noise factor as a function of the quantum efficiency (multiplication) of the exemplary nanowire CEI device calculated by the exemplary analytical model (red, plot 1611) and Monte Carlo simulation (star '*' symbols). The excess noise factor vs. avalanche multiplication with different hole/electron ionization ratios is also plotted in FIG. 16A. For example, the green curve 1612 (k=0) depicts the characteristics of "ideal" avalanche detector, which can be referred to the 'quantum limit" of avalanche multiplication. For example, the pink curve 1613 (k=0.1) and the black curve 1614 (k=0.5) depict the characteristics of avalanche detectors with different ratios of ionization coefficients.

FIG. 16A shows the dependence of the excess noise factor on the multiplication factor produced by the CEI effect and avalanche multiplication with different ratios of ionization coefficients (e.g., k=$\alpha_p/\alpha_n$=0, 0.1 and 0.5). For example, as shown in the data plot, the excess noise factor from the CEI effect is well below that of the avalanche mechanism, and is even lower than the quantum limit of "ideal" avalanche detectors (i.e., k=0). The exemplary results suggest that photoreceivers based on the CEI effect can potentially achieve higher sensitivity than conventional avalanche photodetector (APD) receivers. The exemplary nanowire CEI device generates an excess noise factor lower than 2, the theoretical limit of an "ideal APD" that does not in fact exist in a real world.

FIG. 16B shows an exemplary Monte Carlo simulated histogram of CEI gain distribution under the mean multiplication value of 100. For example, exemplary Monte Carlo simulations were carried out to verify the analytical model and to produce histograms of CEI gain distribution. As shown in the exemplary plot of FIG. 16B, the Monte Carlo simulated distribution of CEI multiplication assuming the mean value of the CEI gain was 100. The exemplary results show a much tighter gain distribution than avalanche multiplication.

Any amplification process will introduce excess noise and there is no exception for the cascaded exciton ionization effect. In the following, an analytical model of the excess noise for the CEI device is developed. Using Eq. (NS-5) as an example, the quantum efficiency in the core region can be re-written as:

$$\eta_{core} = 1 + X_o + X_o Y_1 + X_o Y_1 X_2 + X_o Y_1 X_2 Y_3 + X_o Y_1 X_2 Y_3 X_4 + \ldots$$

$$= (1 + X_0) + X_0 Y_1 \left[ \sum_{i=1} (1 + X_{2i}) \prod_{k=1}^{i-1} X_{2k} Y_{(2k+1)} \right]$$

(NS-10)

Note that Eq. (NS-10) is a random variable. To calculate the excess noise, both the mean and the variation of the random variable need to be calculated. The mean of $\eta_{core}$ can be written as:

$$\langle \eta_{core} \rangle = 1 + x_0 + (1 + x) + (1 + x)xy + (1 + x)x^2 y^2 + \ldots \quad \text{(NS-11)}$$

$$= 1 + x_0 + \frac{(1+x)}{1-xy}$$

For example, using the relations: $\langle (1+X_o)X_0 Y_1 \rangle \geq 2x_o y$ and $\langle (1+X_o)^2 \rangle \geq 1+3x_0$, one further has:

$$\langle \eta_{core}^2 \rangle == 1 + 3x_0 + \frac{4x_0 y(1+x)}{1-xy} + I_1 + I_2 \quad \text{(NS-12)}$$

where:

$$I_1 = x_o y \left\langle \sum_{i=1} (1 + X_{2i})^2 \prod_{k=1}^{i-1} \prod_{l=1}^{i-1} X_{2l} Y_{(2l+1)} X_{2k} Y_{(2k+1)} \right\rangle \quad \text{(NS-13)}$$

$$= x_o y \left\langle \sum_{i=1} (1 + X_{2i})^2 (X_2^2 Y_3^2)(X_4^2 Y_5^2) \ldots (X_{2(i-1)}^2 Y_{2i-1}^2) \right\rangle$$

$$= x_o y(1 + 3x) \left[ \sum_{i=1} (xy)^{i-1} \right]$$

$$= x_o y \frac{(1+3x)}{1-xy}$$

and where:

$$I_2 = x_o y \langle \Sigma_i \Sigma_{j \neq i}(1+X_{2j})(1+X_{2i})\Pi_{k=1}^{i-1}\Pi_{l=1}^{j-1} X_{2l}Y_{(2l+1)} X_{2k}Y_{(2k+1)} \rangle \quad \text{(NS-14)}$$

One can divide $I_2$ into two components $I_2=I_{21}+I_{22}$:

$$I_{21}=x_o y \langle \Sigma_{i=1}\Sigma_{j=1}^{i-1}(1+X_{2j})(1+X_{2i})\Pi_{k=1}^{i-1}\Pi_{l=1}^{j-1} X_{2l}Y_{(2l+1)}X_{2k}Y_{(2k+1)} \rangle \quad \text{(NS-15)}$$

$$I_{22}=x_o y \langle \Sigma_{i=1}\Sigma_{j=i+1}(1+X_{2j})(1+X_{2i})\Pi_{k=1}^{i-1}\Pi_{l=1}^{j-1} X_{2l}Y_{(2l+1)}X_{2k}Y_{(2k+1)} \rangle \quad \text{(NS-16)}$$

where, $I_{21}$ includes all terms in the double summation where j<i, and $I_{22}$ includes all terms in the double summation where i<j. Since the index i and j play an equal role, $I_{21}$ is equal to $I_{22}$.

$$I_{21} = x_o y \left\langle \sum_{i=1}^{j=i-1} \sum_{j=1} (1 + X_{2j})(1 + X_{2i}) \prod_{k=1}^{i-1} \prod_{l=1}^{j-1} X_{2l}Y_{(2l+1)}X_{2k}Y_{(2k+1)} \right\rangle \quad \text{(NS-17)}$$

$$= x_o y \langle \{(1 + X_4)(1 + X_2)X_2 Y_3 + (1 + X_6)[(1 + X_4)X_2^2 Y_3^2 X_4 Y_5 +$$

$$(1 + X_2)X_2 Y_3 X_4 Y_5] + (1 + X_8)[(1 + X_6)X_2^2 Y_3^2 X_4^2 Y_5^2 X_6 Y_7 +$$

$$(1 + X_4)X_2^2 Y_3^2 X_4 Y_5 X_6 Y_7 + (1 + X_2)X_2 Y_3 X_4 Y_5 X_6 Y_7] + \ldots \} \rangle$$

$$= 2x_o y(1 + x)\{xy + 2x^2 y^2 + 3x^3 y^3 + \ldots\}$$

$$= 2x_o y \frac{(1+x)xy}{(1-xy)^2}$$

As a result, one has:

$$I_2 = I_{21} + I_{22} = 2I_{21} = 4x_o y \frac{(1+x)xy}{(1-xy)^2} \quad \text{(NS-18)}$$

From Eqs. (12), (13) and (18), one can obtain:

$$\langle \eta_{core}^2 \rangle = 1 + 3x_0 + \frac{x_0 y(5 + 7x)}{1-xy} + 4x_o y \frac{(1+x)xy}{(1-xy)^2} \quad \text{(NS-19)}$$

Similarly, in the shell region one can have:

$$\langle \eta_{shell}^2 \rangle = 1 + 3y_0 + \frac{y_0 x(5+7y)}{1-xy} + 4y_o x \frac{(1+y)xy}{(1-xy)^2} \quad \text{(NS-20)}$$

Also, $$\langle \eta_{core} \rangle^2 = \left[(1+x_0) + \frac{x_o y(1+x)}{1-xy}\right]^2 \quad \text{(NS-21)}$$

$$\langle \eta_{shell} \rangle^2 = \left[(1+y_0) + \frac{y_o x(1+y)}{1-xy}\right]^2 \quad \text{(NS-22)}$$

$$\langle \eta \rangle = [P_C(1+x_0) + P_S(1+y_0)] + \left[\frac{P_C x_o y(1+x) + P_S y_o x(1+y)}{1-xy}\right] \quad \text{(NS-23)}$$

$$\langle \eta^2 \rangle = \langle \eta_{core}^2 \rangle + \langle \eta_{shell}^2 \rangle + 2\langle \eta_{core} \rangle \langle \eta_{shell} \rangle \quad \text{(NS-24)}$$

From Eqs. (NS-19-NS-24), the excess noise factor associated with the CEI multiplication process can be calculated analytically, for example:

$$F = \frac{\langle \eta^2 \rangle}{\langle \eta \rangle^2} = 1 + \frac{[\langle \eta_{core}^2 \rangle - \langle \eta_{core} \rangle^2] + [\langle \eta_{shell}^2 \rangle - \langle \eta_{shell} \rangle^2]}{(\langle \eta_{core} \rangle + \langle \eta_{shell} \rangle)^2} \quad \text{(NS-25)}$$

To verify the exemplary analytical model, exemplary Monte Carlo simulations were performed, e.g., using Eq. (NS-26), where all $X_i$'s and $Y_i$'s are treated as independent random variables with possible values of 0 or 1 with assigned probabilities. For example, a total number of 10,000 trials were used to obtain the mean value of quantum efficiency (multiplication) and the noise factor.

$$\eta = P_C\{(1+X_0) + X_0 Y_1[\Sigma_{i=1}(1+X_{2i})\Pi_{k=1}^{i-1} X_{2k} Y_{(2k+1)}]\} + P_S\{(1+Y_0) + Y_0 X_1[\Sigma_{j=1}(1+Y_{2j})\Pi_{l=1}^{j-1} Y_{2l} X_{(2l+1)}]\} \quad \text{(NS-26)}$$

Figure 17A:
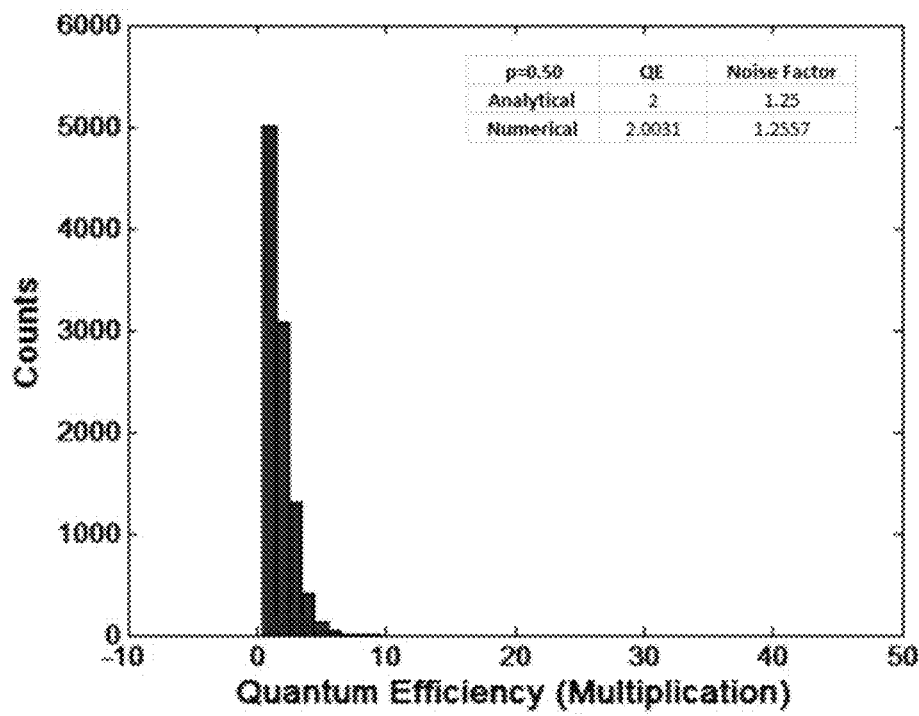
FIGS. 17A and 17B show histogram plots of the exemplary quantum efficiency distribution.
Figure 17B:
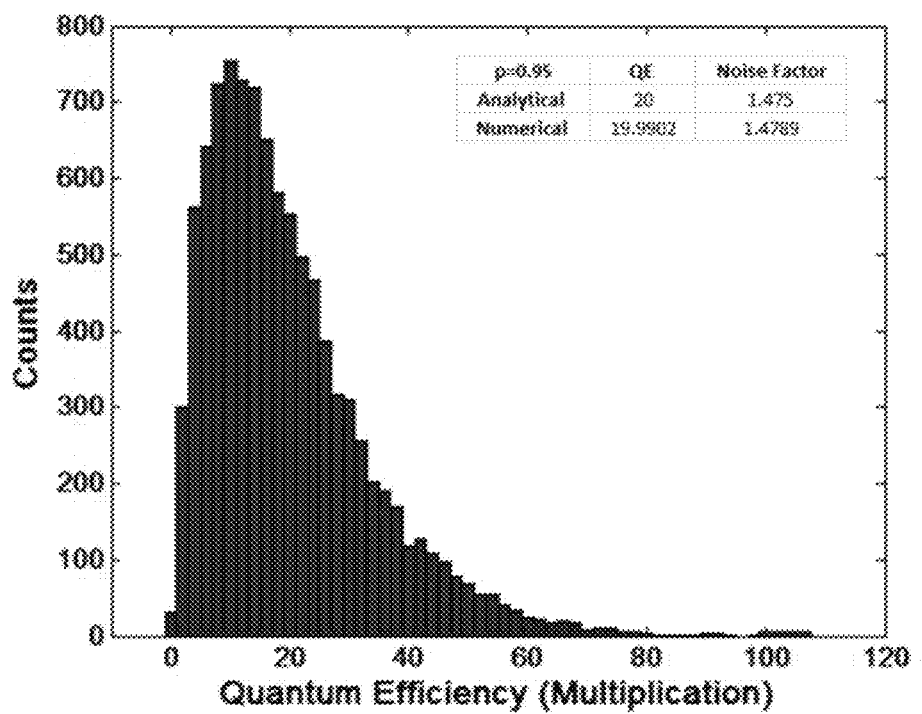

FIGS. 17A and 17B show histogram plots of the exemplary quantum efficiency distribution with the e-h pair generation probability of p=0.5 (FIG. 17A) and p=0.95 (FIG. 17B), e.g., corresponding to the mean value of quantum efficiency (multiplication) of 2.0 and 20.0, respectively. As shown in the histograms of FIGS. 17A and 17B, the quantum efficiency distribution is shown with the mean value of $X_i$ (Y). Both the average gain and the spread of the gain increase with the mean value of $X_i$ (Y). The exemplary simulation results showed excellent agreements with the exemplary results from the analytical model.

Photoresponse Amplification Techniques and Devices

Signal amplification is a fundamental process for all electronic and optoelectronic systems. The underlining physics of any signal amplification mechanisms is built upon the complex interactions among electrons, photons, phonons, and excitons. Improved understanding of these physical processes has spurred the enhancement of the quality of the obtained signals and fueled the development of new generations of electrical and photonic devices for communications, computation, imaging, and photovoltaics.

Broadly speaking, signal amplification can be divided into two groups—an external process that uses transistor amplifiers, and an internal process that uses the intrinsic material properties to amplify the signals. The best sensitivity or the highest signal-to-noise ratio has usually been obtained from the combination of the two amplification mechanisms. While recent works on nano-injection and multiple exciton generation (MEG) shed light on alternative internal amplification mechanisms, avalanche multiplication due to impact ionization remains to be the primary internal mechanism for signal amplification in semiconductors to date. Therefore, most of the state-of-the-art photoreceivers for telecommunications and single-photon avalanche diodes (SPADs) for quantum communications and imaging have adopted the impact ionization mechanism.

However, impact ionization usually requires high bias voltage, typically 30 to 200 V depending on the applications and the semiconductor materials, and often suffers from high excess noise associated with the avalanche process. Because of the very high operation voltage, avalanche multiplication by impact ionization is incompatible with the mainstream complementary metal-oxide-semiconductor (CMOS) process, and imposes serious limits on the power consumption and the level of integration.

Disclosed are methods, systems, and devices, and device fabrication techniques, for implementing signal amplification well beyond the conventional photoresponse limit (one photon produces at most one electron-hole pair). The photoresponse amplification is based on a carrier multiplication mechanism of "cascaded exciton ionization" (CEI). CEI results in cycling excitation process (CEP) to produce high gain and low noise. The disclosed technology can be utilized in a variety of applications for communication, imaging, sensing, and computing in which signal amplification is necessary and ubiquitous.

In an exemplary embodiment, a method of photoresponse amplification is disclosed for device materials including heavily doped, partially compensated silicon p-n junctions under very low bias voltage. The photocurrent gain occurs at a bias that is more than an order of magnitude below the threshold voltage for conventional impact ionization, and the photocurrent increases with bias voltage and with temperature. Contrary to the case of avalanche detectors and p-i-n diodes, the amplified photoresponse produced by the disclosed technology is enhanced rather than suppressed with increasing temperature. Such an internal signal amplification mechanism, which occurs at much lower bias than impact ionization and favors room temperature over cryogenic temperature, makes it promising for practical device applications.

In one aspect of the present technology, a method for signal amplification includes applying a low bias voltage across a p-n junction of a semiconductor material that is heavily doped and partially compensated, in which the semiconductor material includes a first co-doped semiconductor material and a second co-doped semiconductor material; receiving light on a surface of the semiconductor material; converting the received light to an electrical signal by cascaded exciton ionization (CEI); and conducting the electrical signal to an electrical circuit.

Implementations of the method can include one or more of the following features. For example, the first co-doped semiconductor material can include a p+/n type semiconductor material, in which the p+/n type semiconductor includes both electron acceptor and electron donor dopants, where the acceptor concentration is greater than the donor concentration, and the second co-doped semiconductor material can include a n+/p type semiconductor material, in which the n+/p type semiconductor material includes both electron acceptor and electron donor dopants, where the donor concentration is greater than the acceptor concentration. For example, the first and the second co-doped semiconductor material can include dopants doped at a concentration level substantially on the order of $1 \times 10^{19}$ cm$^{-3}$, or greater. For example, the method can be implemented where the semiconductor material is at room temperature. For example, the method can be implemented where the applied low bias is at substantially −2 V. For example, in implementations of the method, the converting the light to the electrical signal by CEI can include producing increased electrical energy for the received light with increased temperature of the semiconductor material.

Described here are exemplary implementations including the examination of an internal carrier multiplication process in silicon, e.g., the most important and commonly used semiconductor material. It is described that the observed gain only occurs in heavily compensated silicon p-n junctions where each side of the p-n junction contains a significant amount of counter impurities (i.e. the n-side has a significant amount of acceptors and the p-side has a significant amount of donors). At a bias level more than an order of magnitude lower than the threshold voltage for impact ionization, amplified photoexcited signals were determined to be well beyond the conventional photoresponse limit that one photon produces at most one electron-hole pair. In exemplary implementations investigating the device characteristics under different temperatures, it was further demonstrated that the photocurrent increases with the bias voltage and with the temperature. In contrast, conventional silicon p-n or p-i-n diodes exhibit neither the gain behavior nor the temperature dependence that is present in the example devices of the present technology. Such photocurrent measurements revealed the physical origin of the observed gain mechanism (e.g., not restricted to silicon) involving interactions among electrons and holes in the extended states and localized states as well as electron-phonon interactions.

Figure 18A:
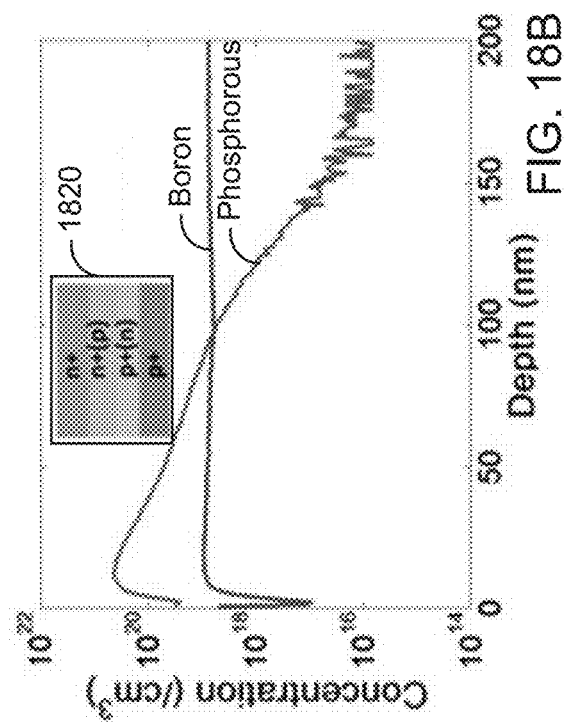
FIGS. 18A-18D show the designs and the secondary ion mass spectroscopy (SIMS) analysis of two example silicon p-n structures used to examine the signal amplification mechanism.
Figure 18B:
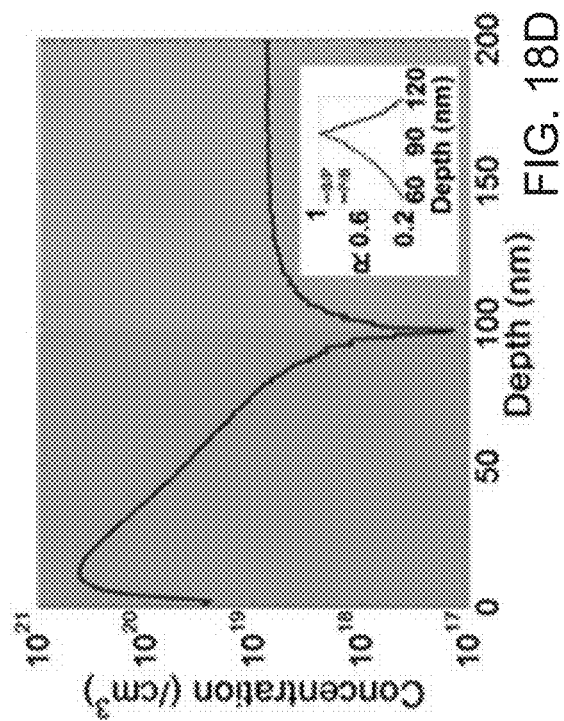

FIGS. 18A and 18B show the designs and the secondary ion mass spectroscopy (SIMS) analysis of two example silicon p-n structures 1810 and 1820 used to examine the signal amplification mechanism. The inset diagrams of FIGS. 18A and 18B show the conceptual designs of the p-n junction structures 1810 and 1820; one being an 'abrupt" p-n junction (i.e., the structure 1810), and the other being "partially compensated" p-n junction of the disclosed technology (i.e., the structure 1820). Sample silicon p-n structure 1810 was formed by organometallic chemical vapor deposition (OMCVD) epitaxial growth. FIG. 18A shows the SIMS profiles of phosphorous and boron in the OMCVD-grown silicon p-n junction structure 1810. Sample silicon p-n structure 1820 was formed by diffusing phosphorous into a heavily doped p-substrate (e.g., ~8×10$^{18}$ cm$^{-3}$). FIG. 18B shows the SIMS profiles of phosphorous and boron in the diffused silicon p-n junction.

For example, the effective doping levels in regions near the metallurgical junction were intended to be as close as possible, and a major difference between the two structures is the extent of doping compensation. For sample structure 1810 (the OMCVD grown structure), for example, the precise control of the gas flow enables minimum co-existence of both n- and p-type impurities, thus giving rise to a p-n junction with extremely small doping compensation. On the other hand, for example, the formation of the diffused p-n junction for sample structure 1820 has to overcompensate the background doping in the substrate to form the n-layer, and the phosphorous diffusion tail also partially compensates the p-region. As a result, sample structure 1810 serves as a model for an uncompensated p-n junction, and sample structure 1820 for a partially compensated p-n junction.

Figure 18C:
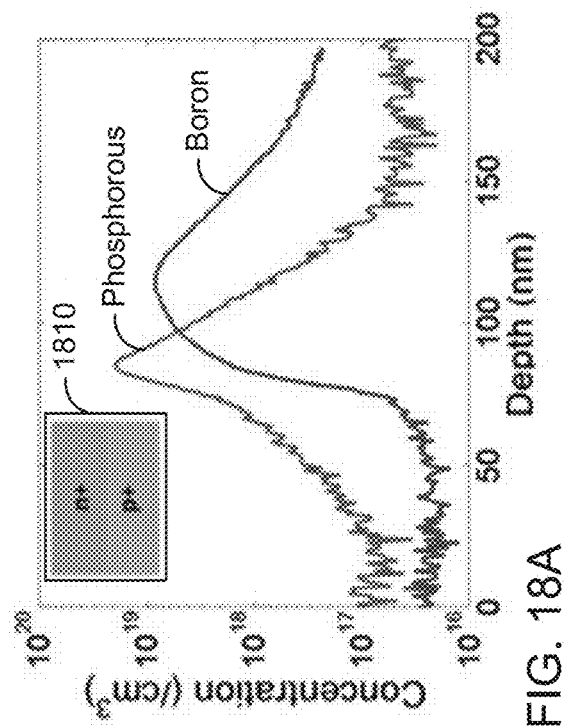
Figure 18D:
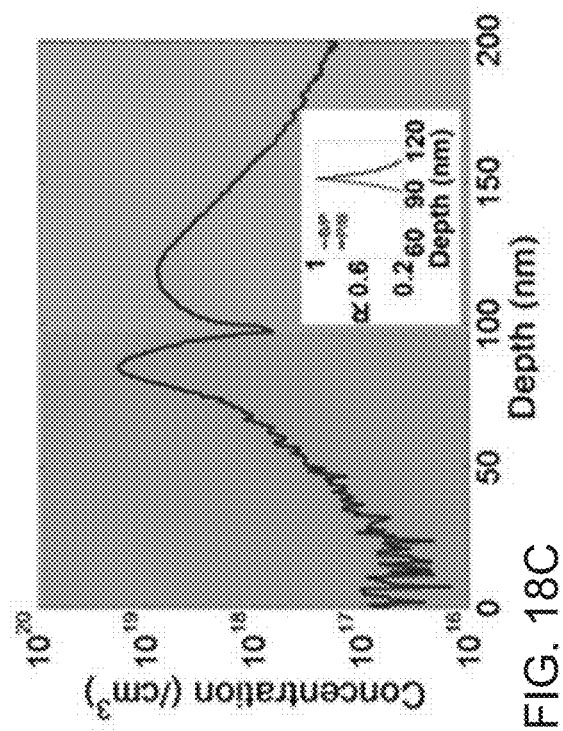

FIGS. 18C and 18D show the profiles of effective doping and the compensation ratio near the junction for both samples. FIG. 18C shows exemplary effective doping profiles (i.e. Nd—Na in n-region and Na—Nd in p-region) of the OMCVD junction. FIG. 18D shows exemplary effective doping profile of the diffused junction. The inset graphs of FIGS. 18C and 18D present the doping concentration ratios R for the two samples respectively. These inset diagrams of FIGS. 18C and 18D confirm the description that much wider partially compensated regions are present for the diffused sample compared to the epitaxially grown sample. Both samples were then processed into mesa isolated p-n junctions for device characterizations.

In these exemplary implementations, the OMCVD sample (sample structure 1810) was grown by an epitaxial vendor. To form the structure for the structure 1820, phosphorous was introduced via proximity diffusion at 950° C. for 35 seconds in a rapid thermal annealing (RTA) furnace using the phosphorous containing spin-on-dopant (SOD) as the dopant source. The formed junction depth was around 100 nm, as confirmed by the SIMS profile. Individual p-n junction devices on the OMCVD and diffused samples were formed by inductively coupled plasma reactive-ion etching (ICP-RIE) with $C_4F_8$ and $SF_6$ gases. Each device mesa had an area of 35 μm×55 μm, and was 350 nm deep. After the mesa etch, a thin layer of $SiO_2$~250 nm was deposited and patterned lithographically for n- and p-metal contacts. E-beam evaporated Ti/Au was used to form the Ohmic contacts for both n- and p-layers. Typical p-n junction current-voltage characteristics were obtained from both samples. Specifically, the diffused p-n junction device has an ideality factor of 1.98 and a leakage current of 85 pA at 1V reverse bias, as shown in FIGS. 19A and 19B.

Figure 19A:
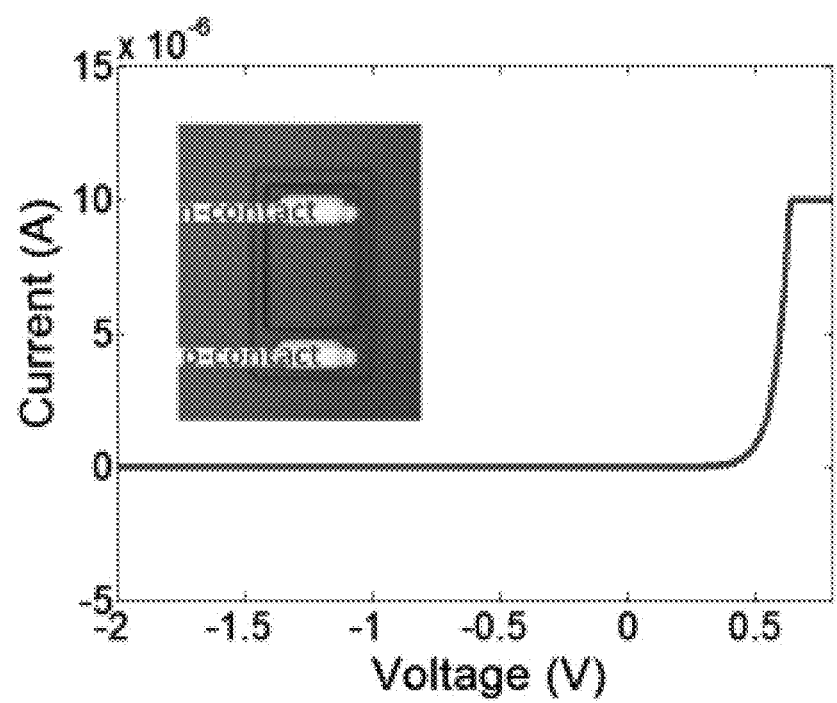
FIG. 19A shows a data plot depicting dark I-V characteristics of an exemplary diffused p-n junction in the absence of light illumination and an inset diagram showing the micrograph of an example fabricated p-n junction with n- and p-contacts labeled.
Figure 19B:
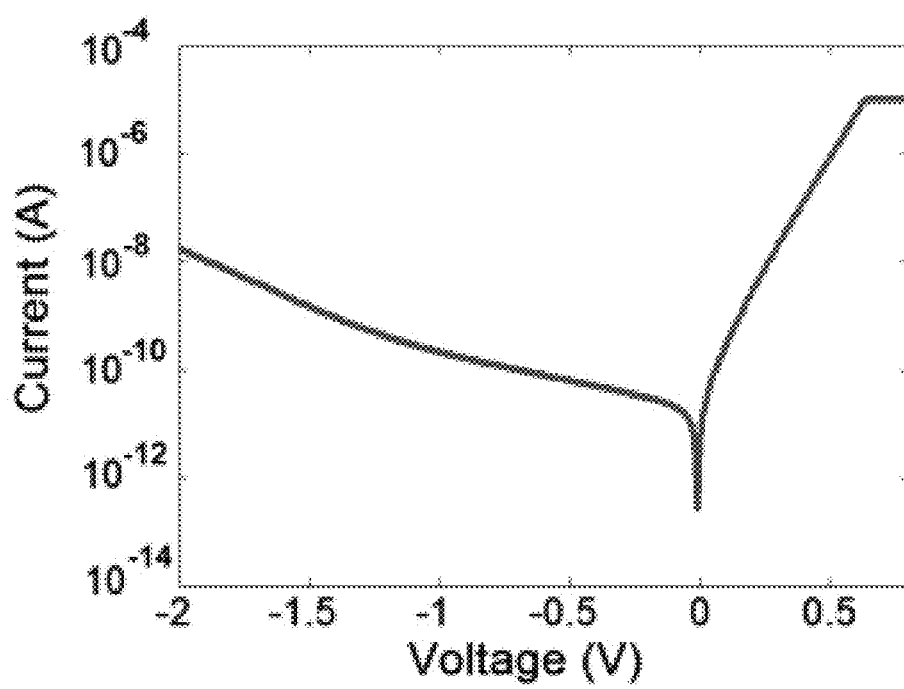
FIG. 19B shows a log scale plot depicting the dark I-V characteristics of the same exemplary p-n junction.

FIG. 19A shows a data plot depicting dark I-V characteristics of an exemplary diffused p-n junction in the absence of light illumination. For example, a typical rectifying behavior of p-n junction is shown. The inset diagram of FIG. 19A shows the micrograph of a fabricated p-n junction with n- and p-contacts labeled. FIG. 19B shows a log scale plot depicting the dark I-V characteristics of the same exemplary p-n junction. For example, the ideality factor is 1.98.

Figure 20A:
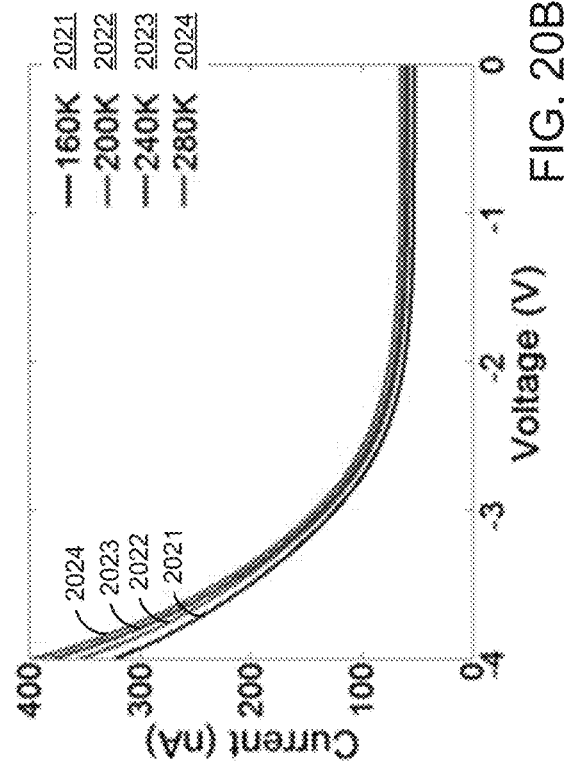
FIGS. 20A-20D show comparative data plots of example conventional p-n junction structures and diffused p-n junction structures of the disclosed technology.
Figure 20B:
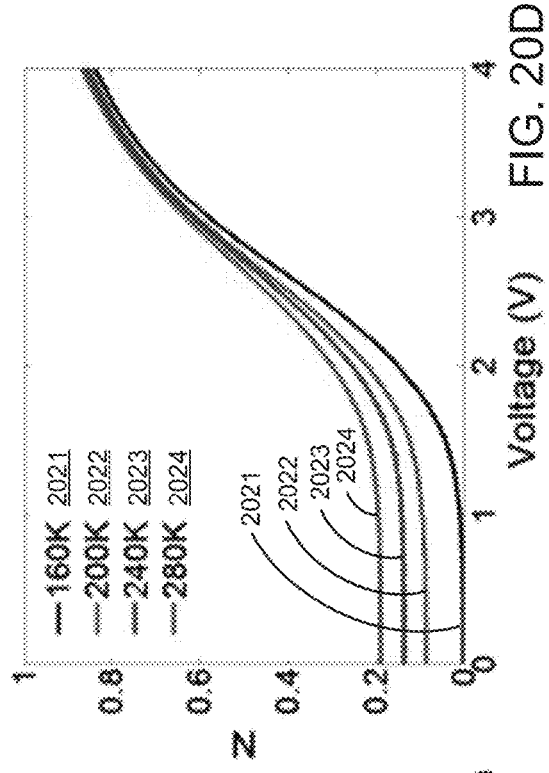
Figure 20C:
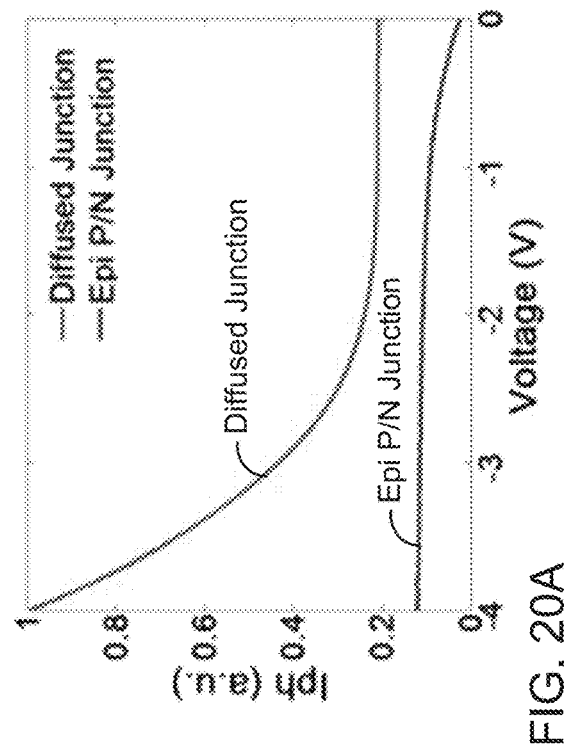
Figure 20D:
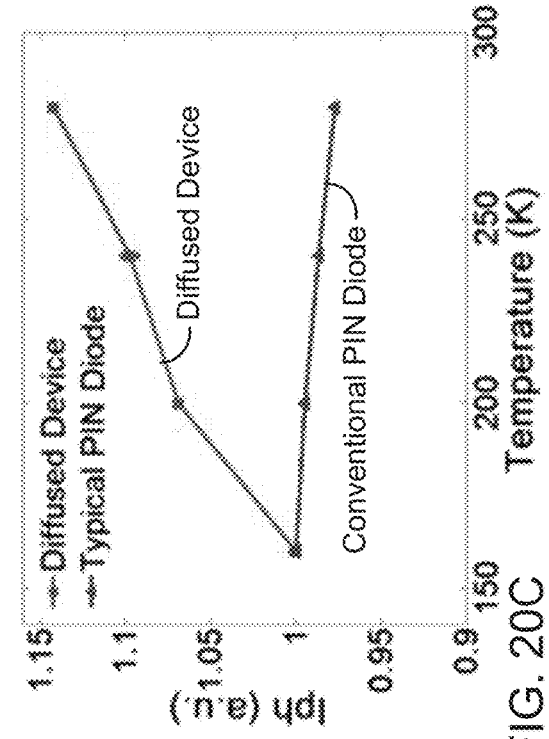

Additional exemplary results are shown in the data plots of FIGS. 20A-20D. FIG. 20A shows the bias dependence of photoresponse to 635 nm laser light for both the diffused and OMCVD epitaxial grown Si p-n junctions structures at room temperature. The OMCVD epitaxial grown sample shows the photocurrent Iph of a typical p-n junction, whereas the diffused junction shows a rapidly increasing photocurrent with the bias voltage. FIG. 20B shows the bias dependence of photocurrent at various temperatures (e.g., 160 K, 200 K, 240 K, and 280 K) for the diffused p-n junction device with high doping compensation. FIG. 20C shows a data plot depicting an example comparison of the temperature dependence of photoresponse between a highly compensated Si p-n junction structure of the disclosed technology and a conventional Si p-i-n diode at −3 V. For example, the photocurrent of both devices was normalized with respect to its individual value at 160 K. FIG. 20D shows a data plot showing the average number of e-h pairs (N) generated by an energetic carrier as a function of the bias voltage at different temperatures, e.g., which was obtained from the measured data in FIG. 20B and Eq. (4).

The photocurrent of both the epitaxially-grown and the diffused devices was measured under 635 nm laser light illumination. The exemplary epitaxially-grown p-n junction device exhibited the photoresponse of a standard p-n or p-i-n diode, having a nearly constant photocurrent level independent of the bias voltage. In sharp contrast, the exemplary diffused p-n junction device of the disclosed technology showed that the photocurrent increases significantly with the increase of the reverse bias voltage from 0 to −4 V, signifying signal amplification as shown in FIG. 20A. Exemplary device simulations have shown that for both device structures avalanche multiplication due to impact ionization does not take place until −20 to −25 V bias, whereas the experimental data from the diffused p-n junction of the disclosed technology shows that the amplification starts at a bias voltage as low as −2 V. Since the devices have shown typical I-V characteristics of a normal p-n junction in the dark condition, the observed amplification behavior cannot originate from the photoconductive effect or phototransistor behavior. Furthermore, the photoresponse data show that this phenomenon exists only in the heavily compensated p-n junction but is absent in regular p-n junctions. Therefore, the distinctive signal amplification must be explained by an internal carrier multiplication mechanism that is not present in the normal p-n junctions.

In the exemplary implementations, to explore the phenomenon further, the bias dependence of photoresponse under different temperatures was measured. FIG. 20B shows that the photocurrent of the exemplary diffused junction structure of the disclosed technology increases monotonically with bias voltage over the entire temperature range of measurements. As shown in the data plot of FIG. 20B, the temperatures measured included 160 K (data curve 2021), 200 K (data curve 2022), 240 K (data curve 2023), and 280 K (data curve 2024). For example, the photocurrent increased with temperature under all bias voltages.

Such characteristics can be better shown in FIG. 20C taking the data at −3 V as an example. For comparison, the temperature dependence of photoresponse of a conventional Si p-i-n diode is also included in the figure. To remove any effects introduced by light coupling and the experimental setup, the normalized photocurrent was plotted at different temperatures in FIG. 20C to demonstrate the fundamentally different temperature dependence of photoresponse between the compensated p-n junction structures and conventional p-n junction structures. For conventional Si p-n or p-i-n diodes, the photoresponse between 500 nm and 700 nm is nearly temperature independent, as shown in the data plot of FIG. 20C. It was found that the photoresponse of the heavily compensated p-n junction structure possessing amplification characteristics (labeled "Diffused Device" in the data plot) provides an increased photoresponse with increasing temperature. It is noted that by contrast the photoresponse of an avalanche photodetector decreases with increasing temperature, e.g., because the increasing phonon scattering hinders the acceleration of carriers under the applied electric field and results in a lower probability for impact ionization.

The exemplary results indicate an internal signal amplification mechanism that is provided in the engineered heavily compensated silicon p-n junctions of the disclosed technology. These exemplary results demonstrate that the internal signal amplification mechanism occurs at a much lower voltage than impact ionization, and the mechanism includes a gain that increases with temperature to favor room temperature over cryogenic operation. Based on the fact that the gain is only present in materials with significant doping concentration and doping compensation, such as that in the disclosed technology, the cycling excitation process (CEP) includes a photoexcited carrier (electron) traversing the p-n junction to gain sufficient kinetic energy to excite an electron-hole pair whose dissociation enables the hole component to repeat the same process by traversing the junction in the opposite direction. Since such scattering and dissociation events occur with finite probabilities and the carriers suffer energy dissipation by other causes, the cycling process does not exhibit any perpetual motion behavior and renders a net steady state gain.

Figure 21:
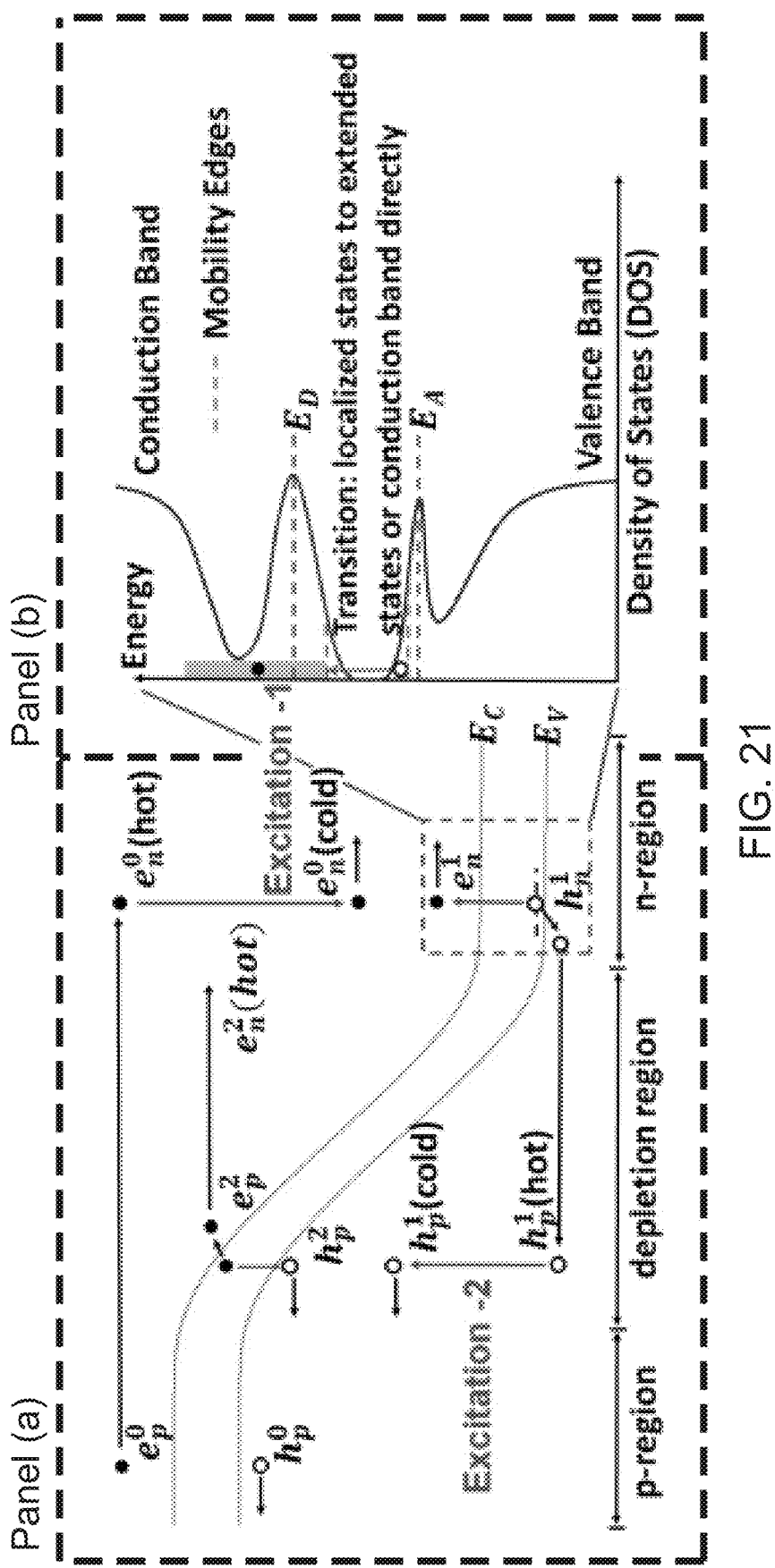
FIG. 21 shows a schematic illustration in panel (a) of an exemplary cycling excitation process (CEP) of the disclosed technology, and a plot in panel (b) depicting an exemplary density of states (DOS) distribution with respect to the band diagram in the n-region of the p-n junction.

FIG. 21 panel (a) shows a schematic illustration of an exemplary cycling excitation process (CEP) of the disclosed technology. As shown in the illustration of FIG. 21, the optically excited electron $$\left(e - \frac{0}{p}\right)$$

and hole $$\left(h\frac{0}{p}\right),$$

is represented by the black dot and ring, respectively. The optically excited electron and hole are labeled with a superscript denoting generation and subscript indicating the location (p- or n-side of the junction) of the carrier. The same labeling system is also applied to future generation of electrons and holes. The optically excited hole in the p-region goes towards the p-contact. The corresponding electron goes through a single cycle of two excitation events, as shown in the figure, and such process can go on with finite probabilities. FIG. 21 panel (b) shows a plot showing an exemplary density of states (DOS) distribution with respect to the band diagram in the n-region of the p-n junction. As shown in FIG. 21 panel (b), the red arrow indicates the excitation process of bringing an electron across the energy gap from an ionized acceptor (A−) in the n-region; and represent the isolated donor and acceptor energy levels, which form the impurity bands.

FIG. 21 illustrates how the disclosed CEP happens in response to optical excitation. A pathway for cyclical e-h generations initiated by a photon absorbed in the p-region of the p-n junction, where the primary or the zeroth generation of electron-hole pair ($e_p^0$ and $h_p^0$) is created. Each electron and hole are labeled by e and h, with superscripts denoting generation and subscripts (p or n) indicating location of the carrier. A symmetric case can also be made for the excitation in the n-region. The primary hole $h_p^0$ leaves the device via the p-contact and the primary electron $e_p^0$ moves into the depletion region of the p-n junction gliding over the energy slope and gains kinetic energy. The amount of kinetic energy acquired by the electron is determined by the built-in potential, the applied bias, and the dissipative effect of inelastic scattering by phonons or by carriers in the Fermi sea known as shake-up. For heavily doped p-n junction under low reverse bias, the width of the depletion region (e.g., 20 to 40 nm) is comparable to the electron mean free path (e.g., ~15 nm) at room temperature. Hence the energetic electron can gain sufficient energy to excite an electron across the energy gap from an ionized acceptor (A⁻) in the partially compensated n-doped region. This excitation process, indicated by the vertical arrows in the n-region, generates the first generation of electron hole pair ($e_n^1$ and $h_n^1$). After the excitation, both the zeroth ($e_n^0$) and first generation ($e_n^1$) electron leave the device via the n-contact. In the meantime, the acceptor that just lost its electron may capture an electron form the valence band, and this process produces the secondary mobile hole ($h_n^1$), which can traverse the depletion region and gain sufficient energy for a second excitation process to produce the second generation of electron-hole pair ($e_p^2$ and $h_p^2$) in the p-side (depletion region or the p-region) of the junction. The hole goes to the p-contact directly and the electron will again serve as the seed for a new cycle of excitations.

FIG. 21 panel (b) also shows a density of states (DOS) graph for a point in the n-region of the p-n junction. Given such excitations happen in heavily doped and compensated materials, the transition is believed to be mainly between the donor and acceptor (DA) states which could be either in the extended or local states on either side of the mobility edge of the impurity band. Thus the transition can produce either a bound DA exciton or a pair of mobile electron and localized hole or vice versa (as shown in the DOS graph in FIG. 21 panel (b)), and the resultant localized electron or hole thermalizes readily to become mobile carrier contributing to the photocurrent. The interactions between the localized electrons or holes and phonons may also explain why the partially compensated p/n junction device favors room temperature rather than cytogenetic operation (FIGS. 20B and 20C). In impact ionization the carriers in the conduction and valence bands are treated as extended waves obeying the k-selection rule (or momentum conservation), but in the disordered heavily doped semiconductors, optical transitions in the range of the indirect band gap energy in silicon are evidence of transition between localized waves, relaxing the k-selection rule. Even in bulk silicon with k conservation, the computation of the absorption spectra requires the strength of the transition matrix elements provided by the atomic orbitals.

For example, in the avalanche process, the hot carrier loses its kinetic energy to produce an electron-hole pair. Since all the carriers involved in the process are Bloch waves with well-defined k-vectors, the k-selection rule has to be satisfied. For indirect bandgap semiconductors such as Si, satisfying the k-selection rule has always been the bottleneck for processes such as impact ionization. Even for direct bandgap semiconductors, the high energy initial electron (hole) has a very large k-value far away from the F point, making the satisfaction of k-selection rule rather difficult for impact ionization too. In contrast, the donor and acceptor states in the disclosed partially compensated semiconductor structures of the disclosed technology are highly localized (e.g., Bohr radius ~1 nm). The highly localized impurity states increase the uncertainties in k-space thus greatly relax the k-selection rule. For example, the relaxation of k-selection rule contributes to why the DAP exciton generation process can occur with a much higher probability and at much lower voltage than avalanche multiplication.

Figure 22:
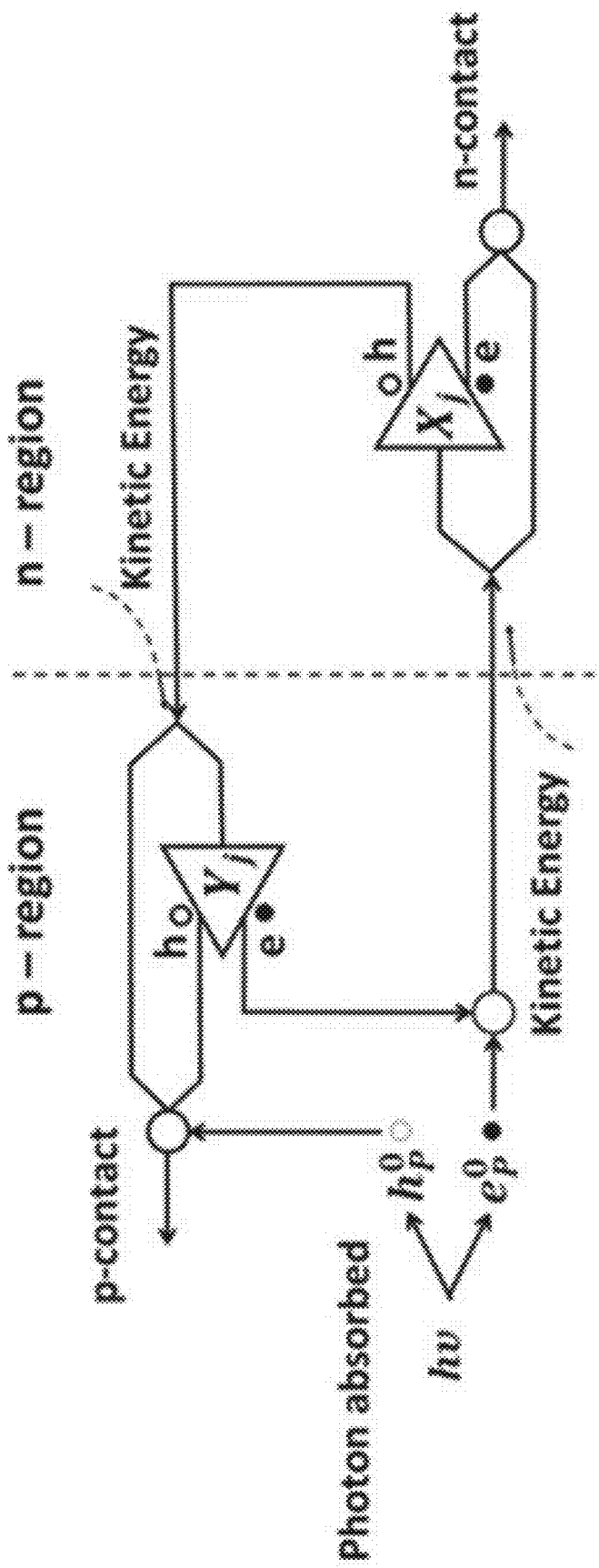
FIG. 22 shows a block diagram illustration of an exemplary cycling excitation process (CEP) of the disclosed technology.

FIG. 22 shows a block diagram illustration of an exemplary cycling excitation process (CEP) of the disclosed technology. Taking the exemplary process initiated by a photon absorbed in the p-region of the p-n junction as an example, in which the j-th hot electron or hole can produce or e-h pairs in each excitation event. The exemplary CEP requires sufficient interband transition energy which may be vitiated by low energy intraband dissipation processes such as phonon emission and shake-up. Thus, there exists an average number of electron-hole pairs, denoted by $X_j$ and $Y_j$, respectively, generated by the j-th generation hot electron and hole through the excitation process as illustrated in FIG. 22. For practical device structures, for example, it is assumed $\langle X_j \rangle = x$ and $\langle Y_j \rangle = y$. The net gain from a practical device can be written as $$G_{pn} = \frac{P_p(1+x) + P_n(1+y)}{(P_p + P_n)(1-xy)}$$

based on an exemplary analytical model (see further analysis and simulation discussion below), where $P_p$ and $P_n$ are the percentage of light absorbed in the p- and n-region of the device. The Monte Carlo simulations show excellent agreements with the analytical model on the mean value of gain and the relatively small spread of gain distribution, which is indicative of low excess noise compared to conventional avalanche process.

Further analysis and simulation of the amplified photoresponse from the cycling excitation process (CEP) is described below. In the following, the expression of the amplification factor of the cycling excitation process (CEP) is derived.

Figure 23:
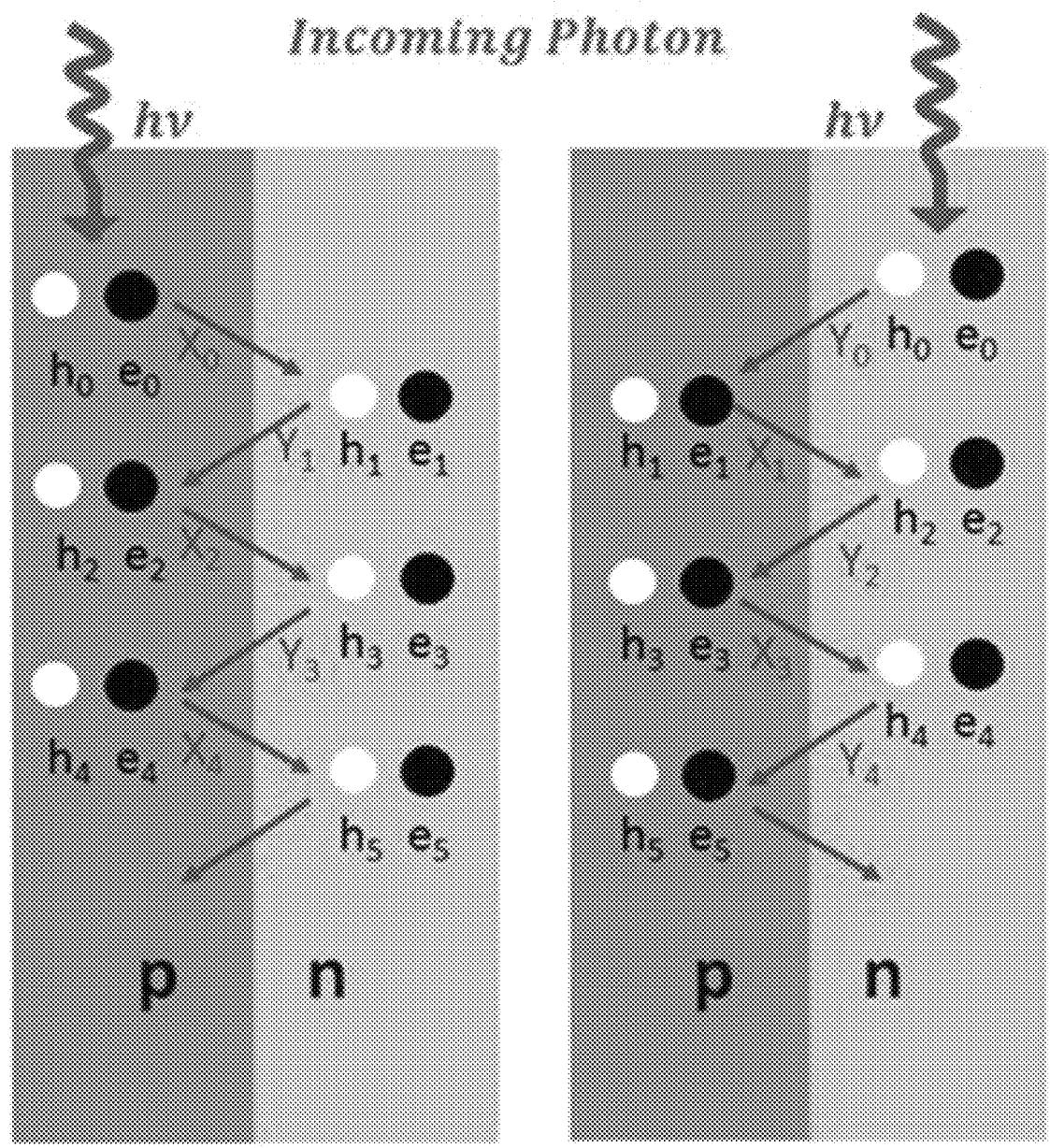
FIG. 23 shows a diagram of carrier multiplication by an exemplary cycling excitation process initiated from a single photon incident on either the p-side or n-side of the heavily doped and compensated junction.

FIG. 23 shows a diagram of carrier multiplication by an exemplary cycling excitation process initiated from a single photon incident on either the p-side or n-side of the heavily doped and compensated junction. For example, the diagram demonstrates how the photogenerated primary (zeroth generation) electron-hole pair initiates the cycling excitation process. In the diagram, each electron and hole is labeled according to its generation. For example, "0" is used to denote the primary electron and hole generated by photon absorption. The number of electron-hole pairs produced by the i-th generation hot electron and hot hole is assumed to be $X_i$ and $Y_i$, respectively. $X_i$ and $Y_i$ are considered to be independent random variables and all $X_i$'s and $Y_i$'s have their mean values:

$$\langle X_i \rangle = x(i=1,2,3,\ldots) \tag{S1}$$

$$\langle Y_j \rangle = y(i=1,2,3,\ldots) \tag{S2}$$

The average number of electron-hole pairs produced by the absorption of a single photon in the p-side over the series of cyclic excitations is given by:

$$G_{p\text{-}side}\langle 1+X_0+X_0Y_1+X_0Y_1X_2+X_0Y_1X_2Y_3+$$
$$X_0Y_1X_2Y_3X_4+\ldots \rangle \tag{S3}$$

Using the relations in Eq. (51) and Eq. (S2), Eq. (S3) is simplified into:

$$G_{p\text{-}side} = \frac{1+x}{1-xy} \tag{S4}$$

Similarly, the average number of e-h pairs due to absorption of a single photon in the n-side is derived as:

$$G_{n\text{-}side} = \langle 1+Y_0+Y_0X_1+Y_0X_1Y_2+Y_0X_1Y_2X_3+$$
$$Y_0X_1Y_2X_3Y_4+\ldots \rangle \tag{S5}$$

Again, using the relations in Eq. (51) and Eq. (S2), Eq. (S5) is simplified as:

$$G_{n\text{-}side} = \frac{1+y}{1-xy} \tag{S6}$$

Finally, the total number of e-h pairs of the exemplary device is derived as:

$$G_{junction} = \frac{P_p(1+x) + P_n(1+y)}{(P_p + P_n)(1-xy)} \tag{S7}$$

where $P_p$ and $P_n$ in Eq. (S7) are the probabilities for the incoming photon to be absorbed in the p-side and n-side of the example device.

Figure 24A:
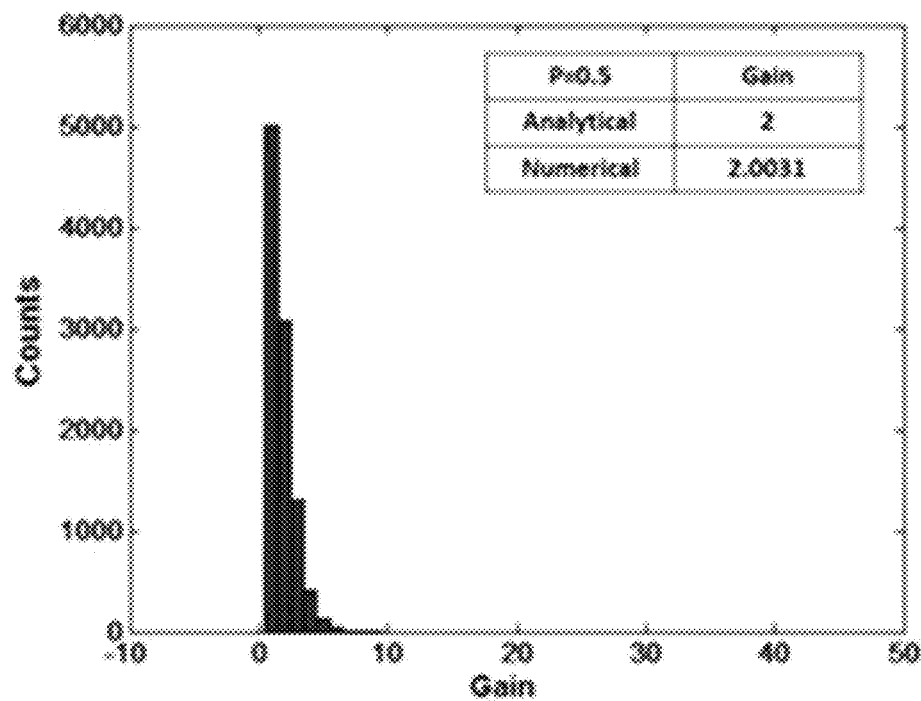
FIG. 24A shows a histogram data plot of gain distribution with the e-h pair generation probability at with a mean gain value of 2.0 and an excess noise factor of 1.26.
Figure 24B:
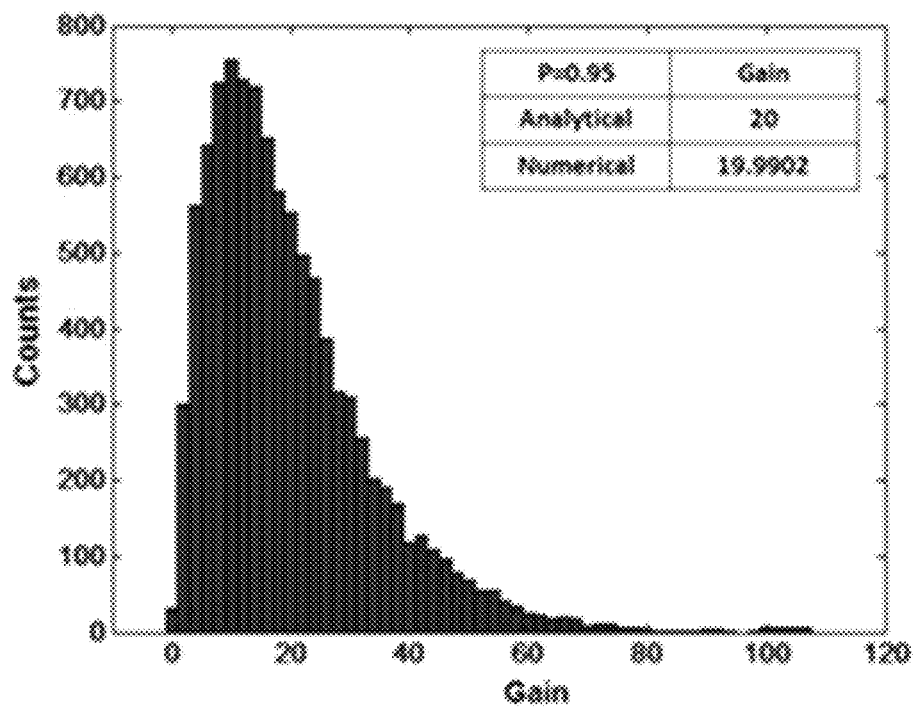
FIG. 24B shows a histogram data plot of gain distribution for with a mean gain value of 20.0 and an excess noise factor of 1.48.

The above analysis yields the average gain. The example Monte Carlo simulations verify the analytical model by comparing the mean value of gain with the analytic expression Eq. (S7) and to obtain the gain distribution, which yielded the noise characteristics of the amplification mechanism. FIGS. 24A and 24B show exemplary histograms of the simulated gain distribution for 10000 events assuming that $(X_i)=(Y_i)$ is set to 0.5 and 0.95 in parts (FIG. 24A) and (FIG. 24B), and $P_p=P_n$ is also assumed for the calculations. In the simulations, the value of $X_i$ or $Y_i$ was set to be either "0" or "1" indicating if an excitation event occurs or not. Under low bias condition, the probability for a carrier to create more than 1 excitation event is assumed negligible.

The simulated mean gain values in the insets show excellent agreement with the results from the analytical model (Eq. (S7)). Moreover, based on the histograms, the excess noise factor $$\left(N.F. = \frac{\langle G_{junction}^2 \rangle}{\langle G_{junction} \rangle^2}\right)$$

is found to be N.F.=1.26 for <G>=2 and 1.48 for <G>=20. The excess noise factor for the CEP process appears to be lower than that of conventional Si avalanche photodiodes having their excess noise factor greater than 2 at <G>=20.

In summary, disclosed are photocurrent amplification methods and devices including heavily doped, partially compensated p-n junctions of silicon. The disclosed signal amplification technology utilizes a cycling excitation process (CEP) initiated by optical excitation of electron and hole which produce the back-to-back ionization processes involving at least one localized state, by virtue of the increase in kinetic energy of a carrier across the p-n junction. The disclosed processes connects the presence of the heavily doped donor and acceptor compensation, the driving by optical excitation, and the assistance by heat, to produce qualitatively the observed bias and temperature characteristics. Such an effect has as its mainstay the excitation of an electron (hole) from a bound acceptor (donor) state, combined with thermal ionization, to form mobile electron-hole pair. The disclosed process provides the voltage-dependent gain and the temperature characteristics in exemplary devices of the disclosed technology. CEP, in principle, applies to other semiconductors such as GaAs and other compound semiconductors where excessive amount of dopants produce self-compensation (e.g., excessive amount of Si dopants in GaAs may take both the donor and acceptor positions). Since the initial carrier may be created by photoexcitation or electrical injection in a properly designed structure, the signal amplification effect can potentially be incorporated into various kinds of devices including photodetectors and field effect or bipolar transistors. The disclosed technology can be utilized in a variety of applications for communication, imaging, sensing, and computing in which signal amplification is necessary and ubiquitous.

Power Efficient, Ultra Low Noise Amplification in Semiconductors

In some aspects of the disclosed technology, methods, systems, and devices are disclosed that utilize photoresponse amplification for a variety of applications utilizing a heat-assisted photocurrent (HAPC) effect found in silicon, as well as other semiconductors. The HAPC effect can amplify the electric signals at a bias level an order of magnitude lower than impact ionization, and promises high gain and extremely low noise. This effect is included in cascaded exciton ionization (CEI). The mechanism originates from strong interactions between carriers, excitons, and phonons. In sharp contrast with most conventional exciton based devices that display their unique characteristics under low temperature, the HAPC effect becomes more effective at and above room temperature, making it highly attractive to real device applications. The disclosed technology includes engineered material structures and devices that are operable to exhibit this effect, in which such implementations of the disclosed technology may have tremendous impact on both basic science and commercial applications.

For example, the fundamental physics and potential applications of the disclosed technology pertaining to the heat-assisted photocurrent (HAPC) effect in a heavily compensated silicon p/n junction has been described. The effect (e.g., notably, not restricted to silicon only) amplifies the signal in the induced photocurrent beyond the usual photoresponse limit of one photon producing no more than one electron-hole pair. Thermal phonons produce a cycling effect of more than one electron-hole pair per photon, referred to as cascaded exciton ionization (CEI). This signal amplification mechanism is highly energy efficient, occurring at less than one tenth of bias voltage of impact ionization. These extraordinary outcomes can greatly enhance the understanding of the exciton transport properties of semiconductor and even biological materials in living systems, and open up new fields of basic and applied research to transform the semiconductor industry, especially in sensing, communications, and computing.

Signal amplification and the maximization of signal-to-noise ratio is fundamental to the efficacy of various communication and data processing systems. Noise essentially limits the performance of communication, imaging, and all analog and mixed signal systems. Even so-called ideal amplifiers produce thermal noise and other noise such as readout noise in imaging systems. Besides amplification by transistors, another amplification mechanism is avalanche multiplication through impact ionization. Although the avalanche mechanism alleviates thermal noise, it produces significant excess noise that increases with the gain.

In sharp contrast, the engineered materials and devices of the disclosed technology can be implemented to utilize the CEI effect to amplify signals with a very high gain and speed, extremely low bias, and above all, ultralow noise approaching the true quantum limit sensitivity.

The disclosed technology draws upon an effect in condensed matter physics: electron, exciton, phonon interactions, manifested by the heat-assisted photocurrent (HAPC) effect. Materials and devices, and fabrication and operation methods, have been developed in exemplary implementations of the disclosed technology, which demonstrate this effect. In the science of semiconductors, an important aspect is that the coupling of exitons and phonons, which can be utilized to most efficiently and quietly amplify weak signals and convert optical energies into electric energies in the disclosed technology. Especially the exciton-phonon coupling effect is enhanced rather than suppressed as temperature rises, meaning that devices of the disclosed technology employ this coupling to perform better at and above room temperature, in contrast with many extraordinary physical effects that occur only at cryogenic temperatures when thermal agitation is suppressed.

For practical device applications, the use of an internal mechanism for efficient, low noise signal amplification may expect to yield device characteristics otherwise unachievable with the conventional state-of-the-art technologies. For example, the effect may unify the optical detection in linear mode and Geiger mode, thus producing single photon sensitivity and high dynamic range for semiconductor single-photon focal-plane arrays operable at room temperature for LIDA, remote sensing, and optical communications. One can also incorporate the effect into transistors (e.g. CEI-FETs) as new building blocks for circuits. The intrinsic properties of the amplification mechanism are expected to give rise to extremely high power efficiency and sensitivity for digital, analog, and RF applications. These are just a few examples of the envisioned outcomes that may be produced by the disclosed technology in practical applications of significant interests. Described below are exemplary results of scientific and engineering research and implementations to demonstrate the utilization of the disclosed technology for signal amplification, including description of the mechanism, a physical model for the phenomenon, and exploration of the potential impact on IR sensing and detection.

Figure 25:
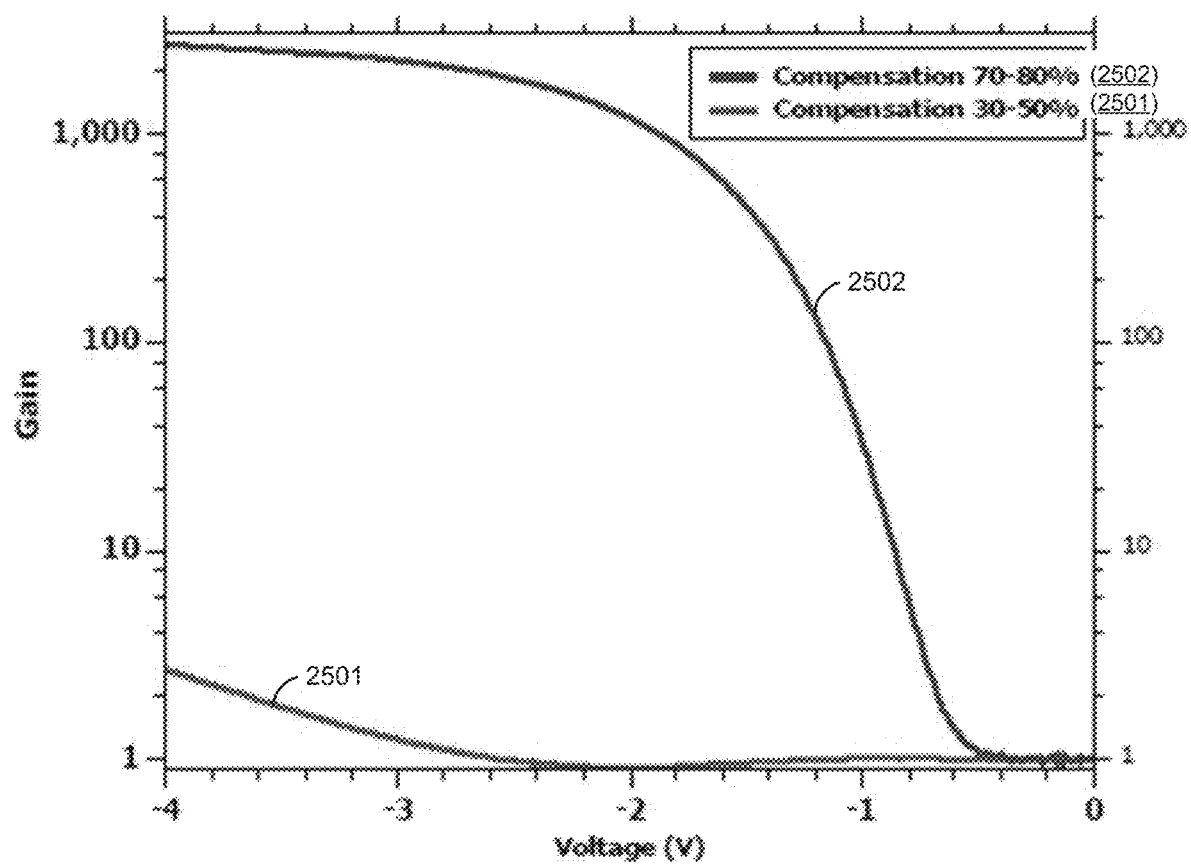
FIG. 25 shows a data plot showing the bias dependent gain for an example Si p/n junction structure with 40±10% doping compensation and a Si p/n junction structure with 75±5% doping compensation.

As discussed above, e.g., in FIGS. 20A-20D, the photoresponse of the diffused p/n junction structure of the disclosed technology provides substantial gain at very low bias voltage and also an increasing gain with temperature. This suggests that the presence of phonons promotes signal amplification through physical mechanisms of the engineered material structures. Notably, the gain mechanism is a drastic enhancement of the gain with devices of large doping compensation ratios. For example, FIG. 25 shows a data plot showing the bias dependent gain for two OMCVD grown Si p/n junctions with 40±10% (data curve 2501) and 75±5% (data curve 2502) doping compensation. The drastically different characteristics between the data curves 2501 and 2502 indicate the strong effect of doping compensation on the amplification factor. The measurements for this example implementation were performed at room temperature with 635 nm light. These exemplary results of FIG. 25 provide unequivocal evidence about the significant effect of doping compensation. For example, by increasing the compensation ratio from 40% to nearly 80%, the gain under the same bias (e.g., up to 4V) has increased from <3 to >2000. Notably, prior to the mechanisms shown by the disclosed technology, no current semiconductor theory has predicted a heavily compensated p/n junction can possibly produce such high gain at such low bias voltage.

In one example implementation, Si/Ge heterostructures were chosen to demonstrate a photodetector for infrared operations, e.g., at 1550 nm wavelength. The technology for extending the operation wavelength can be divided into two approaches: (i.) using Si junction for amplification and a different material for light absorption, and (ii.) using different materials than Si (e.g. III-V compound) for amplification and material of proper bandgap and lattice match with the gain production material for light absorption. For approach (i.), the disclosed technology includes the integration of efficient light absorption material (e.g., Ge for long wavelength detection and SiC, ZnO, or GaN for UV detection) with the partially-compensated Si p/n junction structures in a SAM (separate absorption and multiplication) structure of the disclosed technology. For approach (ii.), the disclosed technology including employing the general signal amplification mechanism shown for Si to other semiconductors, e.g., such as GaAs and InP, in which the device structure is created, including the light absorption layer and amplification junction, based on the disclosed material system.

For approach (i.), heteroepitaxial techniques are utilized to form high quality light absorption layers on Si and to form a good heterointerface to facilitate the carrier transport. For example, Ge light absorption layer is integrated with partially-compensated Si p/n junction for signal amplification.

For approach (ii.), techniques are utilized to produce heavily doped and heavily compensated p/n junctions with different semiconductors.

An example of a Si/Ge epitaxial structure is shown. Table 1 shows one example of the designs for the exemplary device.

TABLE 1

Epitaxial design of Si/Ge 1550 nm photodetector with the amplification mechanism

| Material | Thickness (μm) | Doping | Remarks |
| --- | --- | --- | --- |
| Si substrate | 500 | 1~2E19 | (100) orientation, 6" diameter |
| Si | 0.1 | n = 2E17 | |
| Si | 0.1 | n = 2E18 | |
| Si | 0.2 | n = 3E19/ p = 2.7E19 | Partially compensated p/n junction (90% compensated) |
| Si | 0.2 | p = 3E19/ n = 2.7E19 | |
| Si | 0.1 | p = 2E18 | |
| Si | 0.15 | p = 2E17 | |
| Si to $Si_{0.5}Ge_{0.5}$ | 0.3 | p = 1E17 | Graded layer |
| Ge | 1.0 | undoped | Light absorption layer |
| Ge | 0.1 | p = 1E18 | Ge contact layer |

For example, the photo excited electrons in the Ge layer travel through the graded SiGe/Si layer and enter the partially-compensated Si p/n junction (e.g., 90% compensated) to start the cycling excitation process (CEP) via cascaded exciton ionization (CEI). Similar designs for Ge/Si avalanche photodetectors (APDs) can be created using conventional avalanche multiplication. The Ge/Si heteroepitaxial APD has shown decent gain at around 60 V bias, e.g., indicating high quality Ge on Si in spite of the 4% lattice mismatch. Here, all the structures may be kept the same but replace the Si avalanche multiplication region with the partially compensated Si p/n junction structure of the disclosed technology for the enhanced amplification mechanism. In this manner a fair comparison may be obtained between the two devices.

An exemplary characterization of the SiGe detector for gain, noise, and temperature characteristics is described. For example, using the epitaxial design in Table 1, some Ge/Si detectors were made based on traditional avalanche multiplication, and some Ge/Si detectors were made based on the disclosed CEI mechanism, e.g., for a detailed comparison. The conventional Ge/Si APD was expected to operate at between 55 and 60 V to achieve a gain of 50 to 1000 according to the Silvaco simulation. The example device with the new, enhanced amplification mechanism was expected to achieve the same level of amplification under <5V bias, for example. To measure the gain-bandwidth product, a gain-switched 1550 nm semiconductor pulsed laser was used to measure the photocurrent response of the devices. The devices were mounted to a cryo chamber to allow characterization of the devices from 77K to 350K.

Figure 26:
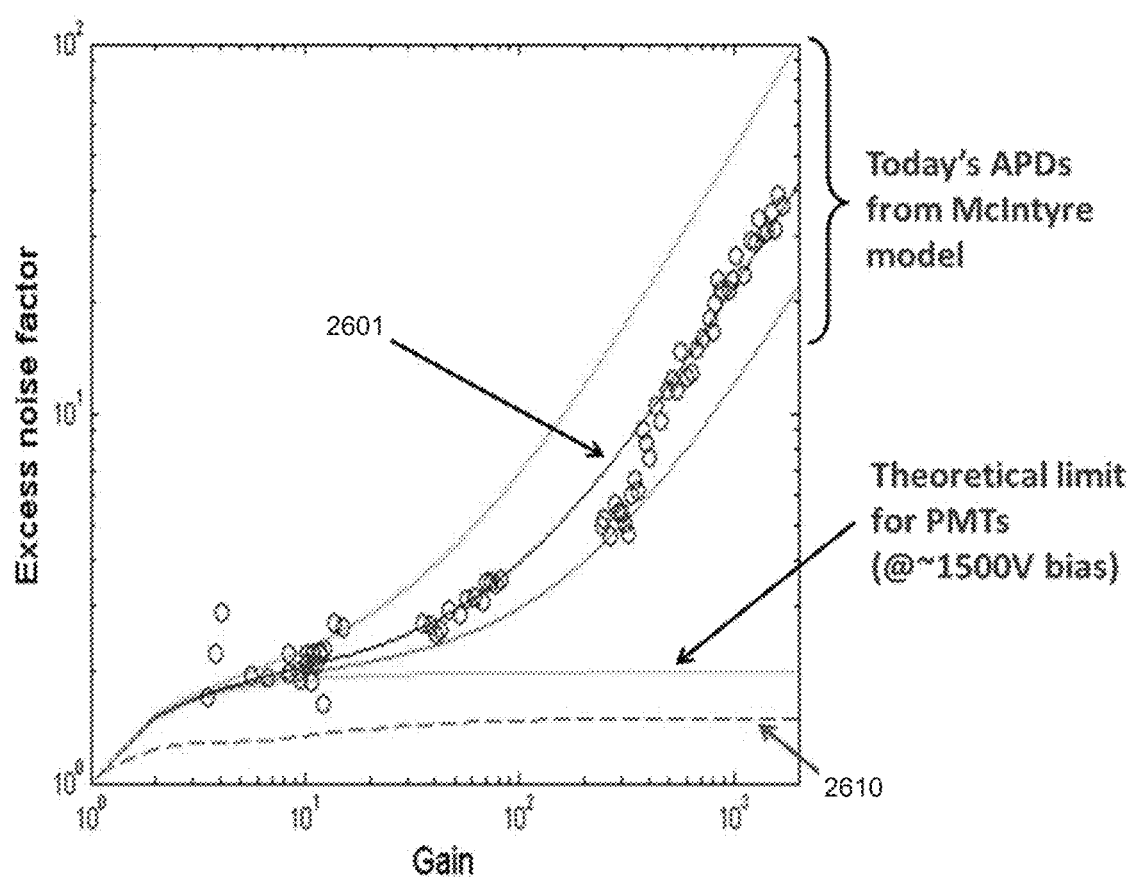
FIG. 26 shows a data plot showing exemplary measurements of excess noise factor.

FIG. 26 shows a data plot showing exemplary measurements of excess noise factor. The data plot shows how well the example experimental data fit the theoretical curve for a conventional Si APD (black curve 2601). A conventional SiGe APD is expected to show similar noise behaviors as the Si APD, e.g., since they have the same amplification mechanism although operating at different wavelengths. The SiGe APD may be expected to show similar noise characteristics as the Si APD even though they operate at different wavelengths because the noise characteristics are determined by the same avalanche multiplication process. Increasing the gain from 100 to 1000, it is anticipated that the excess noise factor for the conventional SiGe APD will rise from 4 to nearly 40.

On the other hand, it may be anticipated that the disclosed SiGe detector will show a significantly lower excess noise as predicted by the Monte Carlo simulation (dash line 2610). For the SiGe detector based on the CEI mechanism, for example, the excess noise factor may be anticipated to be between 1 and 2, which falls below the excess noise of photomultiplier tubes (PMTs). It can be challenging to measure the actual excess noise factor of the device should the disclosed device show such excellent sensitivity. In such case, alternative methods may be implemented, for example: (a) use a highly noisy light source or (b) make a relative measurement with a commercial PMT. To produce a noisy light source, the frequency of the noise measurement may be adjusted to the laser relaxation frequency (e.g., typically 1-2 GHz). In this manner the detector noise that is proportional to the noise of the laser source multiplied by an additional (excess) factor can rise above the thermal noise limit of the instrument. Alternatively, a relative noise comparison can be made between the disclosed SiGe device and a Hamamatsu PMT. The exemplary SiGe detector noise can be measured with a 1550 nm source and the PMT noise can be measured with a 635 nm source since standard PMTs do not respond to 1550 nm light. The noise of both light sources can be calibrated, and the PMT noise can be used as the reference for comparison since Hamamatsu PMTs are supposed to produce an excess noise factor of 2 at a gain of 20 or higher according to the specifications.

It is envisioned that the disclosed technology can help address the needs of a variety of sensors, e.g., including integrated, lightweight optics and sensors to see through various conditions, advanced sensors, EO/IR sensors and sensor processing, sensing of laser off-axis detection and source geo-location, sensors to improve surveillance in an urban environment, and identification of shooters and enemy observation/surveillance. Also, it is envisioned that the disclosed technology will also produce broad and profound impact on nearly all communication and data processing systems. One necessary and universal process sought after by all optoelectronic and electronic systems is signal amplification with the highest possible signal-to-noise ratio. In the disclosed technology, a new signal amplification mechanism is produced in the engineered structures of the present technology, which holds promise to amplify signals with an ultra-high gain and speed at very low bias voltage and above all, true quantum limit sensitivity.

Examples

The following examples are illustrative of several embodiments of the present technology. Other exemplary embodiments of the present technology may be presented prior to the following listed examples, or after the following listed examples.

In an example of the present technology (example 1), an optical-to-electrical energy conversion device includes a substrate formed of a doped semiconductor material, the substrate including a first region and a second region; an array of multilayered nanostructures protruding from the first region of the substrate, in which the multilayered nanostructures are formed of a first co-doped semiconductor material covered by a layer of a second co-doped semiconductor material forming a core-shell structure, the layer covering at least a portion of the doped semiconductor material of the substrate in the second region; and an electrode formed on the layer-covered portion of the substrate in the second region, in which the multilayered nanostructures are structured to provide an optical active region capable of absorbing photons from light at one or more wavelengths to generate an electrical signal presented at the electrode.

Example 2 includes the device of example 1, in which the doped semiconductor material includes p-type silicon.

Example 3 includes the device of example 1, further including a substrate base coupled on the side of the substrate opposite that of the array of multilayered nanoscale structures and formed of an electrical insulator material.

Example 4 includes the device of example 1, in which the first co-doped semiconductor material includes a p+/n type semiconductor material, the p+/n type semiconductor including both electron acceptor and electron donor dopants, in which the acceptor concentration is greater than the donor concentration.

Example 5 includes the device of example 1, in which the second co-doped semiconductor material includes a n+/p type semiconductor material, the n+/p type semiconductor material including both electron acceptor and electron donor dopants, in which the donor concentration is greater than the acceptor concentration.

Example 6 includes the device of example 1, in which the first and the second co-doped semiconductor material includes dopants at a concentration level substantially on the order of $1 \times 10^{19}$ cm$^{-3}$.

Example 7 includes the device of example 1, in which the electrode includes an n type semiconductor material.

Example 8 includes the device of example 1, in which the one or more wavelengths includes 630 nm wavelength, and absorption of a red photon at the 630 nm wavelength produces at least 4 electron-hole pairs to generate to the electrical signal.

Example 9 includes the device of example 1, in which the one or more wavelengths includes wavelengths of visible light with energies above the 1.12 eV bandgap energy of Si.

Example 10 includes the device of example 1, in which the array of multilayered nanostructures are structured to have a geometry including one or more of a wire-like structure, a wall-like structure, or a waffle-like structure.

Example 11 includes the device of example 10, in which the array of multilayered nanostructures include nanowires having a diameter of substantially 300 nm and a height of substantially 2500 nm.

Example 12 includes the device of example 1, in which the device generates an excess noise factor that is below 2.0.

In an example of the present technology (example 13), an optical-to-electrical energy conversion device includes a substrate formed of a doped silicon material, the substrate including a first region and a second region; an array of multilayered nanowire structures protruding from the first region of the substrate, in which the nanowire structures are formed of a first co-doped silicon material covered by a layer of a second co-doped silicon material forming a core-shell structure, the layer covering at least a portion of the substrate in the second region, in which the first and second co-doped silicon materials include electron acceptor dopants and electron donor dopants, in which the first co-doped silicon material includes a greater concentration of one type of the electron acceptor or the electron donor dopants than the other type dopants, and the second co-doped silicon material includes a greater concentration of the other type dopants than the one type dopants; and an electrode formed on the layer-covered portion of the substrate in the second region, in which the multilayered nanowire structures are structured to provide an optical active region capable of absorbing photons from light at one or more wavelengths to generate an electrical signal presented at the electrode via a cascaded exciton ionization (CEI) mechanism.

Example 14 includes the device of example 13, in which the doped silicon material includes p-type silicon.

Example 15 includes the device of example 13, further including a substrate base coupled on the side of the substrate opposite that of the array of multilayered nanoscale structures and formed of an electrical insulator material.

Example 16 includes the device of example 13, in which the first co-doped silicon material includes a p+/n type silicon material including both electron acceptor and electron donor dopants, in which the acceptor concentration is greater than the donor concentration.

Example 17 includes the device of example 13, in which the second co-doped silicon material includes a n+/p type silicon material including both electron acceptor and electron donor dopants, in which the donor concentration is greater than the acceptor concentration.

Example 18 includes the device of example 13, in which the optical-to-electrical energy conversion device is included in a solar cell device.

Example 19 includes the device of example 13, in which the device generates an excess noise factor that is below 2.0.

In an example of the present technology (example 20), a method to convert optical energy to electrical energy includes receiving light on a surface structured to include a doped semiconductor substrate at least partially covered by an array of multilayered nanostructures formed of a first co-doped semiconductor material covered by a layer of a second co-doped semiconductor material; converting the received light to an electrical signal by a cascaded exciton ionization (CEI) mechanism at the array of multilayered nanostructures, in which the electrical signal is presented at an electrode on the doped semiconductor substrate of the surface; and conducting the electrical signal to an electrical circuit.

Example 21 includes the method of example 20, in which the received light includes one or more wavelengths including a 630 nm wavelength, and in which the converting the received light at the 630 nm wavelength produces at least 4 electron-hole pairs to generate to the electrical signal.

Example 22 includes the method of example 20, in which the first co-doped silicon material includes a p+/n type silicon material including both electron acceptor and electron donor dopants, in which the acceptor concentration is greater than the donor concentration, and the second co-doped silicon material includes a n+/p type silicon material including both electron acceptor and electron donor dopants, in which the donor concentration is greater than the acceptor concentration.

Example 23 includes the method of example 20, in which the array of multilayered nanostructures include a geometry of nanowire structures, nanowall structures, or nanowaffle structure.

Example 24 includes the method of example 20, in which the light includes sunlight and the electrical circuit is included in a device at least partially powered by the optical energy converted to the electrical energy by the method.

Example 25 includes the method of example 20, in which the electrical signal exhibits an excess noise factor that is below 2.0.

In an example of the present technology (example 26), a method to fabricate a single junction optical-to-electrical energy conversion device includes forming an array of nanostructures in a first region of a substrate formed of a doped semiconductor material, in which the substrate includes a doping concentration of at least $10^{18}$ cm$^{-3}$ of a first dopant including one type of dopants of electron acceptor dopants or electron donor dopants; depositing a dopant material on the first region to form a layer over the array of nanostructures, the dopant material containing a second dopant including the other type of the electron acceptor dopants or the electron donor dopants from the first dopant; and converting (i) the doped semiconductor material of the array of nanostructures into a first co-doped semiconductor material comprising both the electron acceptor dopants and the electron donor dopants and having a greater concentration of the one type of dopants and (ii) the deposited material of the layer over the array of nanostructures into a second co-doped semiconductor material comprising both the electron acceptor dopants and the electron donor dopants and having a greater concentration of the other type of dopants than the one type of dopants, thereby producing a core/shell structure of the first co-doped semiconductor material and the second co-doped semiconductor material, respectively, capable of absorbing photons from light at one or more wavelengths to generate an electrical signal via a cascaded exciton ionization (CEI) mechanism.

Example 27 includes the method of example 26, in which the forming includes etching the nanostructures from the substrate into a pattern based on a mask.

Example 28 includes the method of example 27, in which the etching includes an inductively coupled plasma-reactive-ion etching process with $C_4F_8$ and $SF_6$ gases using electron-beam lithographically-patterned nickel disks as the mask.

Example 29 includes the method of example 26, in which the depositing the dopant material includes coating a dopant solution onto a second substrate, baking the coated dopant solution on the second substrate, and transferring the second dopant from the second substrate on the first region of the substrate by applying heat to evaporate the second dopant to form the layer over the over the array of nanostructures.

Example 30 includes the method of example 26, in which the depositing includes the layer covering at least a portion of the doped semiconductor material of the substrate outside the first region.

Example 31 includes the method of example 26, in which the converting includes applying heat for a duration of time to control a diffusion process of the electron acceptor dopants and the electron donor dopants.

Example 32 includes the method of example 26, further including producing a contact pad of an electrically conductive material on the first region of the substrate.

In an example of the present technology (example 33), an optical-to-electrical energy conversion device includes a substrate formed of a doped silicon material, the substrate including a first region and a second region; an array of nanowire structures formed in and protruding from the first region of the substrate, each nanowire structure including a first co-doped silicon material as a core and a shell layer of a second co-doped silicon material covering the core and at least a portion of the substrate in the second region, in which the core of the first co-doped silicon material and the shell layer of the second co-doped silicon material form an p-n or n-p interface to convert light into an electric current; and electrodes coupled to the nanowire structures to direct an electric current produced from absorption of light received in the nanowire structures as an electrical output of the device, in which both the first and second co-doped silicon materials are doped with both first-type carriers and second-type carriers throughout the first and second co-doped silicon materials, the first co-doped silicon material includes a concentration of the first-type carriers higher than a concentration of the second-type carriers and the second co-doped silicon material includes a concentration of the second-type carriers higher than a concentration of the first-type carriers, and in which the first-type carriers are one of the n-type and p-type carriers and the second-type carriers are another one of the n-type and p-type carriers and the second-type carriers.

Example 34 includes the device of example 33, in which the array of nanowire structures is structured to exhibit a light-to-electrical conversion efficiency higher than 29%.

Example 35 includes the device of example 33, in which the array of nanowire structures is structured to exhibit a light-to-electrical conversion efficiency near 48%.

In an example of the present technology (example 36), a method for signal amplification includes applying a low bias voltage across a p-n junction of a semiconductor material that is heavily doped and partially compensated, in which the semiconductor material includes a first co-doped semiconductor material and a second co-doped semiconductor material; receiving light on a surface of the semiconductor material; converting the received light to an electrical signal by cascaded exciton ionization (CEI); and conducting the electrical signal to an electrical circuit.

Example 37 includes the method of example 36, in which the first co-doped semiconductor material includes a p+/n type semiconductor material, the p+/n type semiconductor including both electron acceptor and electron donor dopants, in which the acceptor concentration is greater than the donor concentration, and in which the second co-doped semiconductor material includes a n+/p type semiconductor material, the n+/p type semiconductor material including both electron acceptor and electron donor dopants, in which the donor concentration is greater than the acceptor concentration.

Example 38 includes the method of example 36, in which the first and the second co-doped semiconductor material includes dopants at a concentration level substantially on the order of $1\times10^{19}$ cm$^{-3}$ or greater.

Example 39 includes the method of example 36, in which the semiconductor material is at room temperature.

Example 40 includes the method of example 36, in which the applied low bias includes −2 V.

Example 41 includes the method of example 36, in which the converting the light to the electrical signal by CEI includes producing increased electrical energy for the received light with increased temperature of the semiconductor material.

In an example of the present technology (example 36), a device for photoresponse amplification includes a substrate; an array of multilayered nanostructures protruding from a first region of the substrate, in which the nanostructures include a first co-doped semiconductor material covered by a layer of a second co-doped semiconductor material forming a core-shell structure having a heavily-doped and partially-compensated p-n junction, in which the first and the second co-doped semiconductor materials include electron acceptor dopants and electron donor dopants at a concentration level substantially on the order of $1\times10^{19}$ cm$^{-3}$ or greater, where the first co-doped semiconductor material includes a greater concentration of one type of the electron acceptor or the electron donor dopants than the other type dopants, and the second co-doped semiconductor material includes a greater concentration of the other type dopants than the one type dopants, and in which the layer of the second co-doped semiconductor material covers at least a portion of the substrate in a second region; and an electrode formed on the layer-covered portion of the substrate in the second region. The multilayered nanostructures provide an optical active region capable of absorbing photons from light at one or more wavelengths to generate an electrical signal presented at the electrode via a cascaded exciton ionization (CEI) mechanism.

Example 43 includes the device of example 42, in which the device is operable to conduct the generated electrical signal to an external electrical circuit when a low bias voltage of 5 V or less is applied across the heavily-doped and partially-compensated p-n junction of the multilayered nanostructures.

Example 44 includes the device of example 42, in which the substrate includes a doped semiconductor material.

Example 45 includes the device of example 44, in which the semiconductor material includes silicon, and the doped silicon material includes p-type silicon.

Example 46 includes the device of example 42, further including a substrate base coupled to the second region of the substrate on the side of the substrate opposite that of the array of multilayered nanoscale structures and including an electrical insulator material.

Example 47 includes the device of example 42, in which the first co-doped semiconductor material includes a p+/n type semiconductor material including both electron acceptor and electron donor dopants, in which the acceptor concentration is greater than the donor concentration; and the second co-doped semiconductor material includes a n+/p type semiconductor material including both electron acceptor and electron donor dopants, in which the donor concentration is greater than the acceptor concentration.

Implementations of the subject matter and the functional operations described in this patent document and attached appendices can be implemented in various systems, digital electronic circuitry, or in computer software, firmware, or hardware, including the structures disclosed in this specification and their structural equivalents, or in combinations of one or more of them. Implementations of the subject matter described in this specification can be implemented as one or more computer program products, i.e., one or more modules of computer program instructions encoded on a tangible and non-transitory computer readable medium for execution by, or to control the operation of, data processing apparatus. The computer readable medium can be a machine-readable storage device, a machine-readable storage substrate, a memory device, a composition of matter effecting a machine-readable propagated signal, or a combination of one or more of them. The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, and it can be deployed in any form, including as a stand-alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data include all forms of nonvolatile memory, media and memory devices, including by way of example semiconductor memory devices, e.g., EPROM, EEPROM, and flash memory devices. The processor and the memory can be supplemented by, or incorporated in, special purpose logic circuitry.

It is intended that the embodiments and implementations described in the specification, together with the drawings, be considered exemplary, where exemplary means an example. As used herein, the singular forms "a", "an" and "the" are intended to include the plural forms as well, unless the context clearly indicates otherwise. Additionally, the use of "or" may include "and/or", unless the context clearly indicates otherwise.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described and other implementations, enhancements and variations can be made based on what is described and illustrated in this patent document.

What is claimed is:

1. An optical-to-electrical energy conversion device, comprising:
    a substrate formed of a doped semiconductor material, the substrate including a first region and a second region;
    an array of multilayered nanostructures protruding from the first region of the substrate, wherein the multilayered nanostructures of the array are formed of a first co-doped semiconductor material covered by a second co-doped semiconductor material forming a core-shell structure, the second co-doped semiconductor material covering at least a portion of the doped semiconductor material of the substrate in the second region, wherein the first co-doped semiconductor material and the second co-doped semiconductor material are each doped with p-type carriers and n-type carriers, wherein each of the first and second co-doped semiconductor materials includes both electron acceptor dopants and electron donor dopants, and the first co-doped semiconductor material includes a greater concentration of one type of the electron acceptor dopants or electron donor dopants than the other type dopants, and the second co-doped semiconductor material includes a greater concentration of the other type of the electron acceptor dopants or electron donor dopants than the one type dopants, wherein the first co-doped semiconductor material includes a first concentration level of the one type of the electron acceptor dopants or electron donor dopants and a second concentration level of the other type dopants, and the second co-doped semiconductor material includes a third concentration level of the other type of the electron acceptor dopants or electron donor dopants and a fourth concentration level of the one type dopants to form a p-n junction in which both p type semiconductor material and n type semiconductor material are co-doped and heavily compensated, wherein the second concentration level is in a range from 70% to 80% of the first concentration level, and the fourth concentration level is in a range from 70% to 80% of the third concentration level; and
    an electrode formed on the second co-doped semiconductor material over the portion of the doped semiconductor material of the substrate in the second region that is covered by the second co-doped semiconductor material,
    wherein the multilayered nanostructures of the array are structured to provide an optical active region capable of absorbing photons from light at one or more wavelengths to generate an electrical signal presented at the electrode via a cascaded exciton ionization (CEI) mechanism including a carrier multiplication at zero bias across the p-n junction.

2. The device of claim 1, wherein the doped semiconductor material includes p-type silicon.

3. The device of claim 1, further comprising:
    a substrate base coupled on a side of the substrate opposite that of the array of multilayered nanostructures and formed of an electrical insulator material.

4. The device of claim 1, wherein a layer of the first co-doped semiconductor material includes a p+/n type semiconductor material, the p+/n type semiconductor including both electron acceptor and electron donor dopants, in which an acceptor concentration is greater than a donor concentration.

5. The device of claim 1, wherein a layer of the second co-doped semiconductor material includes a n+/p type semiconductor material, the n+/p type semiconductor material including both electron acceptor and electron donor dopants, in which a donor concentration is greater than an acceptor concentration.

6. The device of claim 1, wherein the first and the second co-doped semiconductor material includes dopants at a concentration level on the order of $1 \times 10^{19}$ cm$^{-3}$.

7. The device of claim 1, wherein the electrode includes an n type semiconductor material.

8. The device of claim 1, wherein the one or more wavelengths includes 630 nm wavelength, and absorption of a red photon at the 630 nm wavelength produces at least 4 electron-hole pairs to generate to the electrical signal.

9. The device of claim 1, wherein the one or more wavelengths includes wavelengths of visible light with energies above the 1.12 eV bandgap energy of Si.

10. The device of claim 1, wherein the array of multilayered nanostructures are structured to have a geometry including one or more of a wire-like structure, a wall-like structure, or a waffle-like structure.

11. The device of claim 10, wherein the array of multilayered nanostructures include nanowires having a diameter of 300 nm and a height of 2500 nm.

12. The device of claim 1, wherein the device generates an excess noise factor that is below 2.0.

13. An optical-to-electrical energy conversion device, comprising:
a substrate formed of a doped silicon material, the substrate including a first region and a second region;
an array of multilayered nanowire structures protruding from the first region of the substrate, wherein the multilayered nanowire structures of the array are formed of a first co-doped silicon material covered by a second co-doped silicon material forming a core-shell structure, wherein the first co-doped silicon material and the second co-doped silicon material are each doped with p-type carriers and n-type carriers, wherein each of the first and second co-doped silicon materials includes both electron acceptor dopants and electron donor dopants, and the first co-doped silicon material includes a greater concentration of one type of the electron acceptor dopants or electron donor dopants than the other type dopants, and the second co-doped silicon material includes a greater concentration of the other type of the electron acceptor dopants or electron donor dopants than the one type dopants, wherein the first co-doped silicon material includes a first concentration level of the one type of the electron acceptor dopants or electron donor dopants and a second concentration level of the other type dopants, and the second co-doped silicon material includes a third concentration level of the other type of the electron acceptor dopants or electron donor dopants and a fourth concentration level of the one type dopants to form a p-n junction in which both p type semiconductor material and n type semiconductor material are co-doped and heavily compensated, wherein the second concentration level is in a range from 70% to 80% of the first concentration level, and the fourth concentration level is in a range from 70% to 80% of the third concentration level; and
an electrode formed on the second co-doped silicon material over a portion of the substrate in the second region that is covered by the second co-doped silicon material,
wherein the multilayered nanowire structures of the array are structured to provide an optical active region capable of absorbing photons from light at one or more wavelengths to generate an electrical signal presented at the electrode via a cascaded exciton ionization (CEI) mechanism including a carrier multiplication at zero bias across the p-n junction.

14. The device of claim 13, wherein the doped silicon material includes p-type silicon.

15. The device of claim 13, further comprising:
a substrate base coupled on a side of the substrate opposite that of the array of multilayered nanoscale structures and formed of an electrical insulator material.

16. The device of claim 13, wherein a layer of the first co-doped silicon material includes a p+/n type silicon material including both electron acceptor and electron donor dopants, in which an acceptor concentration is greater than a donor concentration.

17. The device of claim 13, wherein a layer of the second co-doped silicon material includes a n+/p type silicon material including both electron acceptor and electron donor dopants, in which a donor concentration is greater than an acceptor concentration.

18. The device of claim 13, wherein the optical-to-electrical energy conversion device is included in a solar cell device.

19. The device of claim 13, wherein the device generates an excess noise factor that is below 2.0.

20. An optical-to-electrical energy conversion device, comprising:
a substrate formed of a doped silicon material, the substrate including a first region and a second region;
an array of nanowire structures formed in and protruding from the first region of the substrate, each nanowire structure including a first co-doped semiconductor material as a core and a shell layer of a second co-doped semiconductor material covering the core and at least a portion of the substrate in the second region, wherein the first co-doped semiconductor material and the second co-doped semiconductor material are each doped with p-type carriers and n-type carriers, wherein each of the first and second co-doped semiconductor materials includes both electron acceptor dopants and electron donor dopants, and the first co-doped semiconductor material includes a greater concentration of one type of the electron acceptor dopants or electron donor dopants than the other type dopants, and the second co-doped semiconductor material includes a greater concentration of the other type of the electron acceptor dopants or electron donor dopants than the one type dopants, wherein the first co-doped semiconductor material includes a first concentration level of the one type of the electron acceptor dopants or electron donor dopants and a second concentration level of the other type dopants, and the second co-doped semiconductor material includes a third concentration level of the other type of the electron acceptor dopants or electron donor dopants and a fourth concentration level of the one type dopants to form a p-n junction in which both p type semiconductor material and n type semiconductor material are co-doped and heavily compensated, wherein the second concentration level is in a range from 70% to 80% of the first concentration level, and the fourth concentration level is in a range from 70% to 80% of the third concentration level; and electrodes coupled to the nanowire structures of the array to direct an electric current produced from absorption of light received in the nanowire structures as an electrical output of the device, wherein:

(i) the first co-doped semiconductor material includes a concentration of the p-type carriers higher than a concentration of the n-type carriers, and the second co-doped semiconductor material includes a concentration of the n-type carriers higher than a concentration of the p-type carriers, or (ii) the first co-doped semiconductor material includes a concentration of the n-type carriers higher than a concentration of the p-type carriers, and the second co-doped semiconductor material includes a concentration of the p-type carriers higher than a concentration of the n-type carriers, and wherein the light is converted into the electric current via a cascaded exciton ionization (CEI) mechanism including a carrier multiplication at zero bias across the p-n junction.

21. The device as in claim 20, wherein the array of nanowire structures is structured to exhibit a light-to-electrical conversion efficiency higher than 29%.

22. The device as in claim 20, wherein the array of nanowire structures is structured to exhibit a light-to-electrical conversion efficiency greater than 48%.

23. A device for photoresponse amplification, comprising:
a substrate;
an array of multilayered nanostructures protruding from a first region of the substrate, wherein the multilayered nanostructures of the array include a first co-doped semiconductor material covered by a second co-doped semiconductor material forming a core-shell structure having a co-doped and partially-compensated p-n junction, wherein the first co-doped semiconductor material includes a first layer doped with first-type carriers and a second layer doped with both the first-type carriers and second-type carriers, and the second co-doped semiconductor material includes a third layer doped with the second-type carriers and a fourth layer doped with both the first-type carriers and the second-type carriers, and wherein the second layer and the fourth layer are in contact to form a p-n junction, wherein the second layer of the first co-doped semiconductor material includes one type of electron acceptor dopants or electron donor dopants at a first concentration level and the other type of electron acceptor dopants or electron donor dopants at a second concentration level and includes a greater concentration of the one type of the electron acceptor or the electron donor dopants than the other type dopants, and the fourth layer of the second co-doped semiconductor material includes the other type of electron acceptor dopants or electron donor dopants at a third concentration level and the one type of electron acceptor dopants or electron donor dopants at a fourth concentration level and includes a greater concentration of the other type dopants than the one type dopants, and wherein the second co-doped semiconductor material covers at least a portion of the substrate in a second region, wherein the second concentration level is in a range from 70% to 80% of the first concentration level, and the fourth concentration level is in a range from 70% to 80% of the third concentration level; and an electrode formed over the portion of the substrate in the second region that is covered by the second co-doped semiconductor material, wherein the multilayered nanostructures of the array provide an optical active region capable of absorbing photons from light at one or more wavelengths to generate an electrical signal presented at the electrode via a cascaded exciton ionization (CEI) mechanism including a carrier multiplication at zero bias across the p-n junction.

24. The device of claim 23, wherein the device is operable to conduct the generated electrical signal to an external electrical circuit when a low bias voltage of 5 V or less is applied across the co-doped and partially-compensated p-n junction of the multilayered nanostructures.

25. The device of claim 23, wherein the substrate includes a doped semiconductor material.

26. The device of claim 25, wherein the doped semiconductor material includes p-type silicon.

27. The device of claim 23, further comprising:
a substrate base coupled to the second region of the substrate on a side of the substrate opposite that of the array of multilayered nanostructures and including an electrical insulator material.

28. The device of claim 23, wherein the second layer of the first co-doped semiconductor material includes a p+/n type semiconductor material including both electron acceptor and electron donor dopants, in which an acceptor concentration is greater than a donor concentration; and wherein the fourth layer of the second co-doped semiconductor material includes a n+/p type semiconductor material including both electron acceptor and electron donor dopants, in which a donor concentration is greater than an acceptor concentration.

* * * * *